United States Patent
Kato et al.

(10) Patent No.: US 6,600,210 B1
(45) Date of Patent: Jul. 29, 2003

(54) SEMICONDUCTOR DEVICE AND METHOD OF MANUFACTURING THE SAME

(75) Inventors: Osamu Kato, Tokyo (JP); Morihisa Hirata, Tokyo (JP); Yasuyuki Morishita, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/679,583

(22) Filed: Oct. 4, 2000

(30) Foreign Application Priority Data

Oct. 8, 1999 (JP) .............................. 11-288808

(51) Int. Cl.[7] .............................................. H01L 29/00
(52) U.S. Cl. ...................... 257/539; 257/350; 257/368; 257/379; 257/380; 257/381; 257/382; 257/383; 257/384; 257/536; 257/538
(58) Field of Search ................. 257/350, 368, 257/379, 382–384, 380–381, 536, 538, 539

(56) References Cited

U.S. PATENT DOCUMENTS

| | | | | |
|---|---|---|---|---|
| 5,160,990 A | * | 11/1992 | Osawa | 257/355 |
| 5,270,565 A | * | 12/1993 | Lee et al. | 257/358 |
| 5,311,078 A | * | 5/1994 | Makino et al. | 257/370 |
| 5,440,162 A | | 8/1995 | Worley et al. | |
| 5,449,940 A | * | 9/1995 | Hirata | 257/360 |
| 5,565,698 A | | 10/1996 | Obermeier | |
| 5,744,839 A | * | 4/1998 | Ma et al. | 257/356 |
| 5,905,287 A | * | 5/1999 | Hirata | 257/355 |
| 6,022,769 A | | 2/2000 | Wu | |
| 6,309,937 B1 | * | 10/2001 | Lin | 438/305 |
| 6,191,454 B1 | * | 2/2002 | Hirata et al. | 257/360 |
| 6,191,455 B1 | * | 2/2002 | Shida | 257/362 |

FOREIGN PATENT DOCUMENTS

| | | | |
|---|---|---|---|
| EP | 448 119 | * | 3/1991 |
| JP | 02-125357 | | 10/1990 |
| JP | 02-271673 | | 11/1990 |
| JP | 07-142589 | | 6/1995 |
| JP | 08-055958 | | 2/1996 |
| JP | 10-022461 | | 1/1998 |
| JP | 10 70266 | * | 3/1998 |
| JP | 10-173070 | * | 6/1998 |
| JP | 11-40678 | * | 2/1999 |
| JP | 11-135735 | | 5/1999 |

* cited by examiner

Primary Examiner—Nathan J. Flynn
Assistant Examiner—Ahmad N. Sefer
(74) Attorney, Agent, or Firm—Choate, Hall & Stewart

(57) ABSTRACT

A semiconductor device is provided, which is provided with a high resistance to surge currents. The semiconductor device comprises three N$^+$ diffusion layers 4a, 4b, and 4c in a region surrounded by an element-separating insulating film 3a. The N$^+$ diffusion layer 4a forms a source diffusion layer of an N-channel MOS transistor 11a, the N$^+$ diffusion layer 4c forms a source diffusion layer of another N-channel MOS transistor 11b, and the N$^+$ diffusion layer 4b forms drain diffusion layers for two N-channel MOS transistors 11a and 11b. That is, respective drain diffusion layers of two N-channel MOS transistors are shared. Furthermore, a ring-shaped mask insulating film 18 is formed on the N$^+$ diffusion layer 4b. A silicide layer 6b is formed on the N$^+$ diffusion layer 4b except the area covered by the ring-shaped mask insulating film 18.

20 Claims, 45 Drawing Sheets

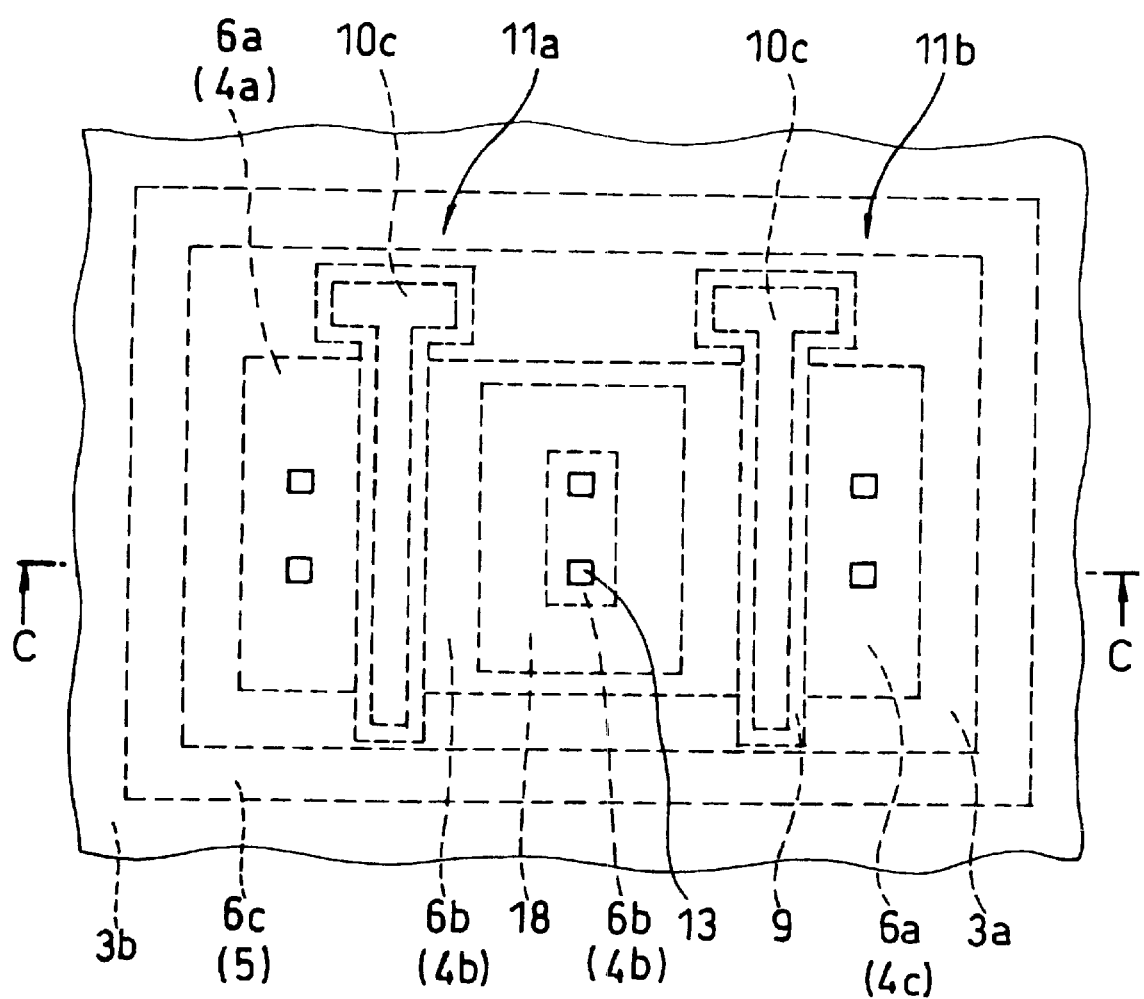

SEMICONDUCTOR DEVICE AND METHOD OF MANUFACTURING THE SAME

BACKGROUND OF THE INVENTION

1. Field of the Invention

The present invention relates to a semiconductor device and a method of manufacturing a semiconductor device suitable as an input circuit and an output circuit, and particularly relates to a semiconductor device and method of manufacturing the semiconductor device having an improved electrostatic resistance.

2. Background Art

Conventionally, a source diffusion layer and a drain diffusion layer of a transistor constituting an internal circuit of a semiconductor device are formed by a silicide layer in order to reduce the resistance of these layers. Furthermore, since thin film structures have made further advances in recent years, silicide films have been further required not only for the internal circuits but also for transistors constituting the input and output circuits. FIG. 42 shows a plan view of the conventional semiconductor device and FIG. 43 shows a cross sectional view along the V—V line in FIG. 42. In FIG. 42, the internal wiring is omitted. Here, the semiconductor device shown in FIGS. 42 and 43 is referred to as the first conventional example.

In the first conventional example, a P-well 102 is formed on the semiconductor substrate 101. An element-separating insulating film 103a in the form of a ring is selectively formed on a surface of the P-well 102, and an element-separating insulating film 103b is formed on the boundary layer of the P-well 102 formed on the semiconductor substrate 101.

In an area surrounded by the element-separating insulating film 103a, two N channel MOS transistors 11a and 11b are formed. Three N$^+$ diffusion layers 104a, 104b, and 104c are formed on the surface of the area surrounded by the element-separating insulating film 103a, wherein, the N$^+$ diffusion layer 104a constitutes a source diffusion layer of the MOS transistor 111a, the N$^+$ diffusion layer 104c constitutes a source diffusion layer of the N channel MOS transistor, and the N$^+$ diffusion layer 104b constitutes a drain diffusion layer of the N channel MOS transistors 111a and 111b. That is, the drain diffusion layers of the two N channel MOS transistors 111a and 111b are united.

A P$^+$ diffusion layer 105 is formed on an area sandwiched by two element-separating insulating layers 103a and 103b. Silicide films 106 are formed on the surface of N$^+$ diffusion layers 104a, 104b, 10c, and P$^+$ diffusion layer 105.

Each N channel MOS transistor 111a and 111b comprises a low concentration diffusion layer 107, a gate insulating film 108, a side wall insulating film 109 and a gate electrode 110. The gate electrode 110 is constituted by laminated polycrystalline silicon films and a silicide film.

Furthermore, an interlayer insulating film 112 is formed covering the N channel MOS transistors 111a and 111b. Contact holes reaching each silicide films 106 are formed penetrating the interlayer insulating films 112, and contact plugs 113 are embedded inside those contact holes. Wiring 114 is formed at each contact hole 113.

Since silicide films 106 are formed in conventional semiconductor devices for reduction of the circuit resistance, a problem arises that the conventional input circuits as well as the output circuits are liable to be affected by external electrostatic discharge (ESD), and the electrostatic resistance (resistance to surges) of these circuits decreases.

Japanese Patent (Granted) Publications No. 2773220 and No. 2773221 disclose a semiconductor device in which a region in a portion of the diffusion layer between the source and the drain is left without forming the silicide film. This type of the conventional example is hereinafter referred to as the second conventional example. FIG. 44 is a plan view showing the structure of the second conventional example, and FIG. 45 is the cross-sectional view of along the W—W line in FIG. 44. Here, the same elements of the second conventional example shown in FIGS. 44 and 45 as those shown of the first convention example shown in FIGS. 43 and 45 are denoted by the same reference numerals and their explanations are omitted.

In the second conventional example, a mask insulating film 118 is formed between the side wall insulating film 109 of each N channel MOS transistor 111a and 111b and the contact plug 113 of the drain in order to partition the N$^+$ diffusion layer 104b into two regions. A silicide layer 106 is formed directly below the mask insulating film 118. Accordingly, the silicide layer 106 formed on the N$^+$ diffusion layer 104b is partitioned into three regions.

In the second conventional example, since the resistance of the drain diffusion layer of each N channel MOS transistor 111a and 111b is higher than that of the first conventional example, the electrostatic resistance of the second embodiment is higher.

In addition, a semiconductor device, in which a high resistance region is formed between the drain diffusion layer of a MOS transistor constituting an output circuit and an output pin, has been disclosed (in U.S. Pat. No. 5,019,888). Hereinafter, this semiconductor device is referred to as called the third conventional example.

In the third conventional example, the high resistance region formed between the drain and the output pin blocks the surge current flowing into the semiconductor device, so that a higher electrostatic resistance that that of the first conventional example is obtained, similar to the second embodiment.

However, although it is possible to improve the electrostatic resistance in the second and third conventional example, a problem arises in the practical semiconductor devices. That is, in practical semiconductor devices, a plurality of transistors are formed in parallel in one well, and stress is concentrated on one transistor and the transistor subjected to the concentrated stress is more likely to be broken.

FIG. 46A is a cross-sectional view showing the propagation path of an surge current in the first conventional example, and FIG. 46B is a diagram showing the change of the voltage applied to the drain diffusion layer due to the surge current. It is noted that the silicide film 106 is omitted.

When an ESD surge current flows into a pad 115 connected to the drain diffusion layer (the N$^+$ diffusion layer 104b), the drain voltage increases, and when the voltage reaches a certain voltage, an avalanche breakdown occurs at a PN junction between the drain diffusion layer (N$^+$ diffusion layer 104b) and the P-well 102. In general, this voltage is called BVDS.

When the ESD surge current further increases, the breakdown current flows to the guard ring (P$^+$ diffusion layer 105) through a parasitic resistor 116 and passes through the ground (GND). Thereby, the voltage of the P-well increases in the proximity of the source diffusion layer (N$^+$ diffusion layer 104a) according to the voltage drop due to the parasitic resistor 116.

When the drain voltage reaches V1 due to the further increase of the ESD surge current, the PN junction between the source diffusion layer ((N⁺ diffusion layer 104a) and the P-well 102 is forward biased and the parasitic bipolar transistor 117 is turned on, and the N-channel MOS transistor 111a enters snapback. As a result, not only the breakdown current flow from the drain diffusion layer ((N⁺ diffusion layer 104b) to the guard ring (P⁺ diffusion layer 105) but also, the snapback current flows from the drain diffusion layer (N⁺ diffusion layer 104b) to the source diffusion layer ((N⁺ diffusion layer 104a), and the drain voltage decreases to a certain voltage Vsnp.

Thereafter, if the ESD surge current further increases, the drain voltage increases, and when the drain voltage reaches a certain voltage Vmax, the N-channel MOS transistor 111a is destroyed due to the rise of the temperature.

Since the breakdown current flows through a side end surface portion of the gate of the drain diffusion layer (N⁺ diffusion layer 104b), the current is small. In contrast, since the snapback current flows from the drain diffusion layer (N⁺ diffusion layer 104b) to the P well 102, the current becomes relatively large.

Such a snap back phenomenon is similarly generated in the second and third conventional examples having high resistance regions, and the surge current is passed to the ground GND by the same mechanism as in the case of the first conventional example.

However, when the drain diffusion layer is shared by two transistors, two transistors enter snapback simultaneously. Thus, for example, when four transistors are integrated, the transistor breakdown occurs by the following process. FIG. 47A show a schematic structure of a semiconductor device obtained by applying the second conventional example to a structure provided with four transistors, and FIG. 47B is its equivalent circuit. It is noted that the mask insulating film and the silicide film are omitted in FIG. 47A.

Four N channel MOS transistors 121 to 124 are arranged in one P well by disposition of their gate electrodes 121a to 124a in parallel to each other. A drain diffusion layer 126 is shared by two transistors 121 and 122, a source diffusion layer 127 is shared by two transistors 122 and 123, and a drain diffusion layer 128 is shared by two transistors 122 and 124. The drain diffusion layers 126 and 128 are connected to a common pad 130. Around the P well 102, the P⁺ diffusion layer (the guard ring) is formed, and respective source diffusion layers 125, 127, and 129, and the P⁺ diffusion layer (the guard ring) 131 are grounded. Resistances are parasitic between respective transistors 121 to 124 and the P⁺ diffusion layer (the guard ring).

In the semiconductor device constituted described above, although those transistors 122 and 123 simultaneously enters snapback since both transistors 122 and 123 share the source diffusion layer 127. However, the other transistors 121 and 123 do not enter snapback simultaneously, because of the difference in the parasitic resistances. In such a case, since the voltage applied to the drain diffusion layers of the transistors 121 and 124 continues to increase, these transistors 121 and 124 are broken down when the voltage reaches a certain voltage.

SUMMARY OF THE INVENTION

It is therefore an object of the present invention to provide a semiconductor device and a method of manufacturing the same, capable of obtaining a high electrostatic resistance.

The semiconductor device of the present invention comprises a resistive element, one end of which is connected to an external terminal; first and second field effect transistors, connected to the other end of the resistive element; wherein, said first and second field effect transistors comprise first and second drain diffusion layers and first and second source diffusion layers, respectively; and the first and second drain diffusion layers are commonly connected directly to the resistive element, and the first and second drain diffusion layers are maintained at an identical voltage.

In the present invention, since the drain diffusion layers of the first and second transistors are at the same potential, even when first transistor enters snapback, the drain voltage of the second transistor changes with that of the first transistor. Accordingly, the stress on the first transistor is relieved and the electrostatic resistance is improved. This effect is obtained for a semiconductor device, in which a resistive element is provided between the external terminal and the drain diffusion layers of two transistors, when the drain diffusion layers of two transistors are commonly connected to the external terminal. Therefore, this effect can be obtained for a semiconductor device without providing a silicide film.

In the present invention, the first and second field effect transistors may respectively comprise first and second silicide films formed on the respective first and second drain diffusion layers.

Moreover, the resistive element is provided between the first and second field effect transistors in the shape of a ring, and the external terminal may be connected to a first diffusion layer which is located inside of the resistive layer and which has the same conductive type as that of the first and second diffusion layers.

Furthermore, the resistive element may be formed by a diffusion layer, whose conductive type is the same as that of the first and second drain diffusion layer. In this case, the resistive element may comprise side wall insulating films of the first and second field effect transistors as well as an insulating film formed on the second diffusion layer.

The resistive element may comprise a second diffusion layer whose conductive type is the same as that of the first and second drain diffusion layer, a dummy gate insulating film formed on the second diffusion layer between the external terminal and the first and second drain diffusion layers, and a dummy electrode, to which a fixed voltage or a voltage of an external terminal is supplied, and which is formed on the dummy gate insulating film Furthermore, the resistive element may comprise a second diffusion layer whose conductive type is the same as that of said first and second drain diffusion layers, a dummy gate insulating film formed on said second diffusion layer between said external terminal and said first and second diffusion layers, and a dummy electrode in a floating state, which is formed on said dummy gate insulating film.

In addition, the resistive element may comprise second diffusion layer whose conductive type is the same as that of said first and second drain diffusion layers, an element-separating insulating film formed on said second diffusion layer between said external terminal and said first and second drain diffusion layers.

The semiconductor device of the present invention comprises first and second resistive elements, each one end of which is connected to an external terminal; and first and second field effect transistors, each connected to each the other ends of said first and second resistive elements; wherein, each of the first and second field effect transistors comprises first and second drain diffusion layers and first and second source diffusion layers, respectively, and said first and second drain diffusion layers are connected directly to said first and second resistive elements, respectively, and said first and second drain diffusion layers are mutually short circuited.

The semiconductor device of the present invention may comprise one or more than one contact holes formed between the external terminal and the silicide film on the first diffusion layer. In addition, the silicide film on the first diffusion layer is partitioned for each contact hole. The resistive element may be provided for each contact hole.

In the semiconductor device of the present invention, the resistive element and the first and second field effect transistors are preferably provided in one type of circuit portion selected from a group consisting of an input circuit portion, an output circuit portion, and an input/output circuit portion.

The first and second field effect transistors are provided in a first conductive type well and the semiconductor device comprises a second conductive type well, whose side surfaces are surrounded by said first conductive type well and which extends below said resistive element.

Furthermore, the first and second field effect transistors may be one type of transistor selected from a group consisting of a N-channel transistor, a P-channel MOS transistor, and a complementary MOS transistor.

In addition, the semiconductor device comprises an extracting portion provided on at least one of said first and second silicide films for extracting the input signal into the internal circuit.

The method for manufacturing a semiconductor device comprises the steps of: sequentially depositing on a semiconductor substrate a first insulating film for forming a gate insulating film and a polycrystalline silicon film for forming a gate insulating film; patterning said first insulating film and said polycrystalline silicon film for leaving films remaining on at least two portions; forming diffusion layers on said semiconductor substrate using the left film portions composed of the first insulating film and the polycrystalline silicon as the mask; forming a ring-shaped second insulating film on said diffusion layer between the two remaining film portions composed of said first insulating film and said polycrystalline silicon film; and forming silicide films on surfaces of said diffusion layer and said polycrystalline silicon film by use of said second insulating film as the mask.

In addition, in the present invention, the step of sequentially depositing the first insulating film and the polycrystalline silicon film further comprises the step of forming a silicide film on said polycrystalline silicon film.

BRIEF DESCRIPTION OF THE DRAWINGS

FIG. 6 is a plan view showing the structure of a semiconductor device according to the second embodiment of the present invention.

DETAILED DESCRIPTION OF THE INVENTION

Hereinafter, the semiconductor device and the method of manufacturing the same are described with reference to the attached drawings.

Figure 1:
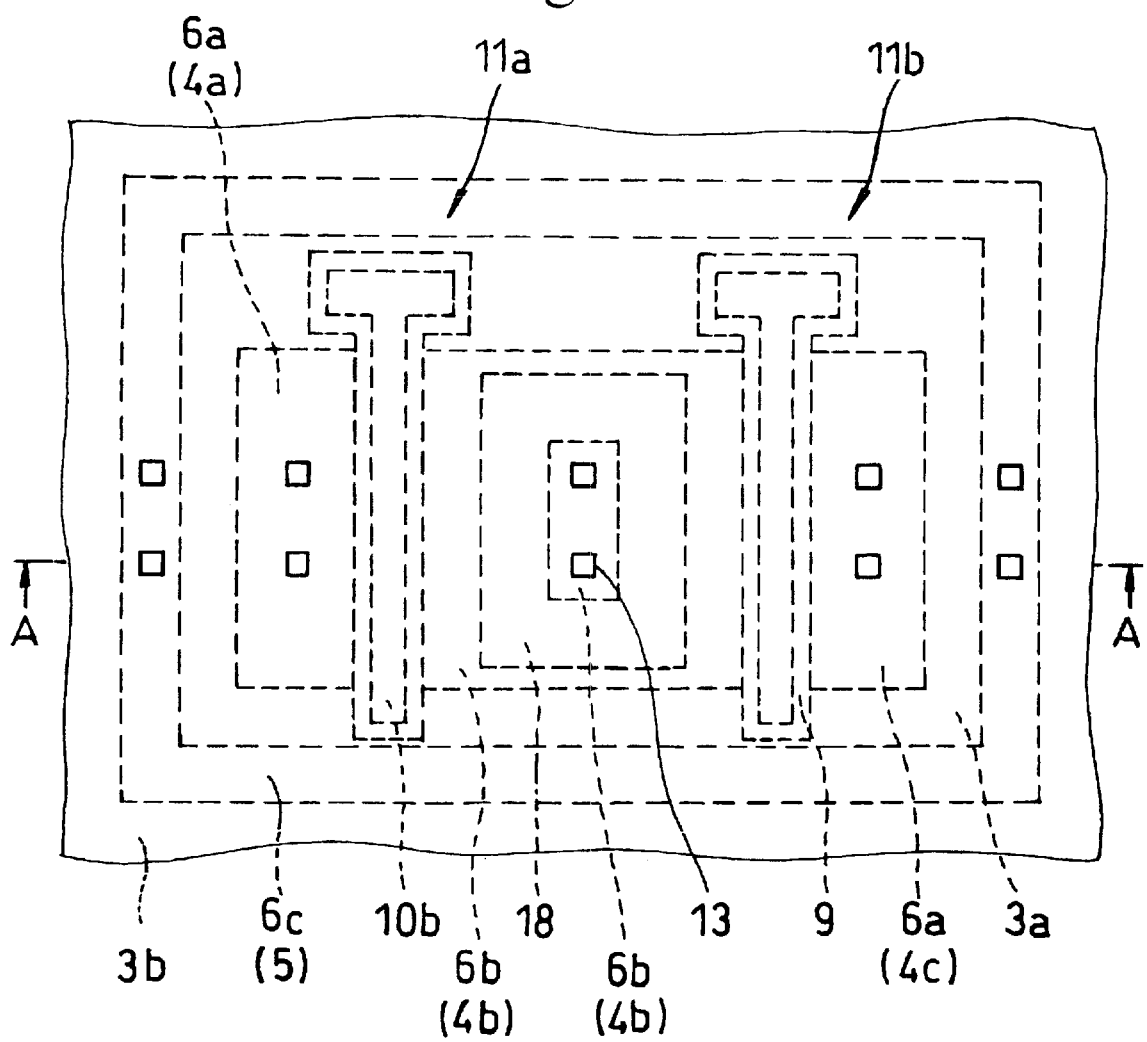
FIG. 1 is a plan view showing the structure of a semiconductor device according to the first embodiment of the present invention.
Figure 2:
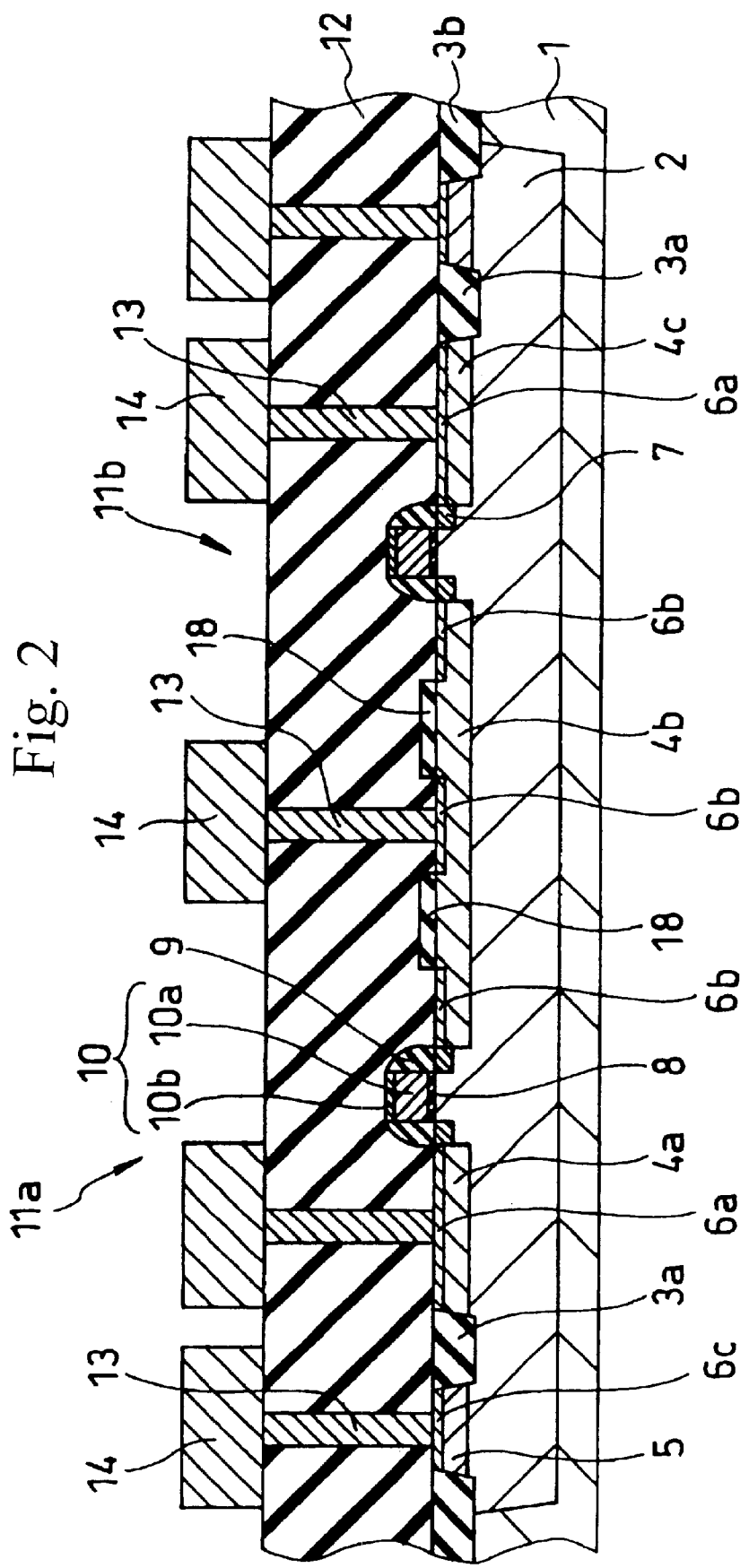
FIG. 2 is a cross-sectional view along the A—A line in FIG. 1.

FIG. 1 is a plan view showing the structure of a semiconductor device according to the first embodiment of the present invention, and FIG. 2 is a cross-sectional view along the A—A line in FIG. 1. In FIG. 1, the wiring is not shown.

A P well 2 is formed on a semiconductor substrate 1. On the surface of the P well 2, an element-separating insulating film 3a in a form of a ring is formed selectively, and a element-separating insulating film 3b is formed at the boundary portion of the P well on the surface of the semiconductor substrate. Two N-channel MOS transistors 11a and 11b are formed in the region surrounded by the element-separating insulating film 3a. On the surface of the region surrounded by the element-separating insulating film 3a, three $N^+$ diffusion layers 4a, 4b, and 4c are formed. The $N^+$ diffusion layer 4a constitutes a source diffusion layer of an N-channel MOS transistor 11a, the $N^+$ diffusion layer constitutes a source diffusion layer of an N-channel MOS transistor 11b, and the $N^+$ diffusion layer 4b constitutes a drain diffusion layer of N-channel MOS transistors 11a and 11b. That is, the drain diffusion layer of respective N-channel MOS transistor 11a and 11b is shared.

The mask insulating film 18 in the form of a ring is formed on the $N^+$ diffusion layer 4b. On the surface of the $N^+$ diffusion layer 4b, a silicide film 6b is formed so as to cover the region except the area covered by the mask insulating film 18. Thus, the potentials of the drains of both N-channel MOS transistors 11a and 11b are identical. In addition, a silicide layer 6a is formed on the entire surface of the $N^+$ diffusion layer 4a and 4b.

A $P^+$ diffusion layer 5 is formed on the area sandwiched by the element-separating insulating films 3a and 3b. And, a silicide layer 6c is formed on the surface of the $P^+$ diffusion layer 5.

The silicide films 6a, 6b, and 6c are formed by use of a metal silicide such as tungsten silicide or titanium silicide.

Each N-channel MOS transistor comprises a low concentration diffusion layer 7, a gate insulating film 8, a side wall insulating film 9 and a gate electrode 10. The gate electrode is constituted by a laminated polycrystalline silicon film 10a and a silicide film 10b.

An interlayer insulating film 12 is formed for covering N-channel MOS transistors 11a and 11b. A plurality of contact holes are bored through the interlayer insulating film 12 so as to reach the silicide layers 6a, 6b, and 6c. The contact hole 12 reaching the silicide layer 6b is formed inside of the ring-shaped mask insulating film 18. These contact holes are filled with contact plugs 13. Each of two contact plugs 13 is provided for the drain wiring and for the source wiring. The wiring 14 is formed on each of the contact plugs 13.

Two N-channel semiconductor devices 11a and 11b according to the first embodiment constituted as shown above does not enter snapback simultaneously by variation of the parasitic resistances, similar to the case of the conventional examples. However, in the present embodiment, even when the first transistor 11a enters snapback, since the drain voltage of the second transistor 11b changes along with that of the first transistor 11a, the stress applied to the second transistor, which cannot enter the snapback state, is extremely small, compared to the conventional example.

Figure 3:
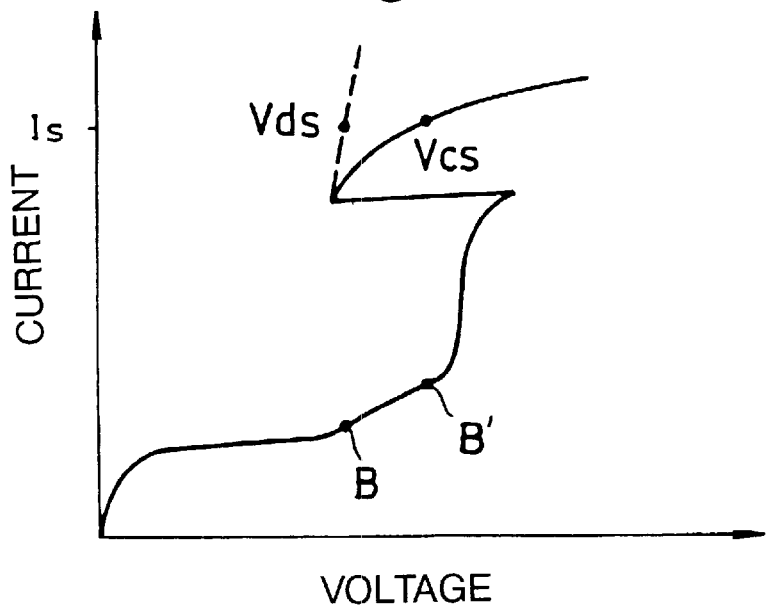
FIG. 3 is a graph showing the change of the voltage at various positions generated by a surge current.

FIG. 3 is a graph showing the change of the voltage due to the surge current at various positions. In FIG. 3, the solid line represents the change of the voltage at the drain side contact plug of the N-channel MOS transistor 11a, and the broken line shows the change of the voltage at the drain diffusion layer of the N-channel MOS transistor 11a.

As shown in FIG. 3, in the present embodiment, when the surge current flowing in the N-channel MOS transistor 11a, which is in snapback, is Is, the voltage at the contact plug is Vcs, and the voltage at the drain diffusion layer is Vds. At this time, the voltage at the drain diffusion layer of the N-channel MOS transistor 11b, which is in snapback, becomes Vds, shown by the point B in FIG. 3.

In contrast, in the second conventional example, when the first N-channel MOS transistor 111a enters snapback, the voltage at the drain diffusion layer of the second N-channel transistor 111b becomes approximately Vcs, shown by the point B7 in FIG. 3. Thus, a large stress is applied to the N-channel MOS transistor 111b.

Figure 4:
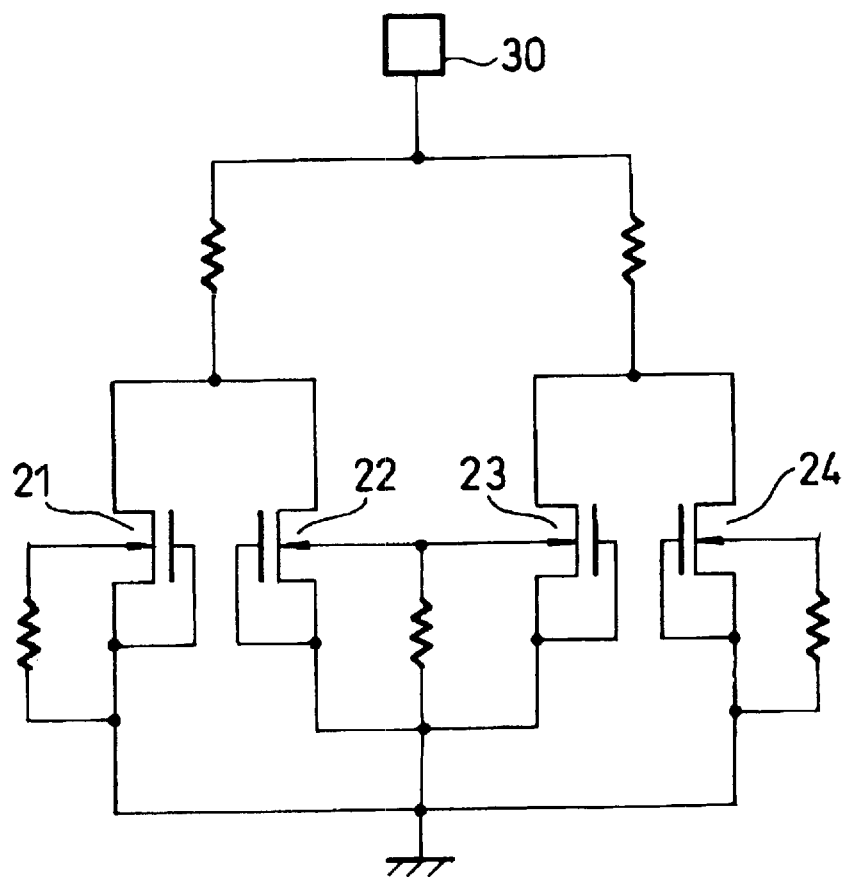
FIG. 4 is an equivalent circuit of a semiconductor device obtained by applying the first embodiment of the present invention to a semiconductor device provided with four transistors.

FIG. 4 is an equivalent circuit of a semiconductor device obtained by applying the first embodiment of the present invention to a semiconductor device provided with four transistors.

Four N-channel MOS transistors 21 to 24, the gate electrodes of each of which are arranged in parallel to each other, are formed in one P well. Two transistors 21 and 22 share a drain diffusion layer, two transistor 22 and 23 share a source diffusion layer, and two transistors 23 and 24 share a drain diffusion layer. Each drain diffusion layer is connected to an identical pad 30. A P$^+$ diffusion layer (guard ring) is formed around the periphery of the P well. Each source diffusion layer and the P$^+$ diffusion layer (guard ring) are grounded. Here, there is parasitic resistance between each transistor 21 to 24 and the P$^+$ diffusion layer (guard ring).

In the semiconductor device formed as described above, two transistors 22 and 23 enter snapback simultaneously, since these transistors 22 and 23 share a source diffusion layer, but the other transistors 21 and 24 can not enter snapback. In the present embodiment, however, since the voltage of each diffusion layer of the two transistors 21 and 24 varies with the change of the voltage of each drain diffusion layer of two transistors 22 and 23, the stress applied to the other two transistors 21 and 24 is very small. When the surge current increases further, these two transistors can enter snapback. Consequently, the transistor becomes more resistant to the breakdown and the electrostatic resistance of the semiconductor device increases.

Figure 5A:
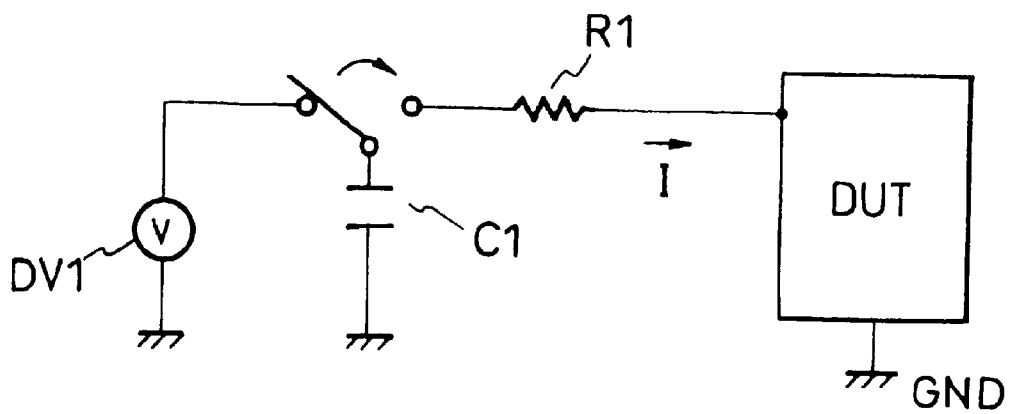
FIG. 5A is a block diagram showing a method of HBM testing for semiconductor devices shown in FIG. 4 and in FIG. 47B.
Figure 5B:
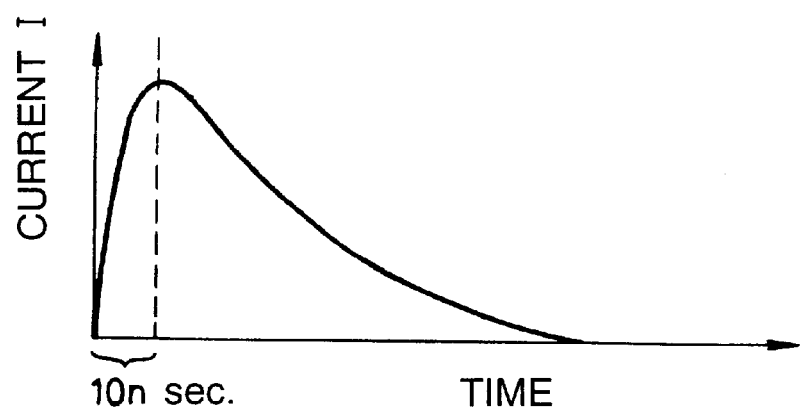
FIG. 5B is a graph showing the change of the current in the test.
Figure 5C:
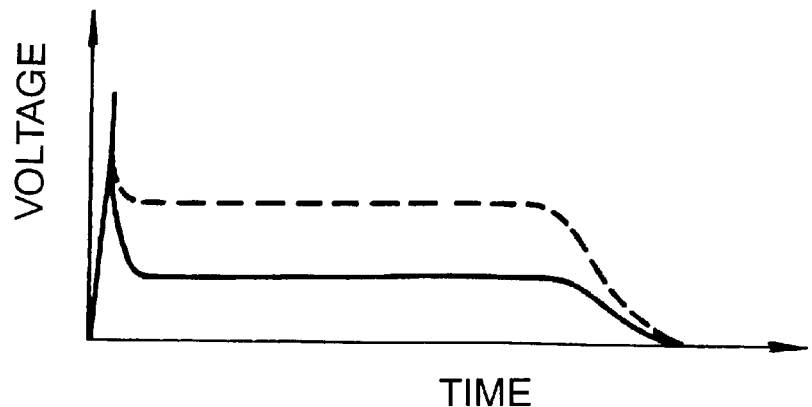
FIG. 5C is a graph showing the change of the voltage in the test.
Figure 47A:
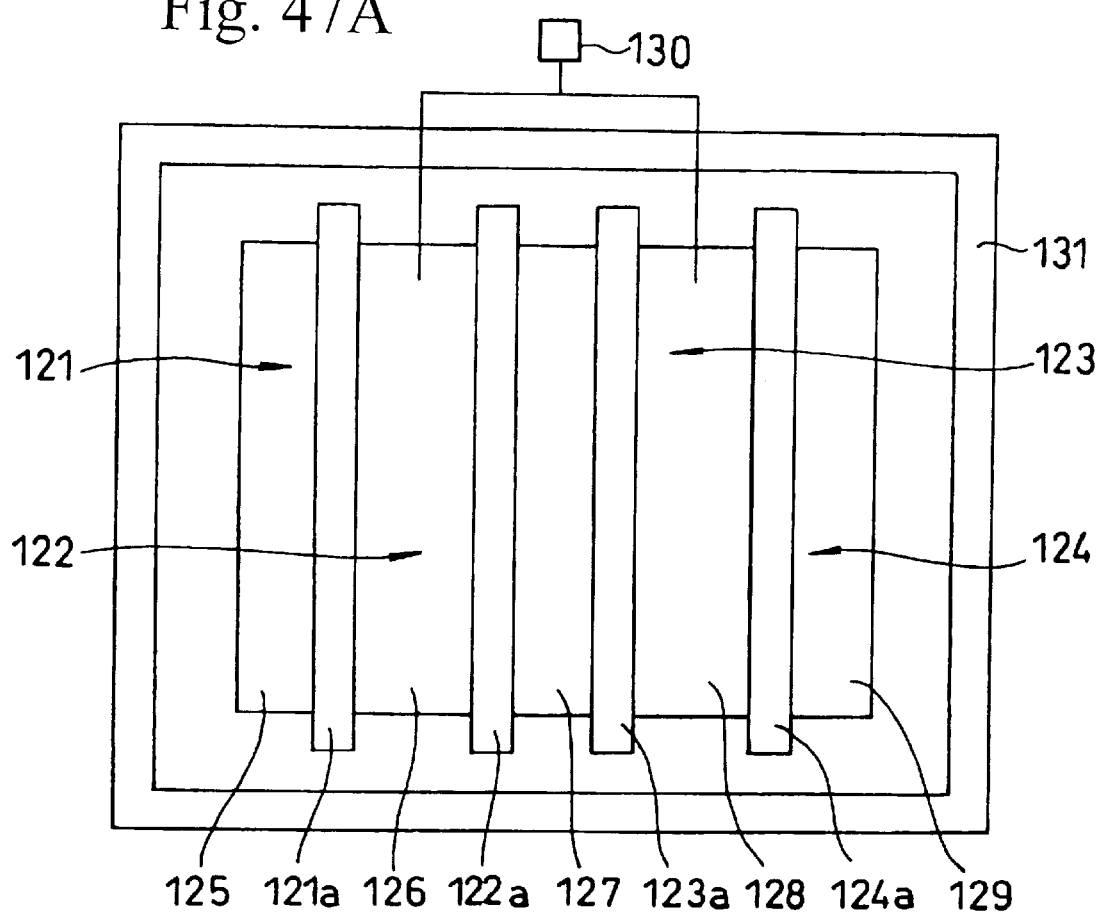
FIG. 47A is a schematic diagram showing the structure of a semiconductor device in which the second conventional example is applied to a semiconductor device provided with four transistors and FIG. 47B is its equivalent circuit.
Figure 47B:
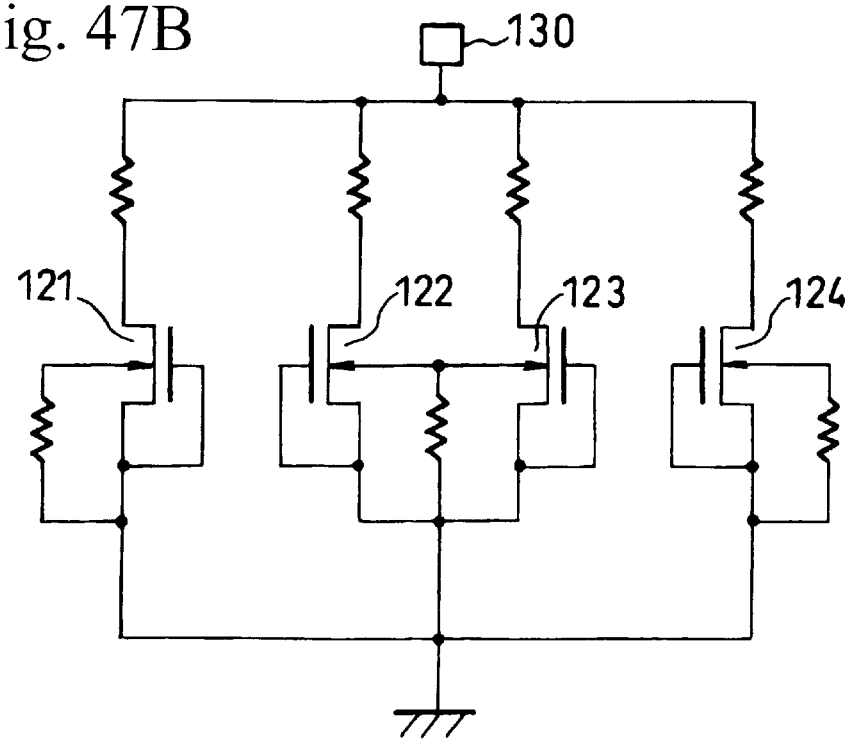

FIG. 5A is a block diagram showing a method of HBM testing for the semiconductor devices shown in FIG. 4 and FIG. 47B, and FIG. 5B is a graph showing the change of the current in the test, and FIG. 5C is a graph showing the change of the voltage in the test.

The human body model (HBM) test is a test for examining the resistance of a semiconductor device to a charge accumulated by electrification in a human body. In a circuit used for the HBM test, a capacitor C1 is provided, one end of which is grounded and the other end of which is connected with a switch SW1. A resistor R1 and a direct current source DV1 are connected with the switch SW1 to be switched alternately. An input and output pin for the test device DUT is connected to the other end of the resistor R1. The electric capacity of the capacitor C1 is, for example, 100 pF, and the resistance of the resistor R1 is, foe example, 1.5 kΩ.

The HBM test is carried out as follows. First, the switch SW1 is connected to the direct current source DV1 and the capacitor C1 is charged. Subsequently, the switch SW1 is connected to the resistor R1 and the capacitor C1 is discharged. At this time, a voltage applied to the test device DUT etc. is measured.

As shown in FIG. 5B, in a semiconductor device according to the present embodiment, the same current flows in the resistor R1 as the current flowing in that of the conventional example. In contrast, as shown in FIG. 5C, regarding the voltage applied to the drain end of the transistor, the present embodiment (the solid line) has a lower value than that of a conventional example (the broken line). This also indicates that the electrostatic resistance of the present embodiment is higher than that of the conventional examples.

The semiconductor device of the present embodiment shown in FIGS. 1 and 2 can be manufactured as follows.

First, the P well 2 is selectively formed on a surface of the semiconductor substrate 1. Subsequently, an element-separating insulating film 3b is formed at a boundary of the P well 2 and the semiconductor substrate 1, and an element-separating insulating film 3a is formed inside of the P well 2. Subsequently, a first insulating film and a polysilicon film, which form a gate insultaing film 8, are deposited in sequence on the P-well 2. Subsequently, by patterning these films into a predetermined shape, the gate insulating film 8 and a polycrystalline silicon film 10 are formed.

Subsequently, a P$^+$ diffusion layer 5 is formed by ion-implantation of an N-type impurity inside of the element-separating insulating film 3a by use of a mask comprising the gate insulating film 8 and the polycrystalline silicon film 10a. Subsequently, a side wall insulating film 9 is formed at the side surfaces of the gate insulating film and the polycrystalline silicon film. Then, the N$^+$ diffusion layers 4a and 4b are formed and a low concentration diffusion layer 7 is defined by denser ion implantation than the previous ion implantation of the N-type impurity inside of the element-separating insulating film 3a by the use of a mask comprising the gate insulating film 8, the side wall insulating film 9, and the polycrystalline silicon film 10a.

Subsequently, a mask insulating film in a form of a ring is formed on the N$^+$ diffusion layer 4b. And, silicide films 6a, 6b, and 6c and a silicide film 10b are formed in a self aligning manner by depositing and heat treating a high melting metal film on the N$^+$ diffusion layers 4a, 4b, and 4c, the P$^+$ diffusion layer 5, and the polycrystalline silicon film 10a.

Subsequently, an interlayer insulating film 12 is formed on the entire surface, and contact holes are formed at predetermined locations. Contact plugs 13 are then embedded in the contact holes. In addition, wiring 14 is formed on the interlayer insulating film 12 so as to be connected to the contact plugs 13.

The above described manufacturing process allows the provision of a high resistance ring-shaped region without using a silicide layer, and allows the provision of N-channel MOS transistors 11a and 11b sharing the N$^+$ diffusion layer 4b and the silicide layer formed above the N$^+$ diffusion layer 4b.

Figure 7:
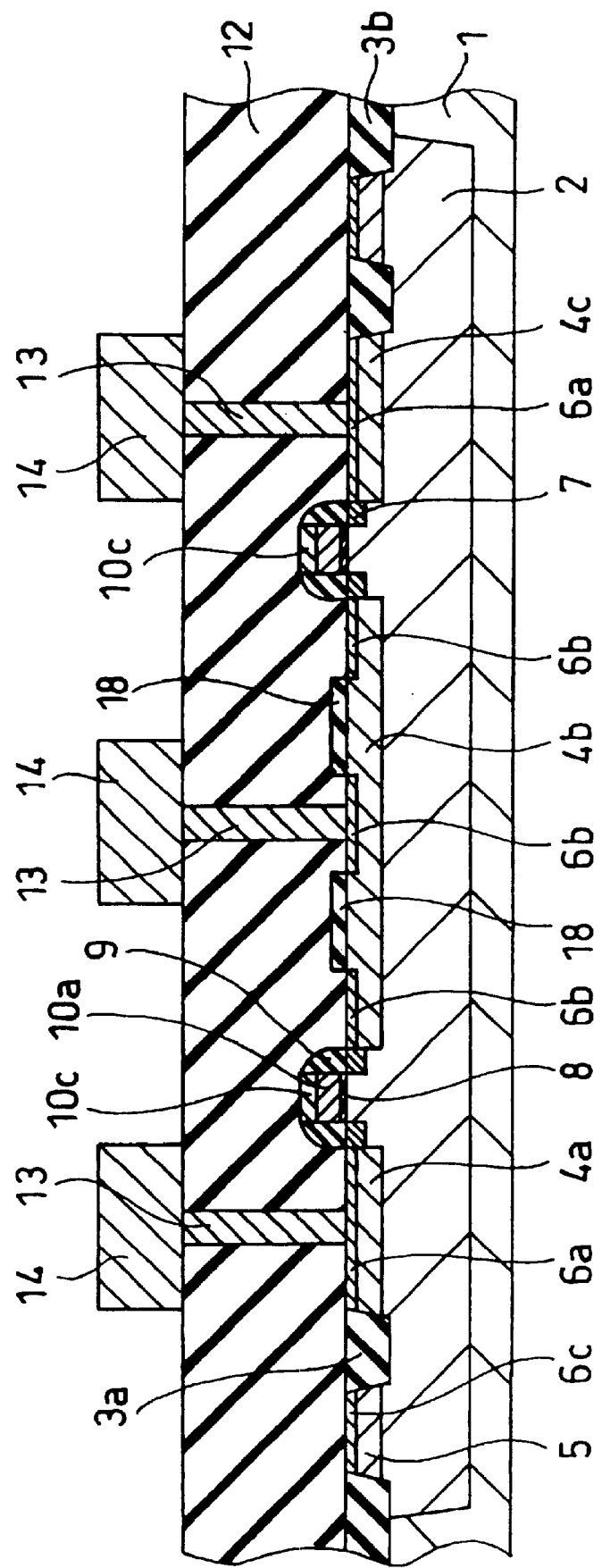
FIG. 7 is a cross-sectional view along the C—C line in FIG. 6.

Next, a second embodiment of the present invention is described. In the second embodiment, a silicide layer on the gate electrode and a silicide layer on the source/drain diffusion layer are manufactured by a different process. FIG. 6 is a plan view showing the structure of the semiconductor device according to the second embodiment of the present invention, and FIG. 7 is a cross-sectional view along the C—C line. In the second embodiment, the same components as those of the first embodiment shown in FIGS. 1 and 2 are denoted by the same reference numerals and their explanations are omitted.

In the second embodiment, a silicide layer is formed on the polycrystalline silicon film before the formation of the silicide films 6a, 6b, and 6c, and a suicide film 10c is further formed by forming a silicide film on the polycrystalline silicon layer at the time of forming silicide films 6a, 6b, and 6c.

As described above, the second embodiment is applicable to the case, in which the silicide layer on the gate electrode and the silicide layer for the source/drain diffusion layers are made by the different processes.

Figure 8:
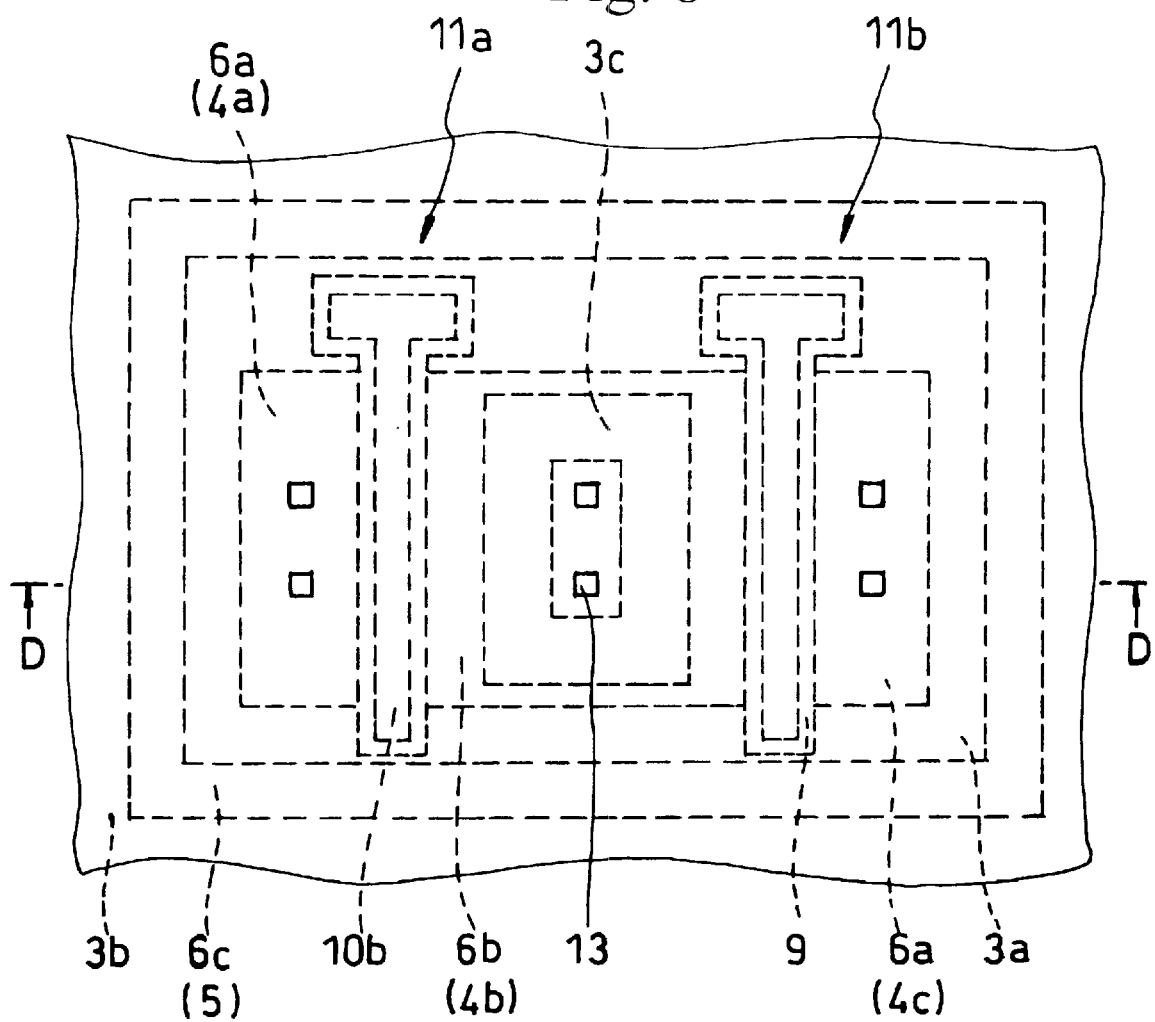
FIG. 8 is a plan view showing the structure of a semiconductor device according to the third embodiment of the present invention.
Figure 9:
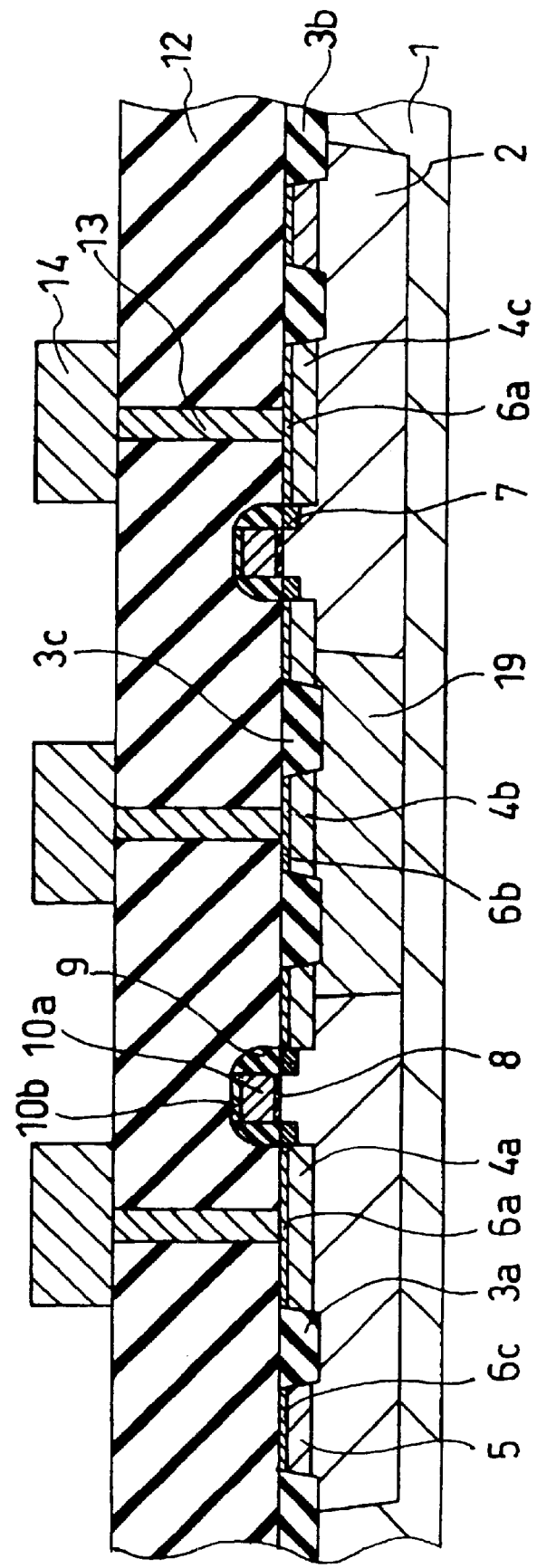
FIG. 9 is a cross-sectional view along the D—D line in FIG. 8.

Next, the third embodiment of the present invention is described. An element-separating insulating film in a form of a ring is formed in the region of a plan view, where the ring-shaped mask insulating film 18 is formed in the first embodiment. FIG. 8 is a plan view showing the structure of the semiconductor device according to the third embodiment, and FIG. 9 is across-sectional view along the D—D line. In the third embodiment shown in FIGS. 8 and 9, the same components as those of the first embodiment shown in FIGS. 1 and 2 are denoted by the same numerals and their explanations are omitted.

An element-separating insulating film 3c in the form of a ring is formed in the region of a plan view, where the ring-shaped mask insulating film 18 is formed in the first embodiment, and no $N^+$ diffusion layer is formed in this region. An N well 19 is formed in which the side wall is covered by the P well 2. It is noted however, that, although the bottom surface of the N well 19 is in contact with the semiconductor substrate 1 in the present embodiment, the bottom surface of the N well 19 may be covered by the P well 2. The N well is provided so as to contain the element-separating insulating film 3c from below. It is noted that the concentration of the N-type impurity in the N well 19 is lower than that in the $N^+$ diffusion layer 4b.

In the third embodiment constituted as described above, the N well 19 acts as a resistor between the drain diffusion layer and the drain wiring.

In the manufacture of the semiconductor device according to the third embodiment, the N well 19 is formed in the center portion of the P well 2 after the P well 2 has been formed. The ring-shaped element-separating insulating film 3c may be formed inside of the N well 19 at the same time the element-separating insulating films 3a and 3c are formed. The P well 2 may be formed after the N well 19 is formed.

Figure 10:
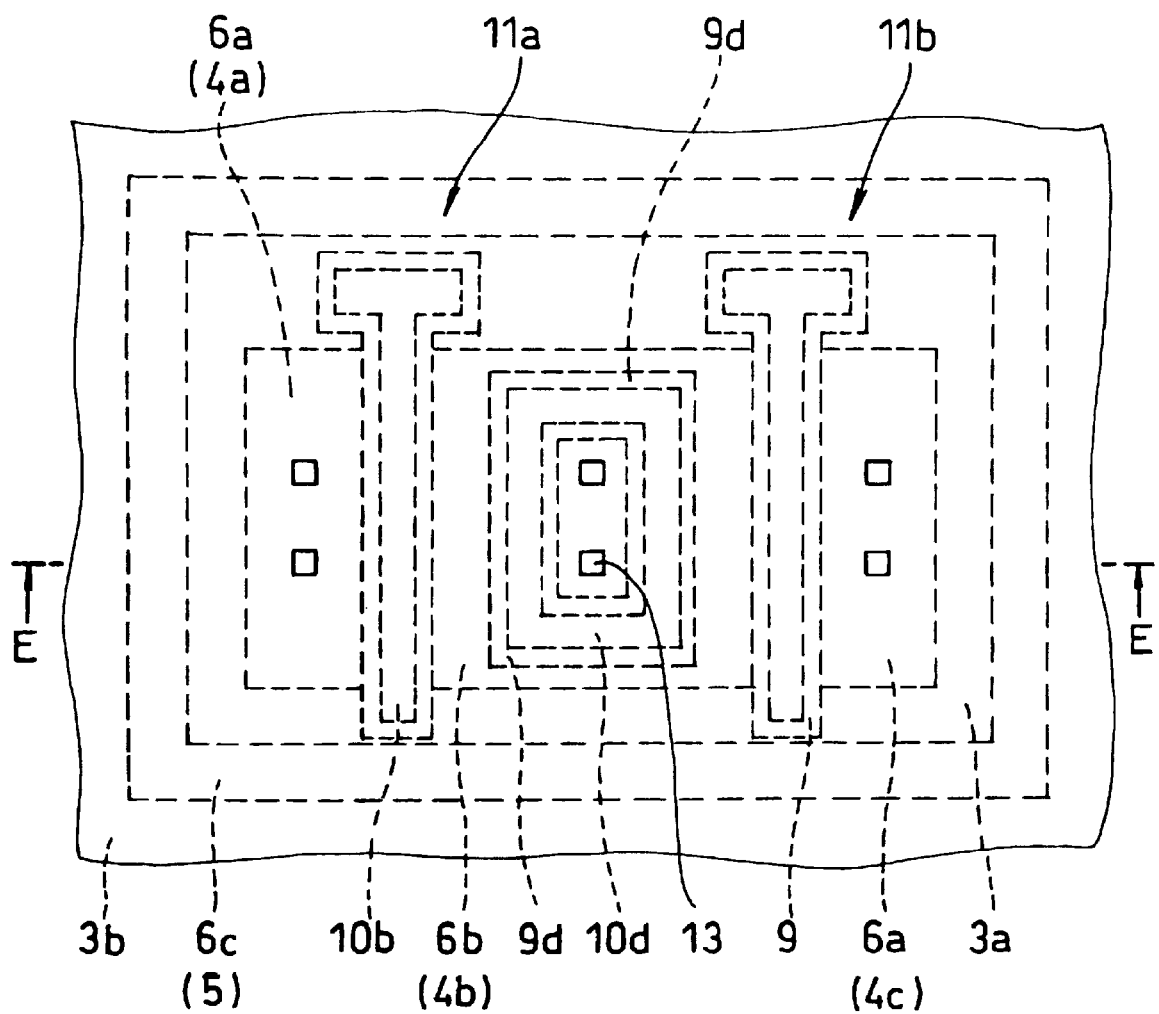
FIG. 10 is a plan view showing the structure of a semiconductor device according to the fourth embodiment of the present invention.
Figure 11:
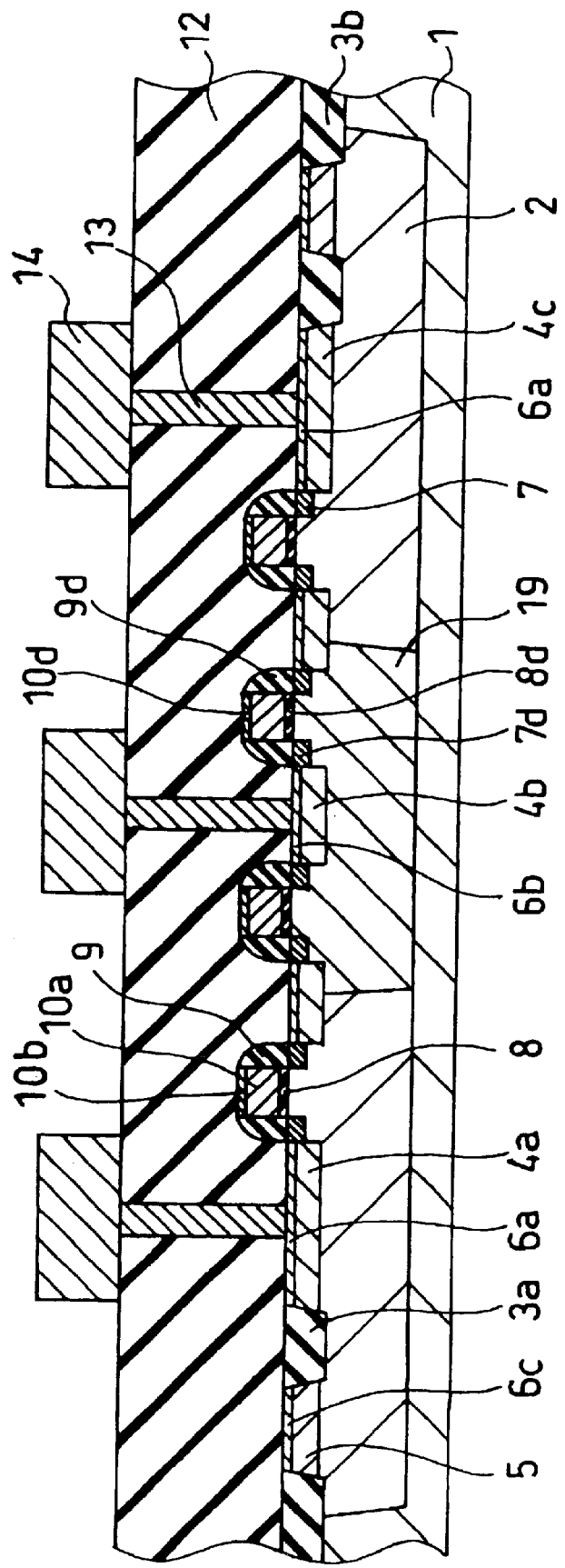
FIG. 11 is a cross-sectional view along the E—E line in FIG. 10.

The fourth embodiment of the present invention is described hereinafter. In the fourth embodiment, a dummy gate electrode 10d is formed at the region where the mask insulating film 18 in the form of a ring has been formed in the first embodiment. FIG. 10 is a plan view showing the structure of a semiconductor device according to the fourth embodiment, and FIG. 11 is a cross-sectional view along the E—E line. In the fourth embodiment shown in FIGS. 10 and 11, the same components as those of the first embodiment shown in FIGS. 1 and 2 are denoted by the same numerals and their explanations are omitted.

A dummy gate electrode 10d in the form of a ring is formed in the region of a plan view, where the ring-shaped mask insulating film 18 is formed in the first embodiment, and no $N^+$ diffusion layer is formed in this region. An N-well 19, whose side surface is surrounded by the P well, is formed. Although the bottom surface 19 of the N well 19 is in contact with the semiconductor substrate 1 in the present embodiment, the bottom surface may be covered by the P well 2. The N well 19 is formed, similar to the third embodiment, so as to be contact with the bottom surface of the dummy gate 10d. Under the dummy gate, a low concentration diffusion layer 7d, and a dummy gate insulating film 8d are formed, and a side wall insulating film 9d is formed at the side surfaces of a dummy gate electrode 10d and the dummy gate insulating film 8d. For example, a fixed voltage or a potential of an external terminal is supplied to the dummy gate electrode 10d or the dummy gate electrode 10d is maintained in a floating state.

In the fourth embodiment constituted as described above, the N well 19 under the dummy gate electrode 10d acts as a resistor between the drain diffusion layer and the drain wiring.

It is noted in the manufacturing process that the N well is formed at the central portion of the P well after the P well has been formed. In addition, at the time of forming the N-channel transistors 11a and 11b, the low concentration diffusion layer 7d, the dummy gate insulating film 8d, the dummy gate electrode 10d, and side wall insulating film 9d may be simultaneously formed in the N well 19. Therefore, the process to form the mask insulating film can be omitted. In addition, the P well 2 may be formed after the N well 19 is formed.

Figure 12:
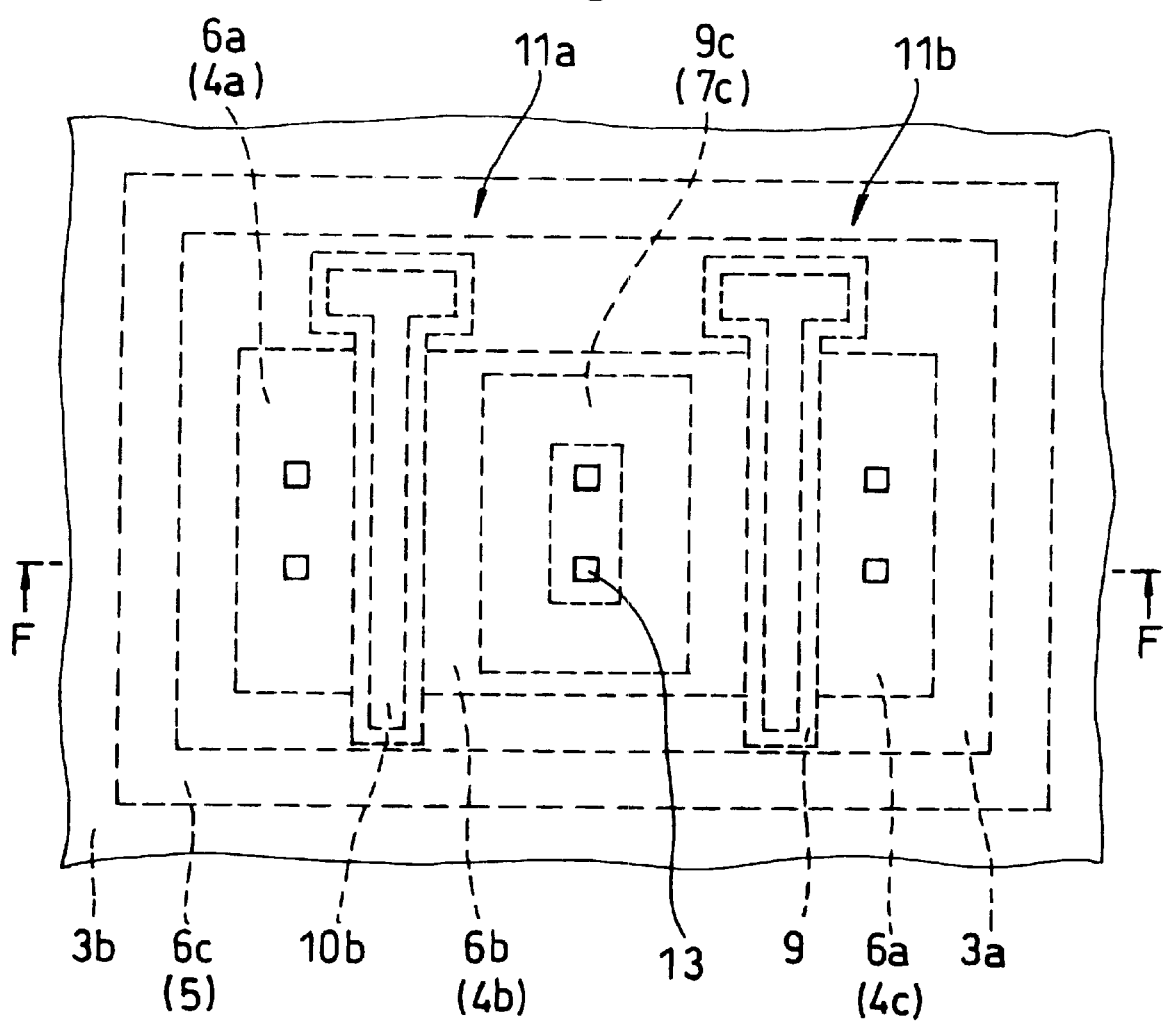
FIG. 12 is a plan view showing the structure of a semiconductor device according to the fifth embodiment of the present invention.
Figure 13:
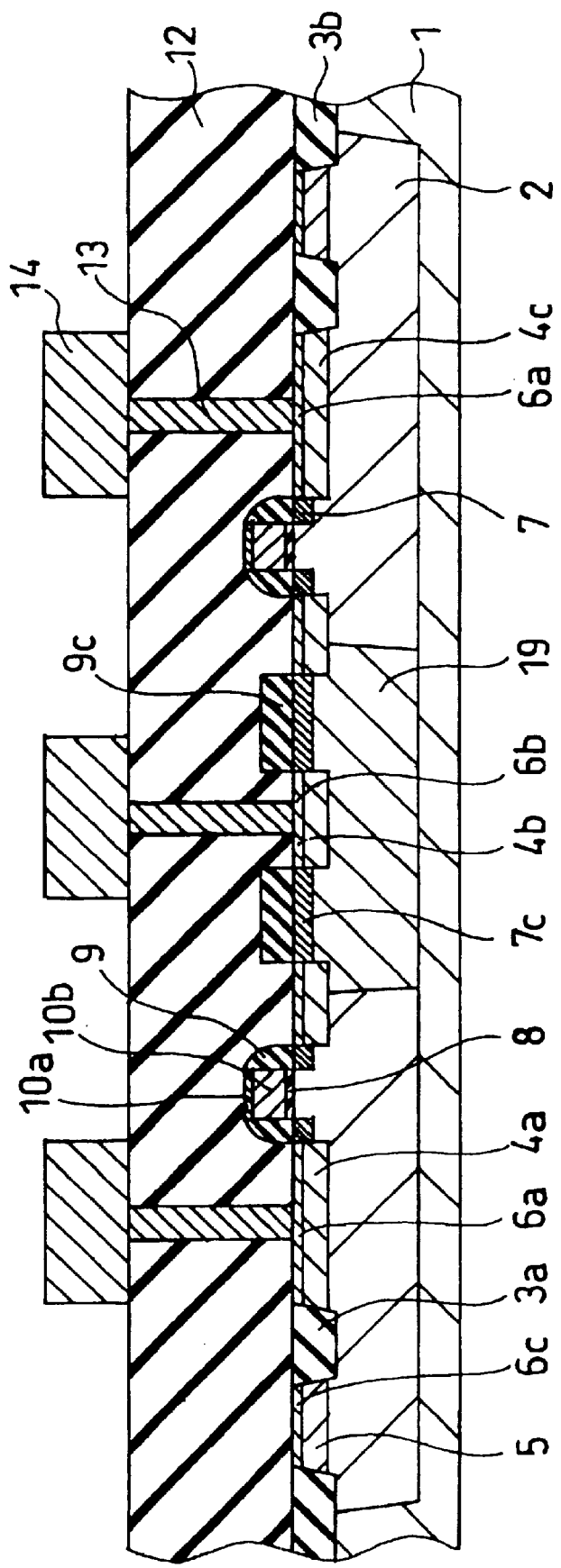
FIG. 13 is a cross-sectional view along the F—F line in FIG. 12.

The fifth embodiment of the present invention is described hereinafter. In the fifth embodiment, a side wall insulating film 9 and a ring-shaped insulating film are formed in the region of a plan view, where the ring-shaped mask insulating film 18 is formed in the first embodiment, and no $N^+$ diffusion layer is formed in this region. FIG. 12 is a plan view showing the structure of a semiconductor device according to the fifth embodiment, and FIG. 11 is a cross-sectional view along the F—F line. In the fifth embodiment shown in FIGS. 12 and 13, the same components as those of the first embodiment shown in FIGS. 1 and 2 are denoted by the same numerals and their explanations are omitted.

An insulating film 9c is formed in the region of a plan view, where the ring-shaped mask insulating film 18 is formed in the first embodiment. This insulating film is formed at the same time when the side wall insulating film 9 is formed. An N well 19 is formed, whose side wall is surrounded by the P well 2. Although the bottom of the N well 19 is in contact with the semiconductor substrate in this embodiment, the bottom may be surrounded by the P well 2. The N well 19 is formed so as to surround the insulating film from below. Furthermore, an N type low concentration impurity region 7c is formed directly below the insulating film 9c on the surface of the N well 19 and no $N^+$ diffusion layer 4b is formed in this N type low concentration impurity region 7c. The concentration of the N type impurity in the N type low concentration impurity region 7c is almost the same as that in the low concentration diffusion layer 7.

In the fifth embodiment constituted as described above, the N type low concentration impurity region 7c and the N well 19 act as the resistive element between the drain diffusion layer and the drain wiring.

When manufacturing the semiconductor device according to the fifth embodiment, the N well 19 is formed at the center portion of the P well 2 after forming the P well 2. Furthermore, the N type low concentration impurity region 7c in the form of a ring can be defined in the N well 19 by forming a ring-shaped insulating film 9c at the same time as the formation of the side wall insulating film 9 and executing ion-implantation by use of the above described ring-shaped insulating film 9c. It is noted that the P well 2 may be formed after the N well 19 is formed.

Figure 14:
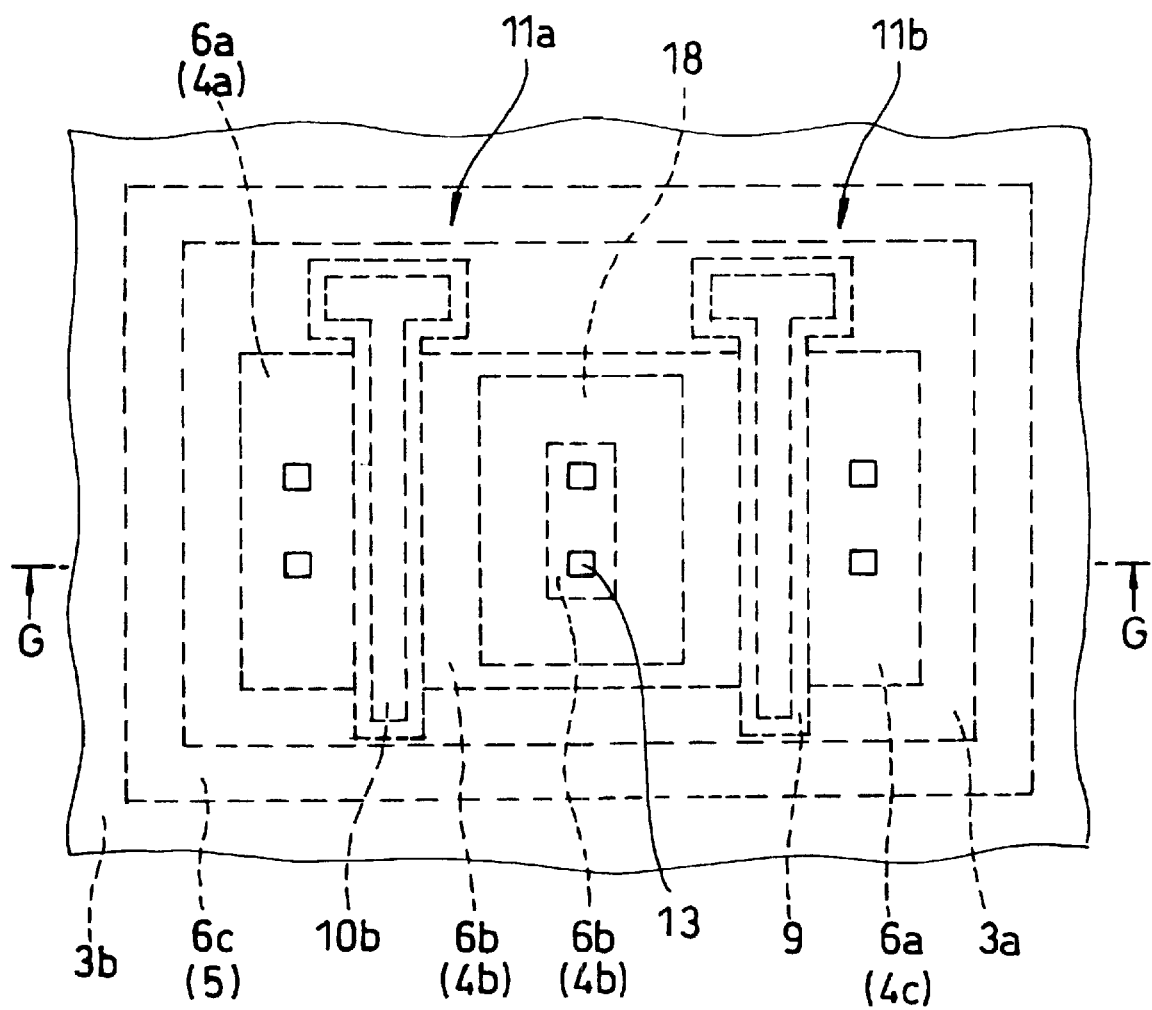
FIG. 14 is a plan view showing the structure of a semiconductor device according to the sixth embodiment of the present invention.
Figure 15:
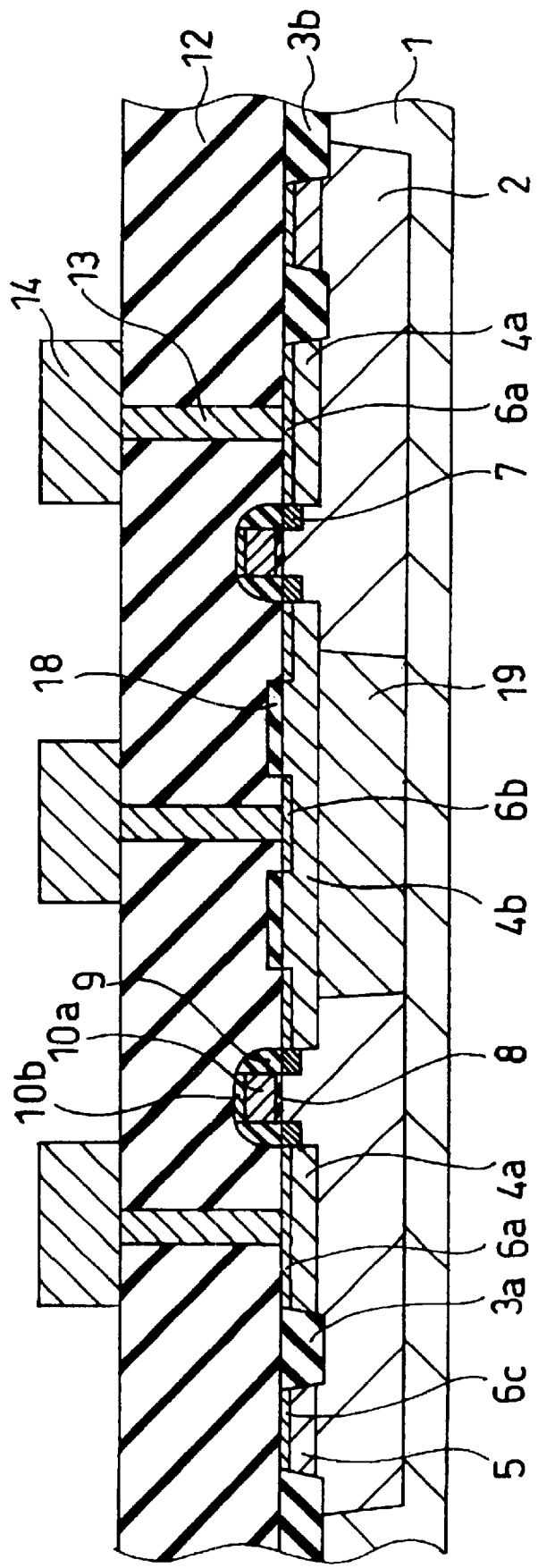
FIG. 15 is a cross-sectional view along the G—G line in FIG. 14.

Hereinafter, the sixth embodiment of the present invention is described. In the sixth embodiment, the N well 19, similar to that provided in the first and the third embodiments, is formed. FIG. 14 is a plan view showing the structure of a semiconductor device according to the sixth embodiment, and FIG. 15 is a cross-sectional view along the G—G line. In the sixth embodiment shown in FIGS. 14 and 15, the same components as those of the first embodiment shown in FIGS. 1 and 2 are denoted by the same numerals and their explanations are omitted.

In the sixth embodiment, the N well 19, side surface of which is covered by the P well 2, covers the bottom surface of the mask insulating film. Although the bottom surface of the N well 19 is in contact with the semiconductor substrate 1 in this embodiment, the bottom surface of the N well 19 may be surrounded by the P well 2.

In the sixth embodiment constituted as described above, the N well 19 is provided, side surfaces of which are surrounded by the P well 2 covers the bottom surface of the region, where the mask insulating film 18 is formed. Although the bottom surface of the N well 19 is in contact with the substrate surface 1, the bottom surface of the N well 19 may be surrounded by the P well 2.

In the sixth embodiment constituted as described above, the region where there is no silicide film 6b of the N+ diffusion layer and the N well 19 acts are the resistive element between the drain diffusion layer and the drain wiring.

It is noted that the N well 19 may be formed on the center of the P well after forming the P well 2 or the N well 19 may be formed before formation of the P well.

Figure 16:
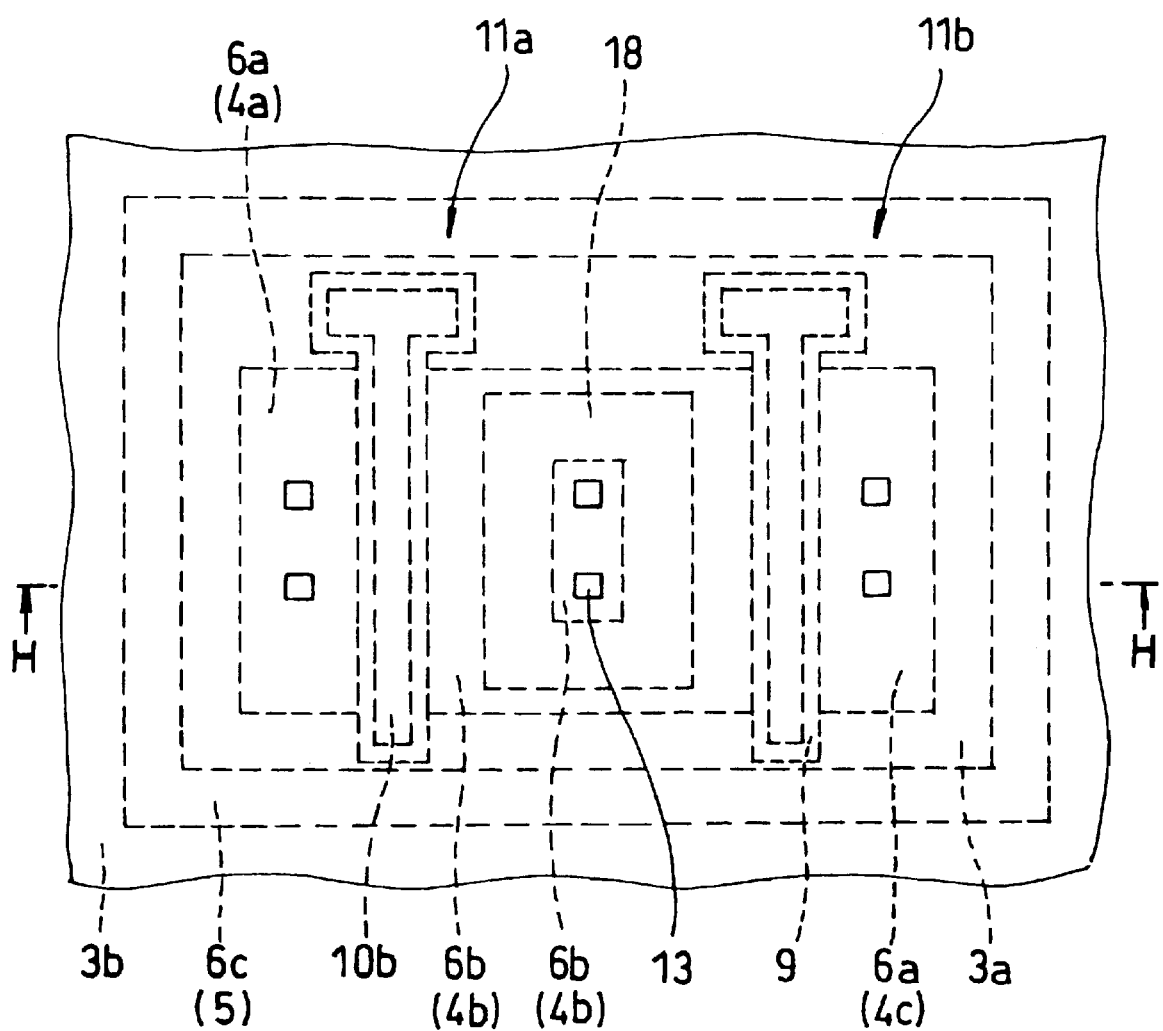
FIG. 16 is a plan view showing the structure of a semiconductor device according to the seventh embodiment of the present invention.
Figure 17:
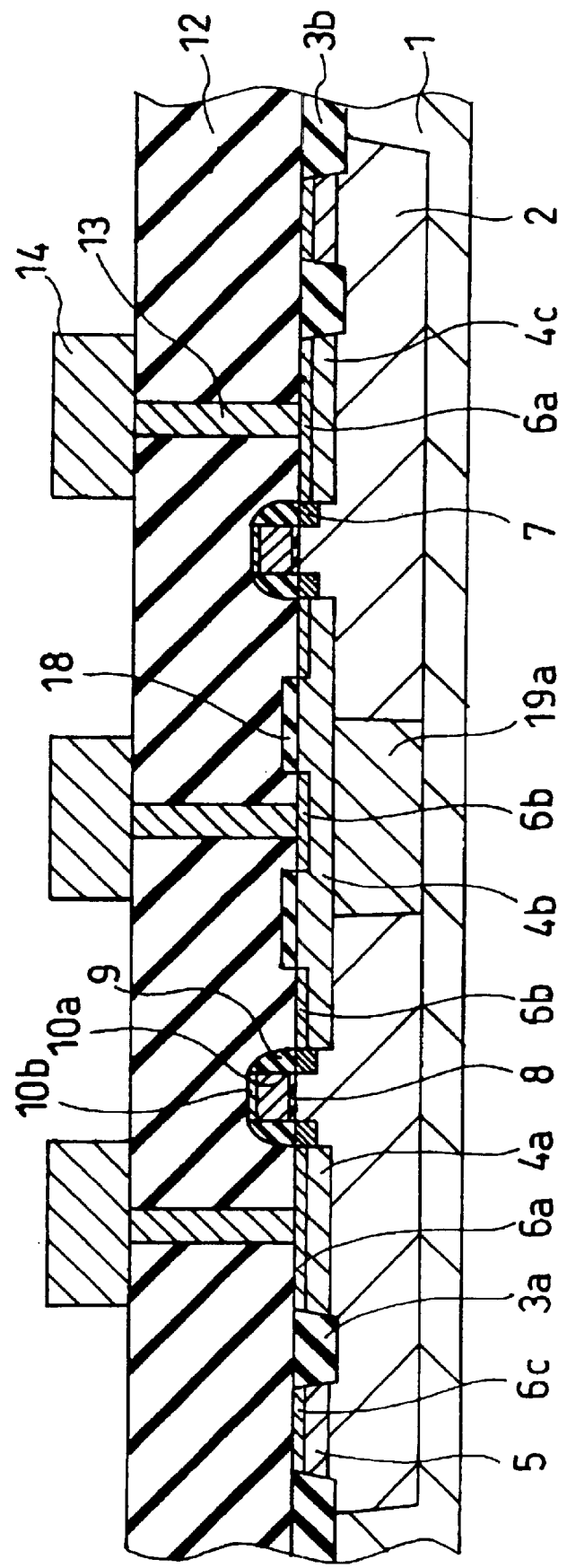
FIG. 17 is a cross-sectional view along the H—H line in FIG. 16.

Next, the seventh embodiment of the present invention is described. In the seventh embodiment, an N well is formed which substantially matches the region surrounded by the center portion in the width direction of the mask insulating film 18. FIG. 16 is a plan view showing the structure of a semiconductor device according to the seventh embodiment, and FIG. 17 is a cross-sectional view along the H—H line. In the seventh embodiment shown in FIGS. 16 and 17, the same components as those of the first embodiment shown in FIGS. 1 and 2 are denoted by the same numerals and their explanations are omitted.

In the seventh embodiment, an N well 19a is formed which substantially matches the region surrounded by the center portion in the width direction of the mask insulating film 18. The side ssurfaces of the N well 19a are surrounded by the P well 2. That is, the boundary between the P well 2 and the N well 19a is located at the position directly below the mask insulating film 18. Although the bottom surface of the N well is in contact with the semiconductor substrate 1, the bottom surface of the N well 19a may be surrounded by the P well 2.

Figure 18A:
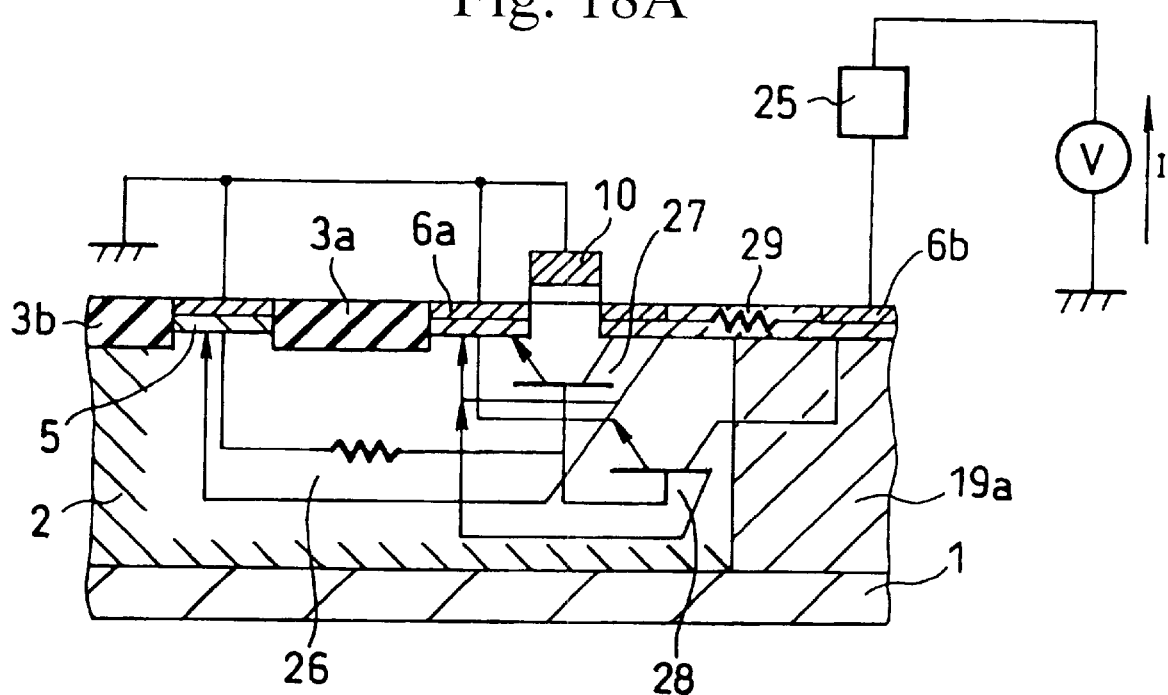
FIG. 18A is a cross-sectional view showing the propagation path of the surge current in the seventh embodiment.
Figure 18B:
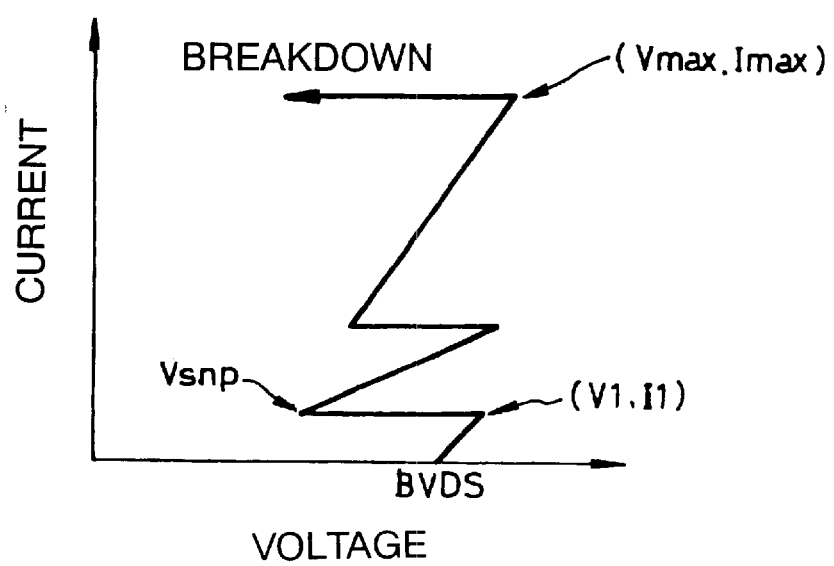
FIG. 18B is a graph showing the change of the voltage applied to the drain diffusion layer due to the surge current.

In the seventh embodiment constituted as described above, the surge current is made to flow to ground by the operation described below. FIG. 18A is a cross-sectional view showing the propagation path of the surge current in the seventh embodiment, and 18B is a graph showing the voltage change of the drain diffusion layer due to the surge current.

When the ESD surge current flows into the pad 25 connected to the silicide layer 6, the drain voltage increases through the diffusion layer resistance 29, and when the voltage reaches a certain voltage (BVDS), an avalanche breakdown develops at a PN junction between the drain diffusion layer (N+ diffusion layer 4b) and the P well 2.

When the ESD surge current further increases, the breakdown current further flows to the guard ring (P+ diffusion layer 5) and the current goes through to the ground (GND). Accordingly, the voltage of the P well 2 adjacent to the source diffusion layer rises due to the voltage drop by the parasitic resistance 26.

When the ESD current further increases and the drain voltage reaches voltage V1, the PN junction between the source diffusion layer (N+ diffusion layer 4a) and the P well 2 is forward biased and the parasitic bipolar transistor 27 is switched to the on state. That is, the N-channel MOS transistor 11a enters snapback. Consequently, the drain voltage reduces to Vsnp, since not only does the breakdown current flows from the drain diffusion layer (N+ diffusion layer 4b) to the guard ring (P+ diffusion layer 5), but also the snapback current flows from the drain diffusion layer (N+ diffusion layer 4b) to the source diffusion layer (N+ diffusion layer 4a).

When the ESD surge current further increases, the drain voltage again increases due to the voltage drop by the diffusion layer resistance. When the voltage reaches a certain voltage, the parasitic bipolar transistor 28 is turned on. Consequently, the drain voltage id reduced, since the snapback current flows from the N well 19a to the source diffusion layer (N+ diffusion layer 4a).

After that, when the ESD surge current further increases, the drain voltage increases, and when the voltage reaches a voltage V max, the N-channel MOS transistor 11a is destroyed due to the temperature rise.

As described above, according to the seventh embodiment, since two parasitic bipolar transistors are present for one N-channel MOS transistor, and since these two parasitic bipolar transistors are turned on in sequence, a comparatively higher breakdown voltage is obtained than the those for the first and the sixth embodiments.

When manufacturing semiconductor devices according to the seventh embodiment, the N well 19a may be formed at the central portion of the P well after forming the P well 2 or the N well 19a may be formed before the formation of the P well 2.

Figure 19:
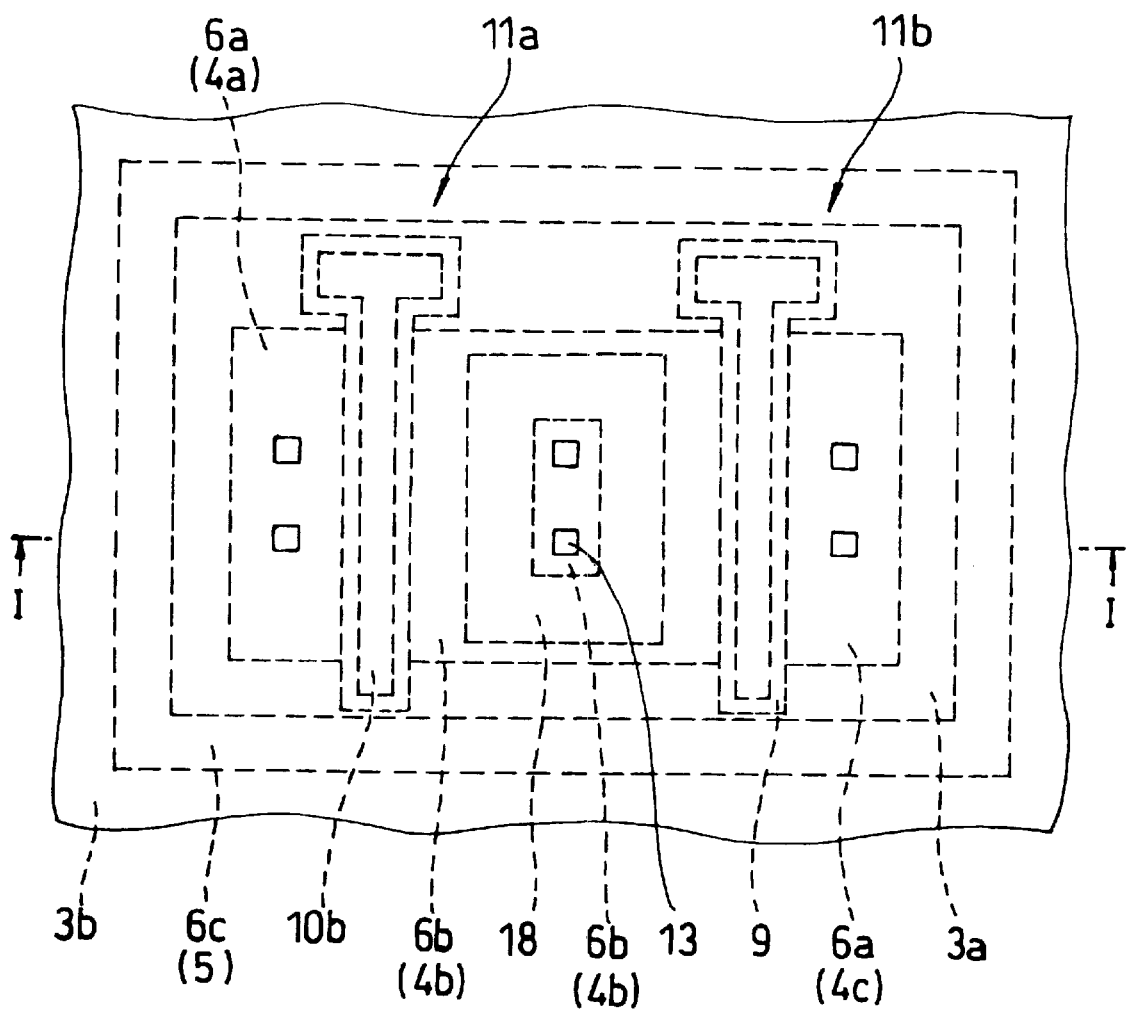
FIG. 19 is a plan view showing the structure of a semiconductor device according to the eighth embodiment of the present invention.
Figure 20:
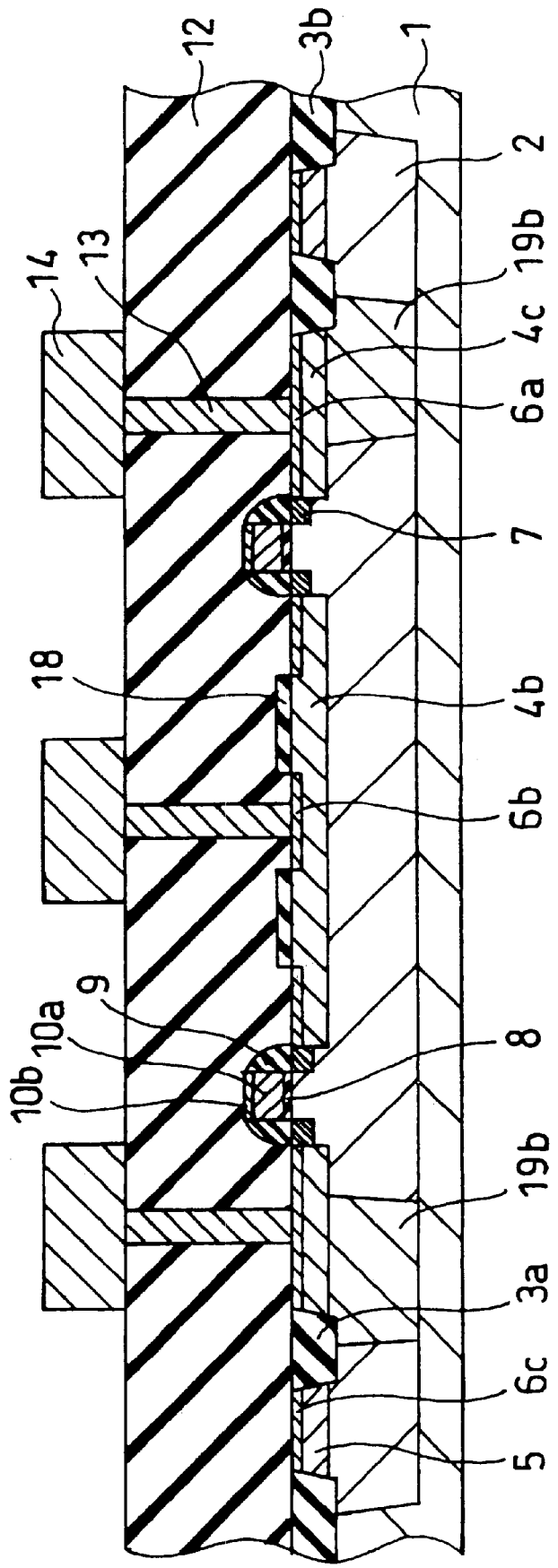
FIG. 20 is a cross-sectional view along the I—I line in FIG. 19.

Next, the eighth embodiment of the present invention is described. In the eighth embodiment, the N well is formed under the source diffusion layer of each N-channel MOS transistor. FIG. 19 is a plan view showing the structure of a semiconductor device according to the eighth embodiment, and FIG. 20 is a cross-sectional view along the I—I line. In the eighth embodiment shown in FIGS. 19 and 20, the same components as those of the first embodiment shown in FIGS. 1 and 2 are denoted by the same numerals and their explanations are omitted.

In the eighth embodiment, the N well 19b is formed under the source diffusion layer of each N-channel MOS transistor. The side surface of the N well 19b is surrounded by the P well 2 and the bottom surface of the N well 19b is in contact with the semiconductor substrate 1.

In the thus constituted eighth embodiment, the region, where there is no silicide layer in the N+ diffusion layer acts as the resistive element between the drain diffusion layer and the drain wiring of the transistor. A large parasitic resistance is obtained, since a breakdown current flows through the highly resistive semiconductor substrate 1 due to the presence of the N well 19b. Consequently, the parasitic bipolar transistor is turned on by a small breakdown current. Since the above described effect is reduced when the bottom surface is surrounded by the P well, it is preferable for the bottom surface of the N well 19b to be in contact directly with the semiconductor surface 1.

When manufacturing semiconductor devices according to the eighth embodiment, the N well 19a may be formed at the central portion of the P well after forming the P well 2 or the N well 19a may be formed before the formation of the P well 2.

Figure 21:
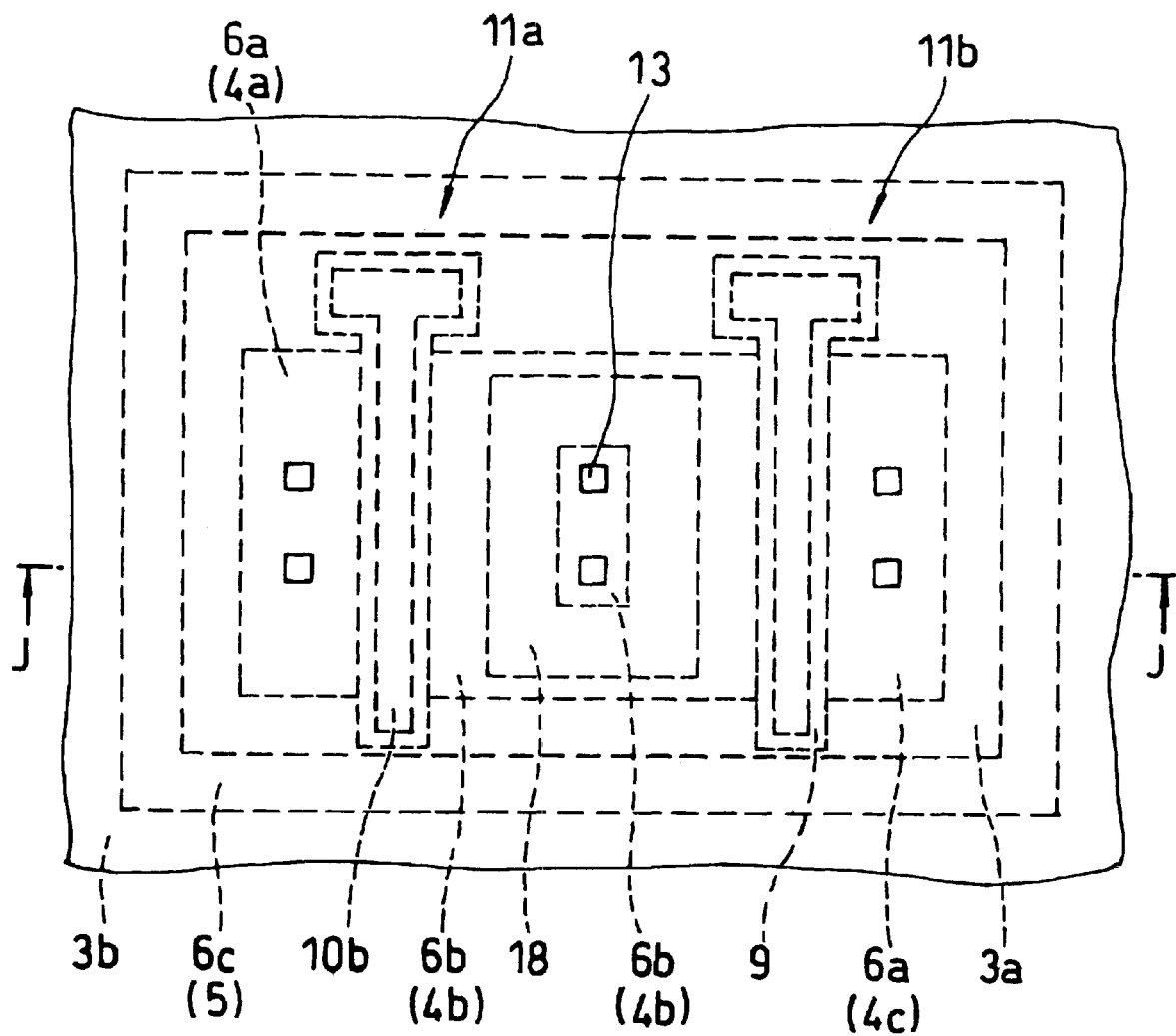
FIG. 21 is a plan view showing the structure of a semiconductor device according to the ninth embodiment of the present invention.
Figure 22:
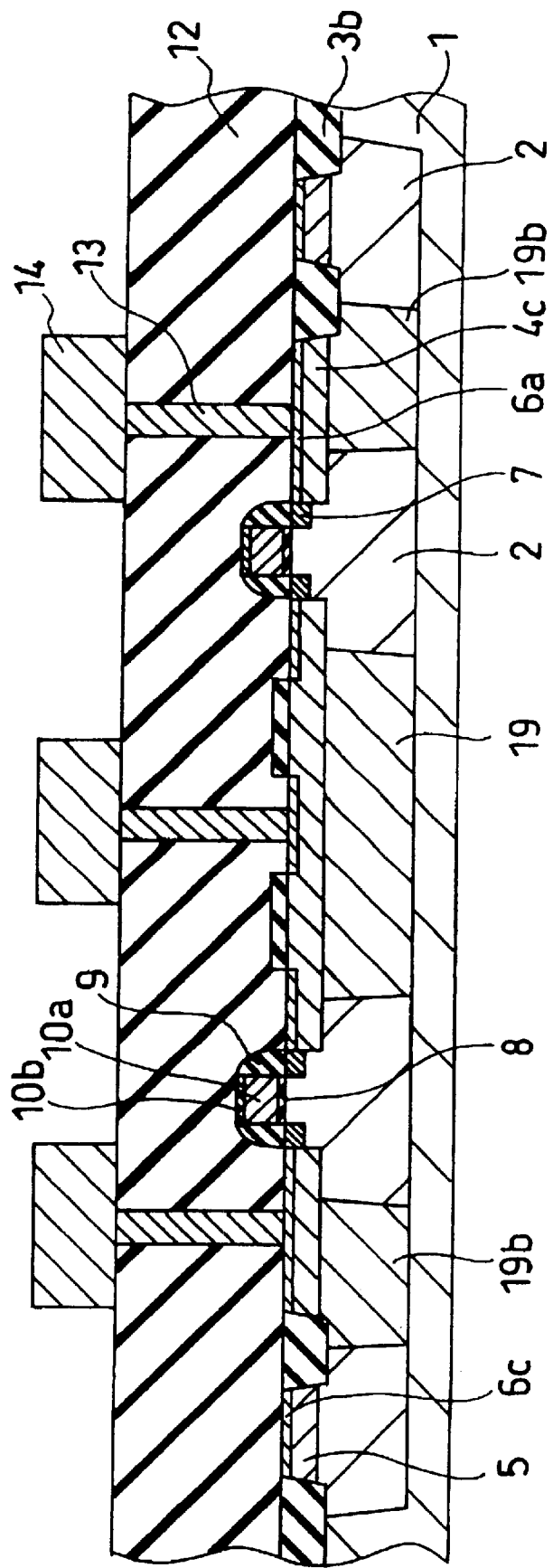
FIG. 22 is a cross-sectional view along the J—J line in FIG. 21.

Next, the ninth embodiment of the present invention is described. The ninth embodiment is a combination of the third and the eighth embodiments. FIG. 21 is a plan view showing the structure of a semiconductor device according to the ninth embodiment, and FIG. 22 is a cross-sectional view along the J—J line. In the ninth embodiment shown in FIGS. 21 and 22, the same components as those of the first embodiment shown in FIGS. 1 and 2 are denoted by the same numerals and their explanations are omitted.

The ninth embodiment is provided with two N wells 19 and 19b. The side surfaces of these two N wells 19 and 19b are surrounded by P well 2. Although each bottom surface of the N wells is in contact with the surface of the semiconductor substrate, the bottom surface of the N well 19 may be covered by the P well 2.

In the thus constituted ninth embodiment, the combined effects of the third and the eighth embodiments are obtained.

When manufacturing the semiconductor device according to the ninth embodiment, the N wells 19 and 19b may be formed simultaneously at an prescribed portion of the P well after forming the P well 2 or the N wells 19 and 19b may be formed before the formation of the P well 2.

Figure 23:
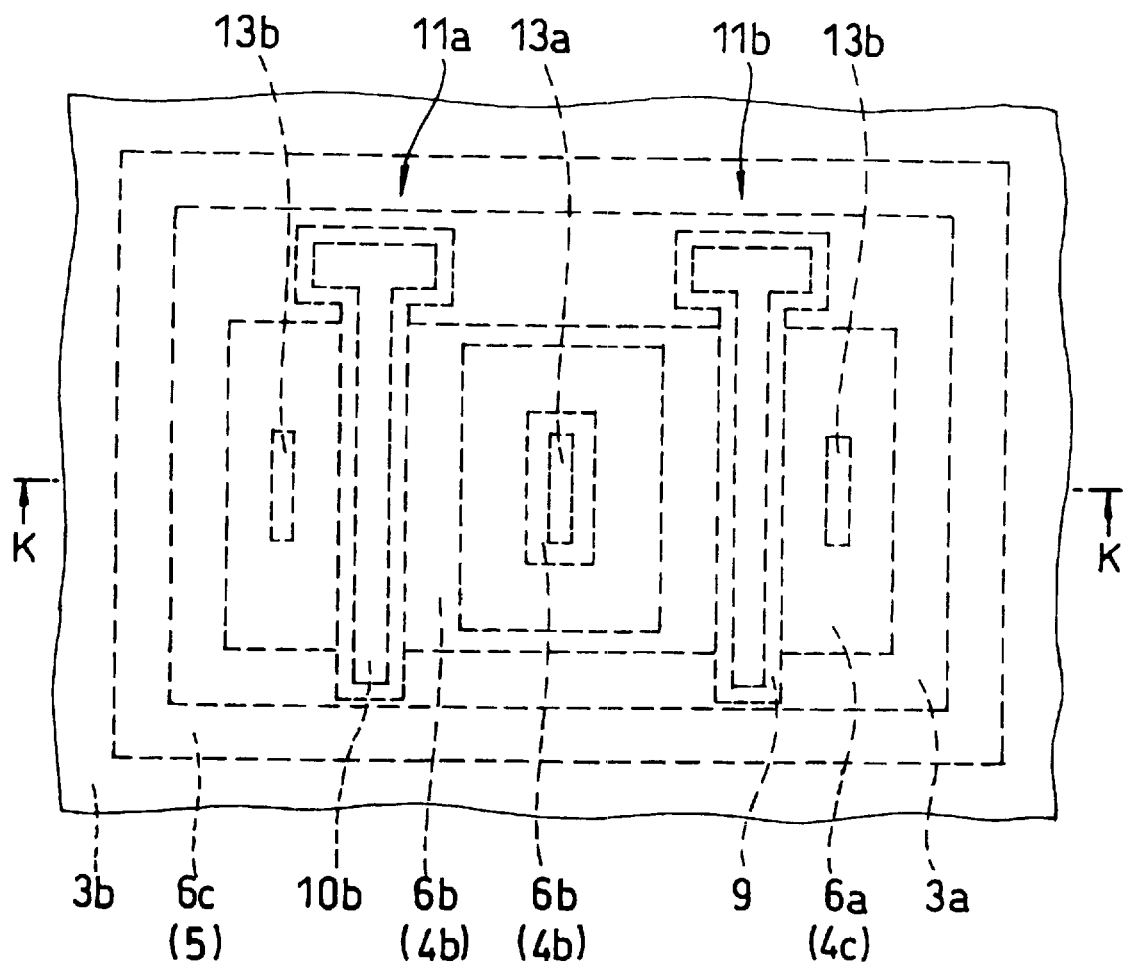
FIG. 23 is a plan view showing the structure of a semiconductor device according to the tenth embodiment of the present invention.
Figure 24:
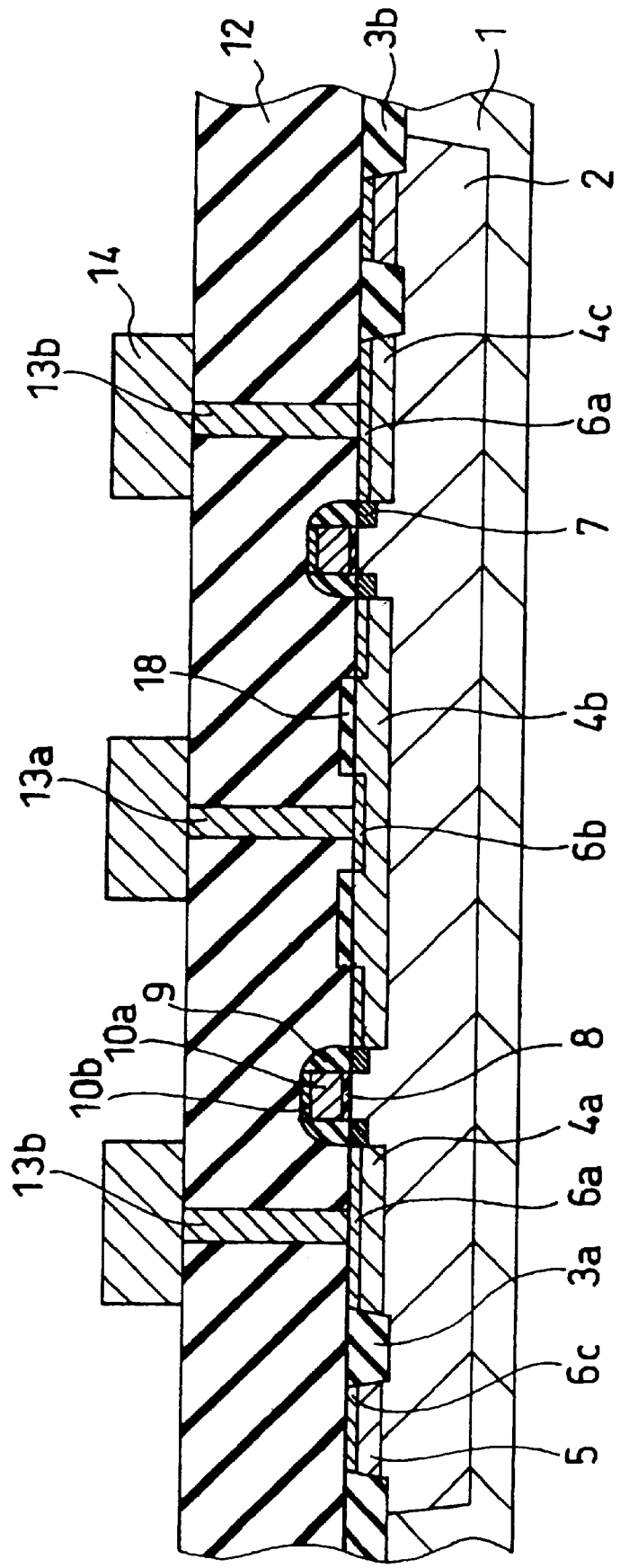
FIG. 24 is a cross-sectional view along the K—K line in FIG. 23.

Next, the tenth embodiment of the present invention is described, although two contact plugs for the drain wiring and two plugs for each source wiring are provided respectively in the first and ninth embodiments, the tenth embodiment is provided with a contact plug for drain wiring extending in the direction of the gate width and a contact plug for source wiring. FIG. 23 is a plan view showing the structure of a semiconductor device according to the tenth embodiment, and FIG. 24 is a cross-sectional view along the K—K line. In the tenth embodiment shown in FIGS. 23 and 24, the same components as those of the first embodiment shown in FIGS. 1 and 2 are denoted by the same numerals and their explanations are omitted.

As described above, the tenth embodiment is provided with a contact plug 13a extending in the direction of the gate width for drain wiring and a contact plug 13b for each source wiring.

In the thus constituted tenth embodiment, the resistance between the source/drain diffusion layer and each wire can be further reduced.

When manufacturing the semiconductor device according to the tenth embodiment, contact plugs 13a and 13b are formed by embedding the metal layers in the contact holes formed so as to match these contact plugs 13a and 13b at respective predetermined positions after forming the interlayer insulating film 12.

Figure 25:
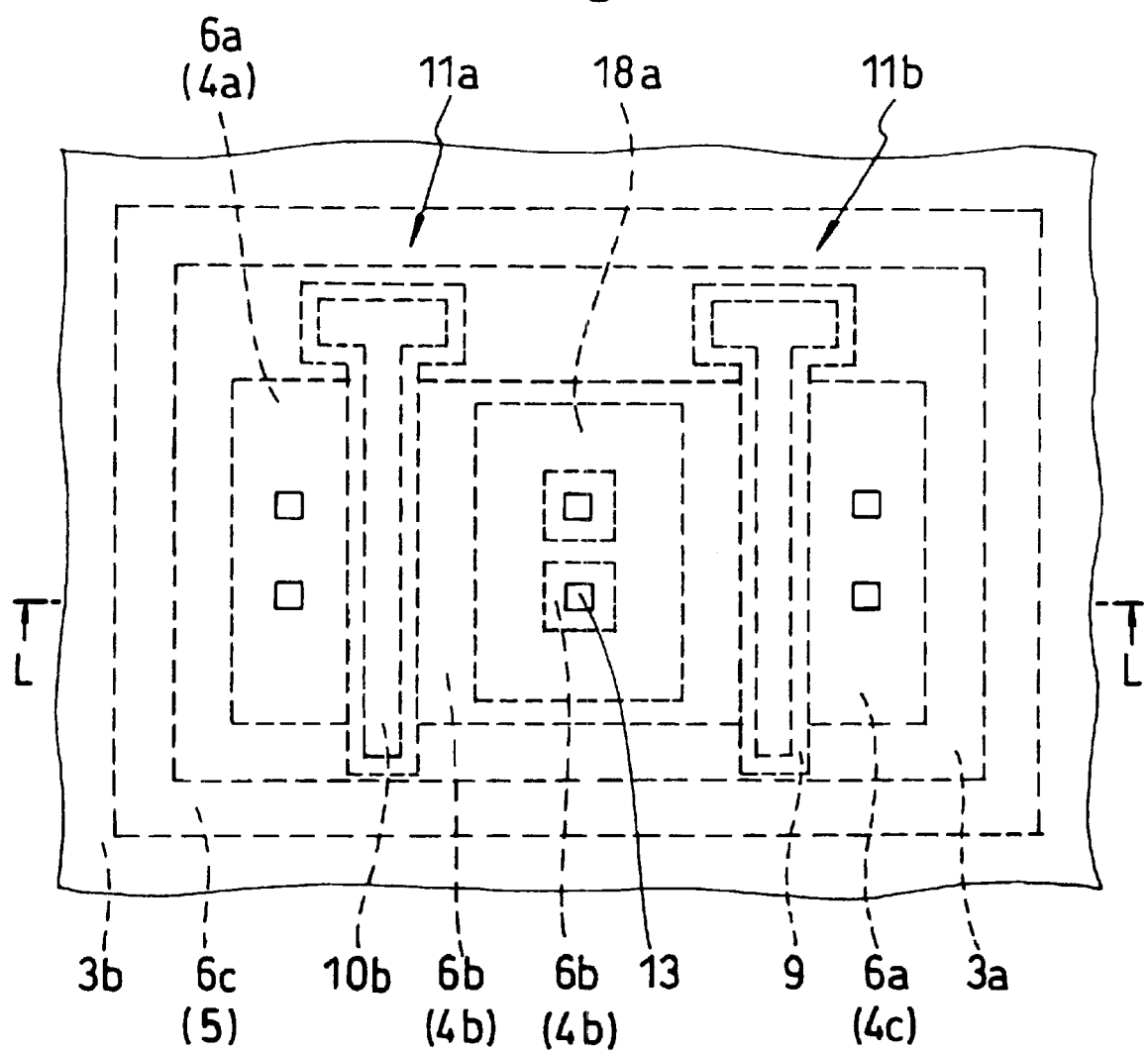
FIG. 25 is a plan view showing the structure of a semiconductor device according to the eleventh embodiment of the present invention.
Figure 26:
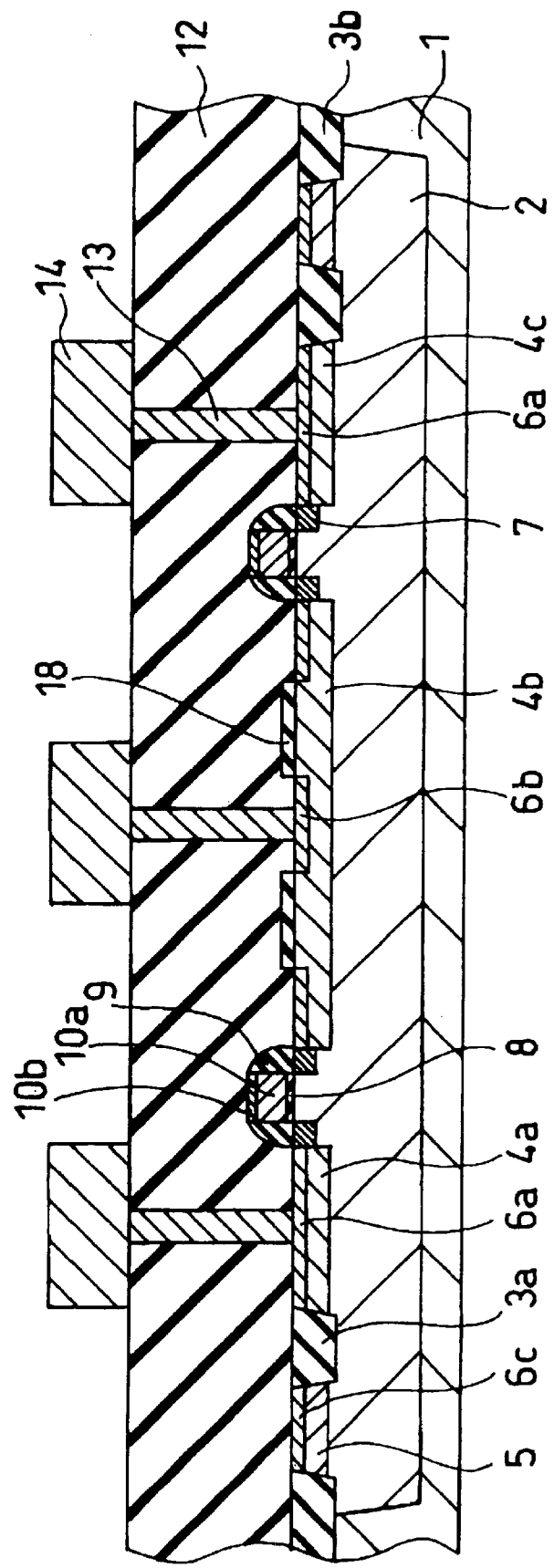
FIG. 26 is a cross-sectional view along the L—L line in FIG. 25.

Next, the eleventh embodiment of the present invention is described. In the eleventh embodiment, two contact plugs are connected to two different silicide films. FIG. 25 is a plan view showing the structure of a semiconductor device according to the eleventh embodiment, and FIG. 26 is a cross-sectional view along the L—L line. In the eleventh embodiment shown in FIGS. 21 and 22, the same components as those of the first embodiment shown in FIGS. 1 and 2 are denoted by the same numerals and their explanations are omitted.

In the eleventh embodiment, a mask insulating film 18a, not in the form of a ring, but in the shape of the letter "8", is formed and directly beneath the mask insulating film 18a, and no silicide film is formed. Accordingly, the silicide layer 6b in an area surrounded by the mask insulating film 18a is partitioned into two regions. The thus partitioned two silicide films 6b are connected to respective contact plugs 13 for drain wiring.

When manufacturing a semiconductor device according to the eleventh embodiment, the mask insulating film 18 is formed in the shape of the letter "8".

Figure 27:
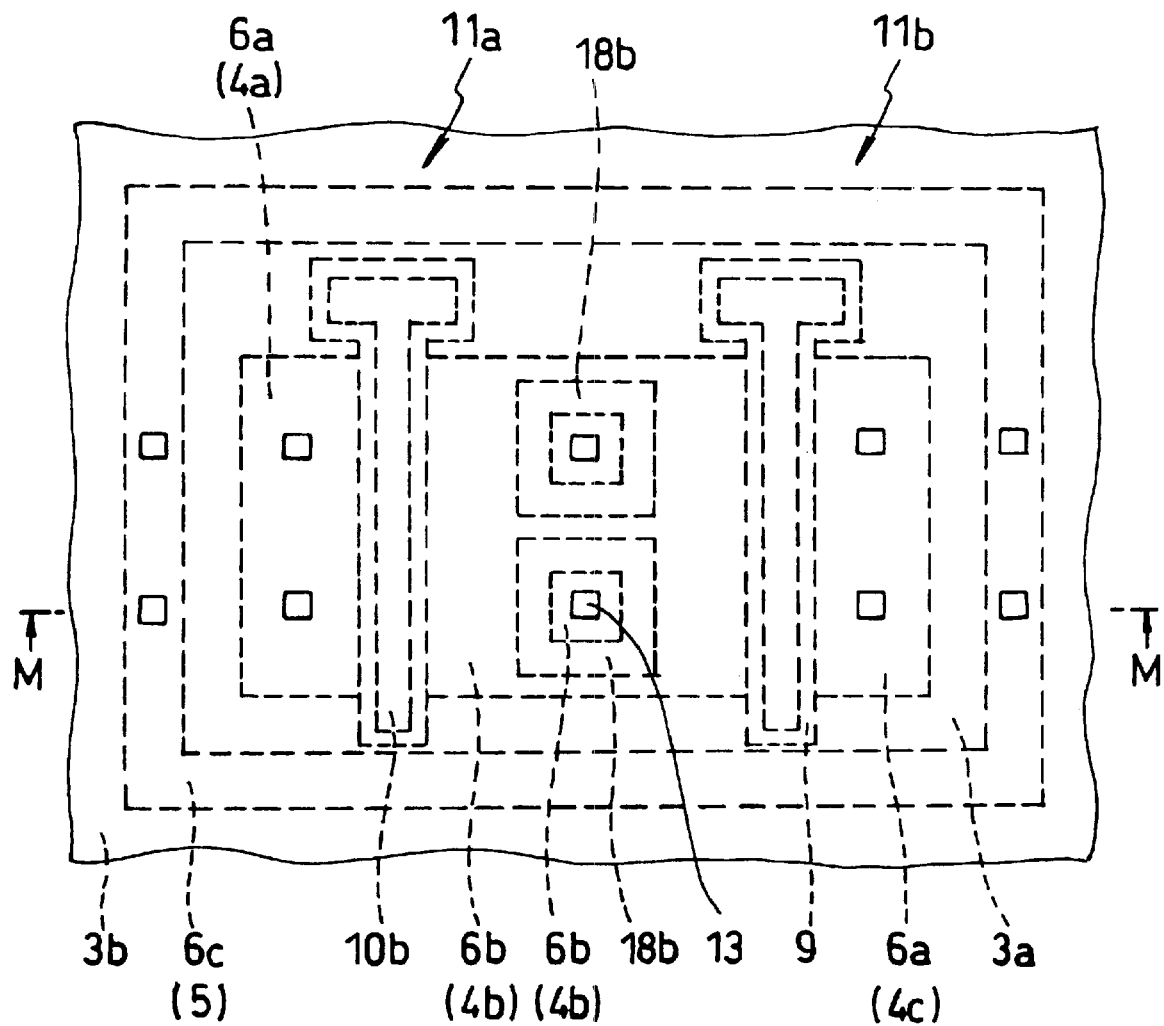
FIG. 27 is a plan view showing the structure of a semiconductor device according to the twelfth embodiment of the present invention.
Figure 28:
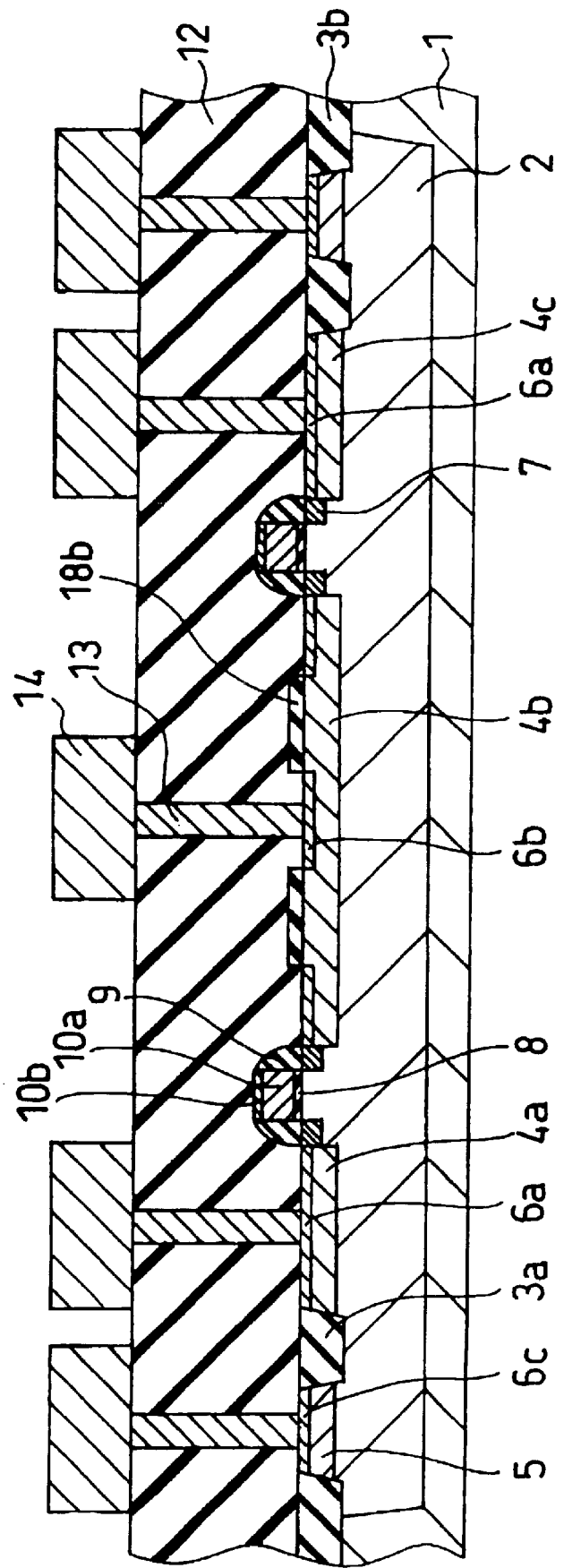
FIG. 28 is a cross-sectional view along the M—M line in FIG. 27.

Next, the twelfth embodiment of the present invention is described. In the twelfth embodiment, two ring-shaped mask insulating films are formed and each silicide film surrounded by each ring-shaped insulating film is connected to a contact plug. FIG. 27 is a plan view showing the structure of a semiconductor device according to the twelfth embodiment, and FIG. 28 is a cross-sectional view along the M—M line. In the twelfth embodiment shown in FIGS. 27 and 28, the same components as those of the first embodiment shown in FIGS. 1 and 2 are denoted by the same numerals and their explanations are omitted.

In the twelfth embodiment, two ring-shaped mask insulating films 18 are disposed forming a line on the N$^+$ diffusion layer 4b. No silicide layer is formed just below the ring-shaped insulating film 18b. The contact plug 13 is connected to each silicide film 6b in a region surrounded by each ring-shaped mask insulating film 18b.

When manufacturing the semiconductor device according to the twelfth embodiment, two mask insulating films 18b are formed instead of forming the mask insulating film 18.

Figure 29:
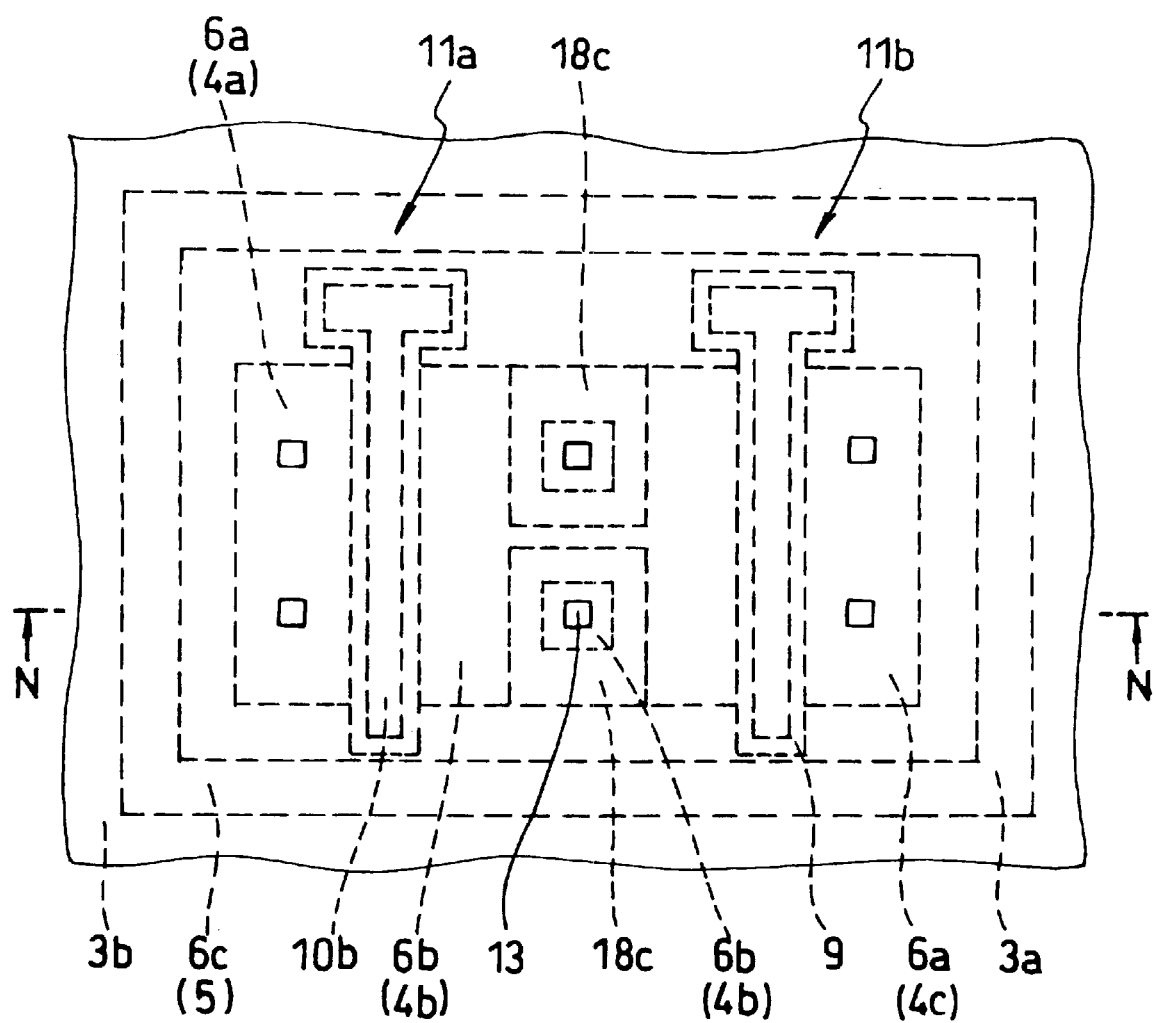
FIG. 29 is a plan view showing the structure of a semiconductor device according to the thirteenth embodiment of the present invention.
Figure 30:
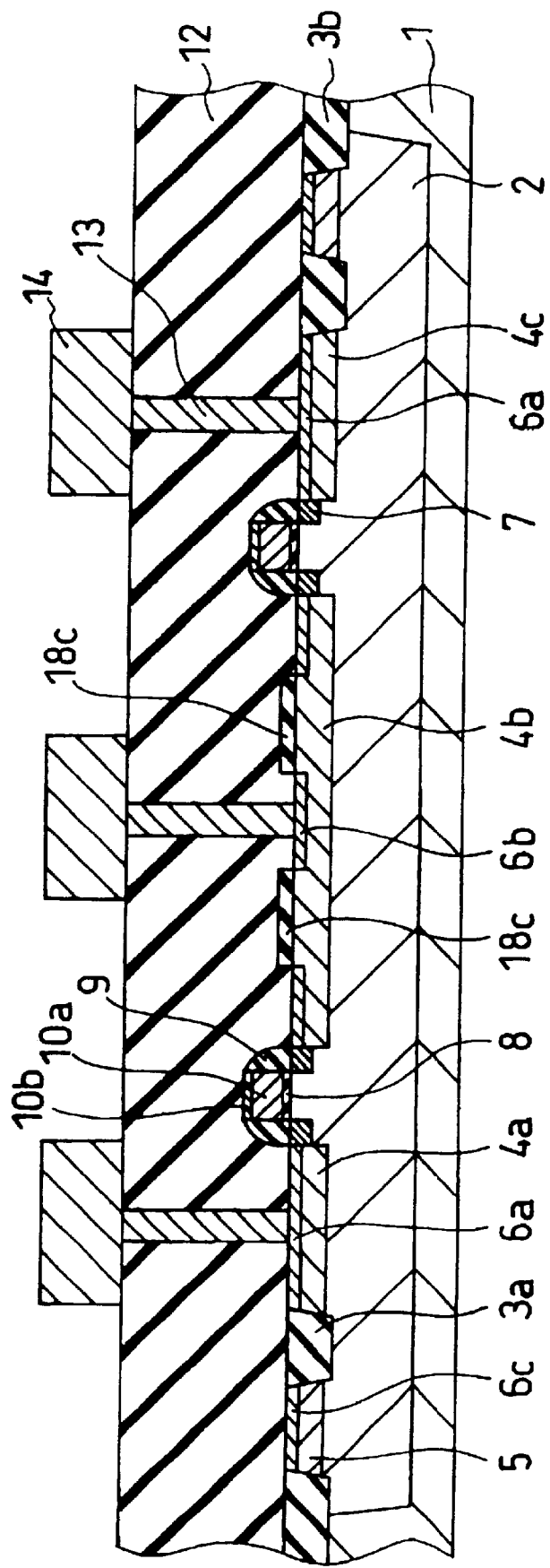
FIG. 30 is a cross-sectional view along the N—N line in FIG. 29.

Next, the thirteenth embodiment of the present invention is described. In the thirteenth embodiment, two ring-shaped mask insulating films, one end of which reaches the end of the P well, are provided and a contact plug is connected to the silicide film in each region surrounded by each ring-shaped mask insulating film. FIG. 29 is a plan view showing the structure of a semiconductor device according to the thirteenth embodiment, and FIG. 30 is a cross-sectional view along the N—N line. In the thirteenth embodiment shown in FIGS. 29 and 30, the same components as those of the first embodiment shown in FIGS. 1 and 2 are denoted by the same numerals and their explanations are omitted.

In the thirteenth embodiment, two ring-shaped mask insulating films 18c are formed on a line in the direction of the gate width on the N$^+$ diffusion layer 4b. One end portion of each mask insulating film 18c extends to the end portion of the P well 2 and respective drains of two N-channel MOS transistors 11a and 11b are connected through a silicide film 6b between two mask insulating film 18c. Immediately below the ring-shaped mask insulating films 18c, no silicide film is formed. A contact plug 13 for the drain wiring is connected to the silicide film 6b in the region surrounded by each ring-shaped mask insulating film 18c.

When manufacturing the semiconductor device according to the thirteenth embodiment, two mask insulating films 18b are formed instead of forming the mask insulating film 18.

Figure 31:
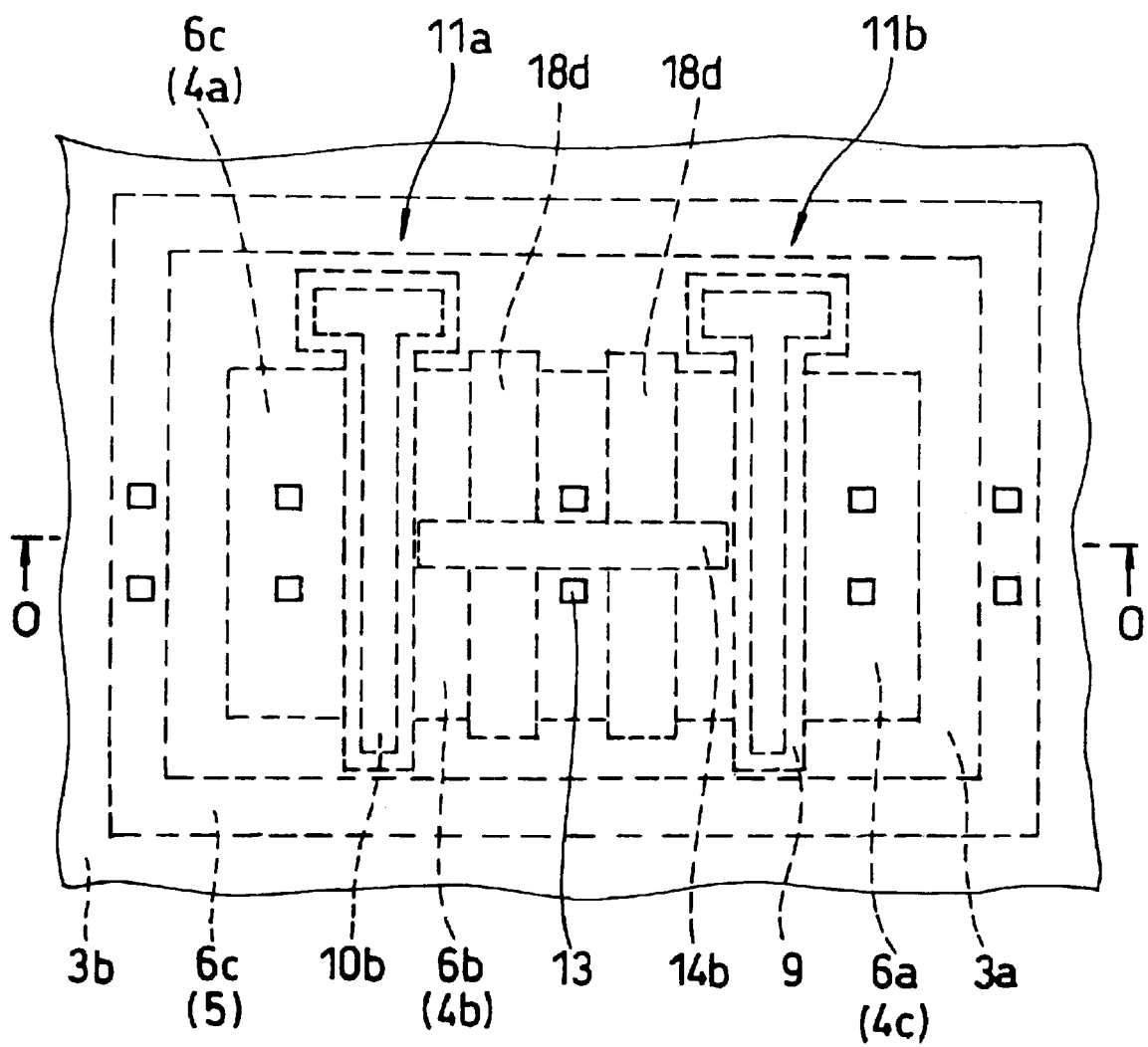
FIG. 31 is a plan view showing the structure of a semiconductor device according to the fourteenth embodiment of the present invention.
Figure 32:
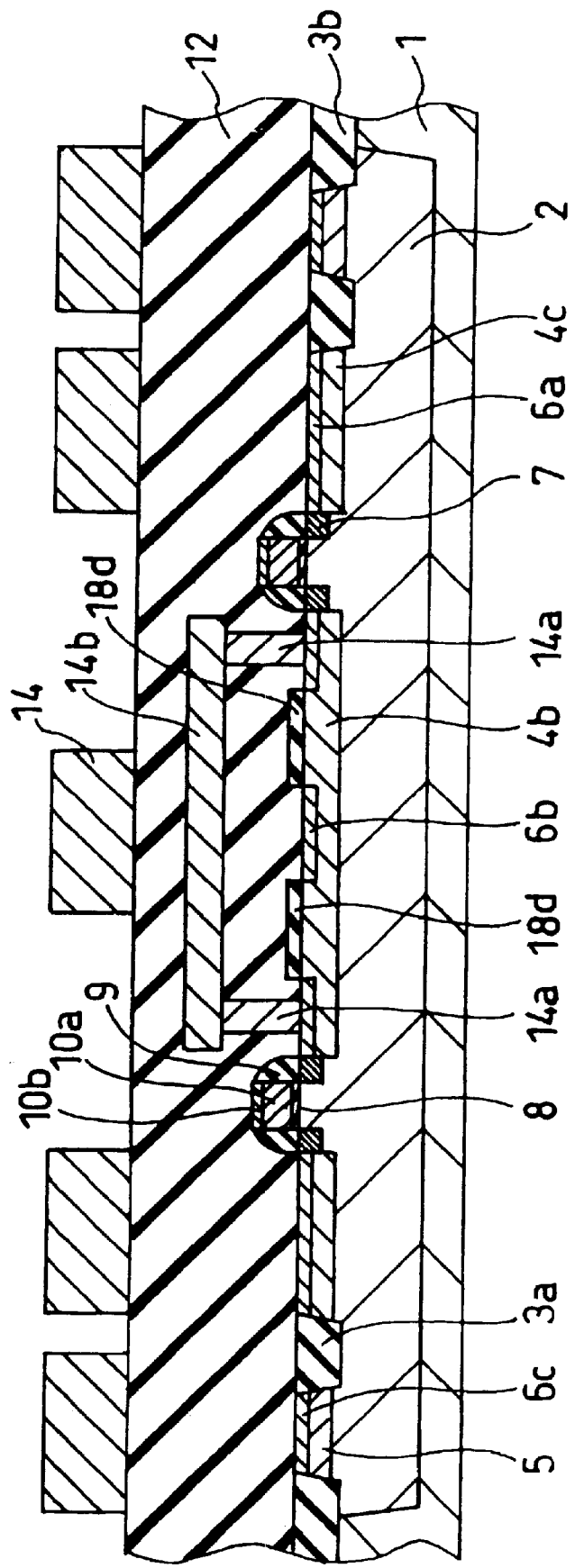
FIG. 32 is a cross sectional view along the O—O line in FIG. 31.

Next, the fourteenth embodiment of the present invention is described. In the fourteenth embodiment, the N$^+$ diffusion layer 4b is partitioned into three areas by the mask insulating film, and the respective drains of two N-channel transistors 11a and 11b are short circuited by the use of low resistance wiring. FIG. 31 is a plan view showing the structure of a semiconductor device according to the fourteenth embodiment, and FIG. 32 is a cross-sectional view along the O—O line. In the fourteenth embodiment shown in FIGS. 31 and 32, the same components as those of the first embodiment shown in FIGS. 1 and 2 are denoted by the same numerals and their explanations are omitted.

In the fourteenth embodiment, two mask insulating films 18d are formed on the N$^+$ diffusion layer 4b. These two mask insulating films 18d extend in the direction of the gate width and the N$^+$ diffusion layer 4b is partitioned into three regions by the mask insulating film 18d, similar to the conventional semiconductor device. In the present embodiment, however, there are provided two plug shaped wiring layers 14a respectively connected to the silicide films 6b corresponding to the drain diffusion layers of two N-channel MOS transistors 11a and 11b and a wiring layer 14b connected to each wiring layer 14a. Thus, the respective drains of these two N-channel MOS transistors are short circuited through the wiring layers 14a and 14b. These wiring layers 14a and 14b are made of Al or Cu wires.

In the thus constituted fourteenth embodiment, the region, in which no silicide film is formed, acts as the resistive element between the drain diffusion layer of the transistor and the drain wiring. Furthermore, even when one of two transistors enters snapback, the drain voltage of the other transistor becomes identical with that of the transistor in snapback. Thereby, the stress is relieved and the improved electrostatic resistance is obtained.

When manufacturing the fourteenth embodiment, the interlayer insulating film 12 is formed with a two layered structure. For example, after depositing the first interlayer, contact holes are formed at predetermined positions, the wiring layers 14a are embedded in these holes, and the wiring layer 14b is further formed. Subsequently, the semiconductor device according to the fourteenth embodiment can be obtained by depositing the second interlayer insulating film.

Figure 33:
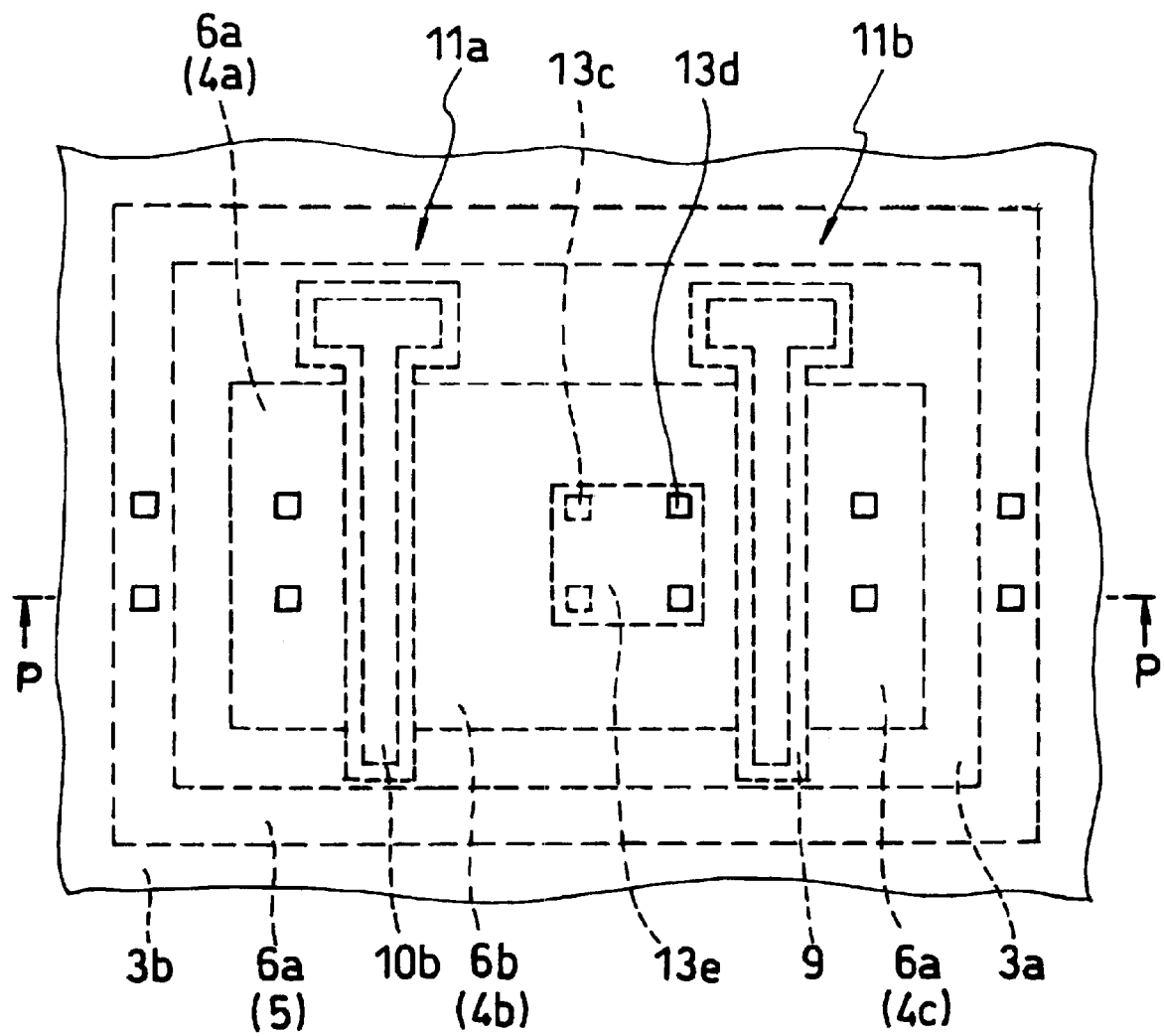
FIG. 33 is a plan view showing the structure of a semiconductor device according to the fifteenth embodiment of the present invention.
Figure 34:
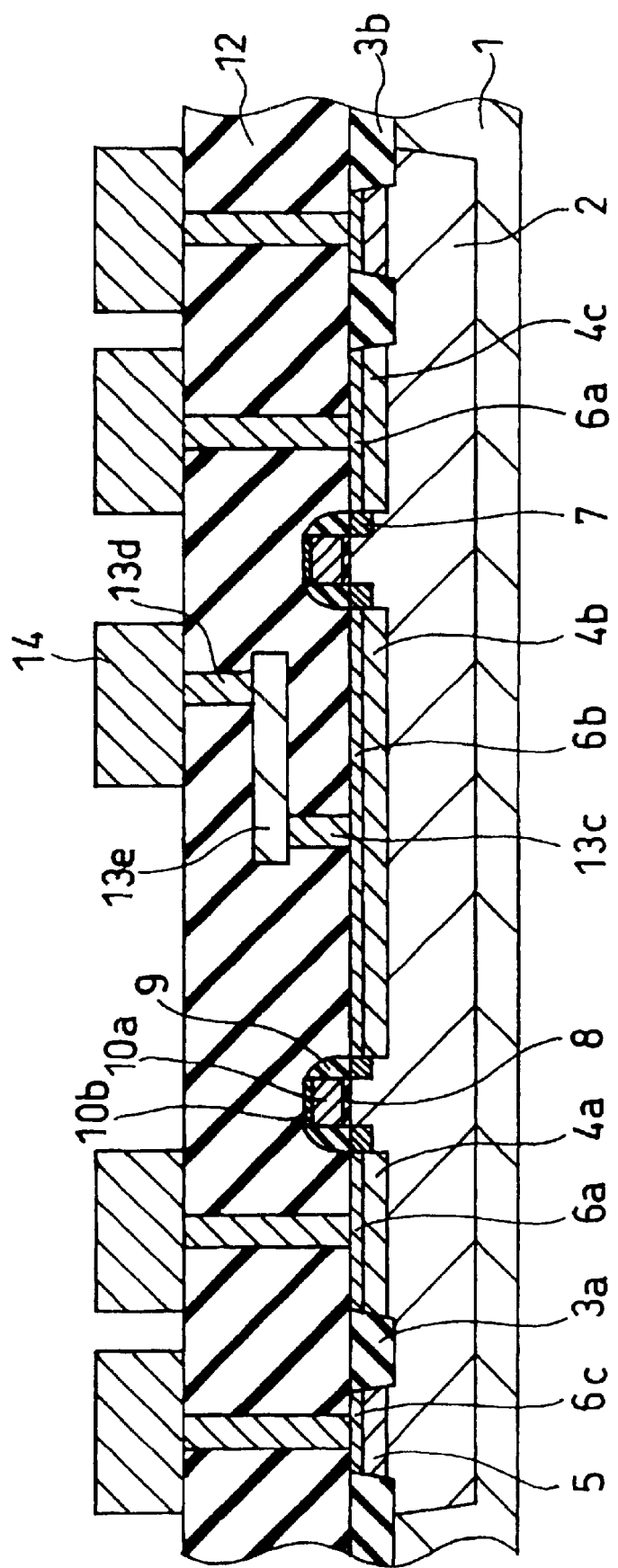
FIG. 34 is a cross-sectional view along the P—P line in FIG. 33.

Next, the fifteenth embodiment of the present invention is described. In the fifteenth embodiment, a resistive layer is formed between the drain diffusion layer and the drain wiring. FIG. 33 is a plan view showing the structure of a semiconductor device according to the fifteenth embodiment, and FIG. 34 is a cross-sectional view along the N—N line. In the fifteenth embodiment shown in FIGS. 33 and 34, the same components as those of the first embodiment shown in FIGS. 1 and 2 are denoted by the same numerals and their explanations are omitted.

In the fifteenth embodiment, a silicide layer 6b is formed on the entire surface of the $N^+$ diffusion layer 4b. Two contact plugs 13c ad 13d for the drain wiring are formed in the interlayer insulating film 12. The contact plug 13c is connected to the silicide film 6b and the contact plug 13c extends to the intermediate height of the interlayer insulating film 12. These contact plugs 13c and 13d are located at mutually different positions when seen in a plan view. In the cross-sectional view, a resistive layer 13e, connected to the contact plugs 13c and 13d, is provided at an intermediate height of the interlayer insulating film 12.

In the fifteenth embodiment thus constituted as shown above, the resistive layer acts as a resistive element between the drain diffusion layer of the transistor and the drain wiring. Furthermore, when one of two transistors enters snapback, the drain voltage of the other transistor becomes identical with that of the transistor in snapback. Thereby, the stress is relieved and an improved electrostatic resistance is obtained.

When manufacturing the semiconductor device according to the fifteenth embodiment, the interlayer insulating film 12 is formed with a two layered structure. For example, after depositing the first interlayer, contact holes are formed at predetermined positions, the wiring layers 14a are embedded in these holes, and the wiring layer 14b is further formed. Subsequently, the semiconductor device according to the fifteenth embodiment can be obtained by depositing the second interlayer insulating film.

Figure 35:
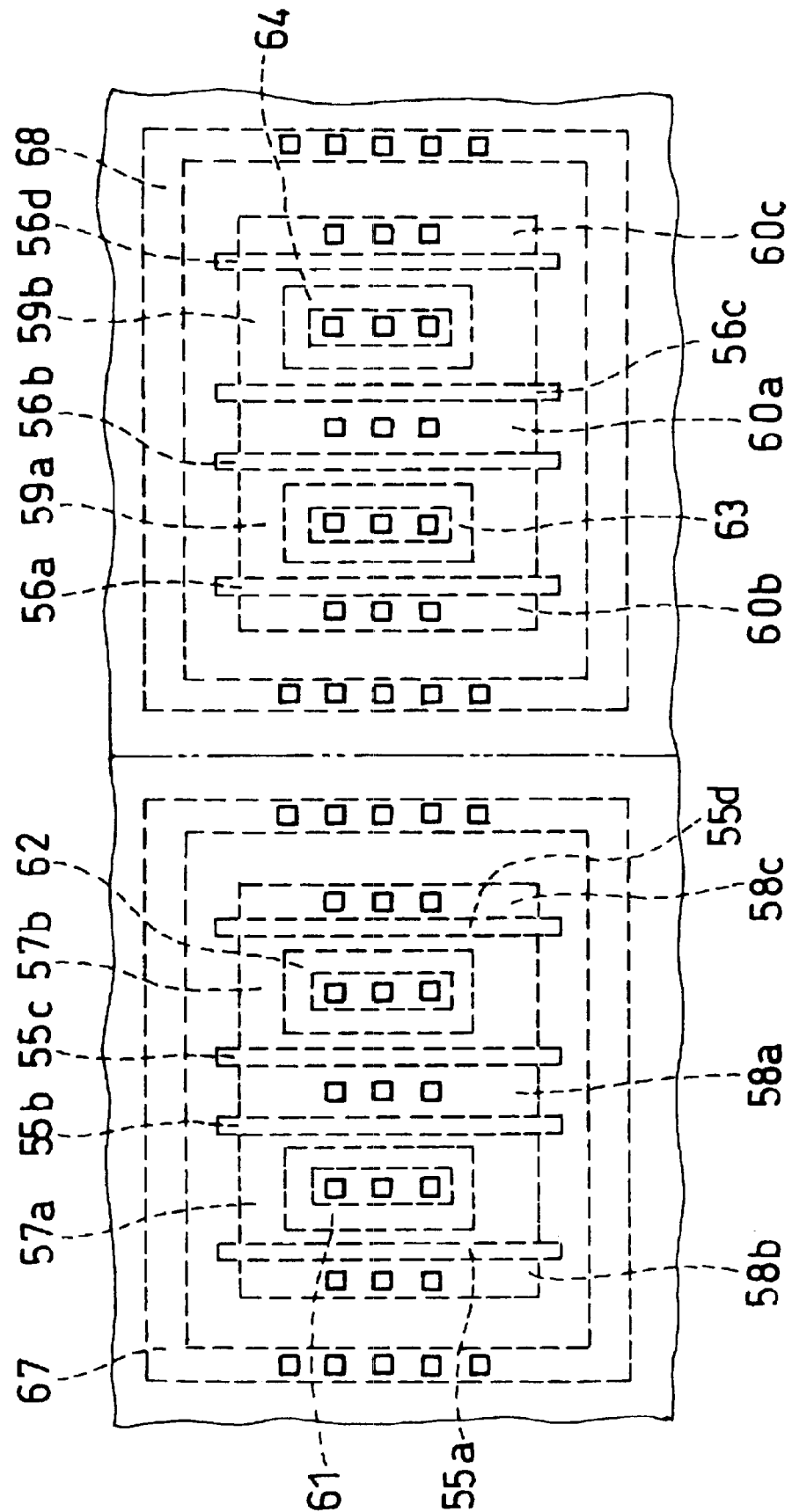
FIG. 35 is a plan view showing the structure of a semiconductor device according to the sixteenth embodiment of the present invention.
Figure 36:
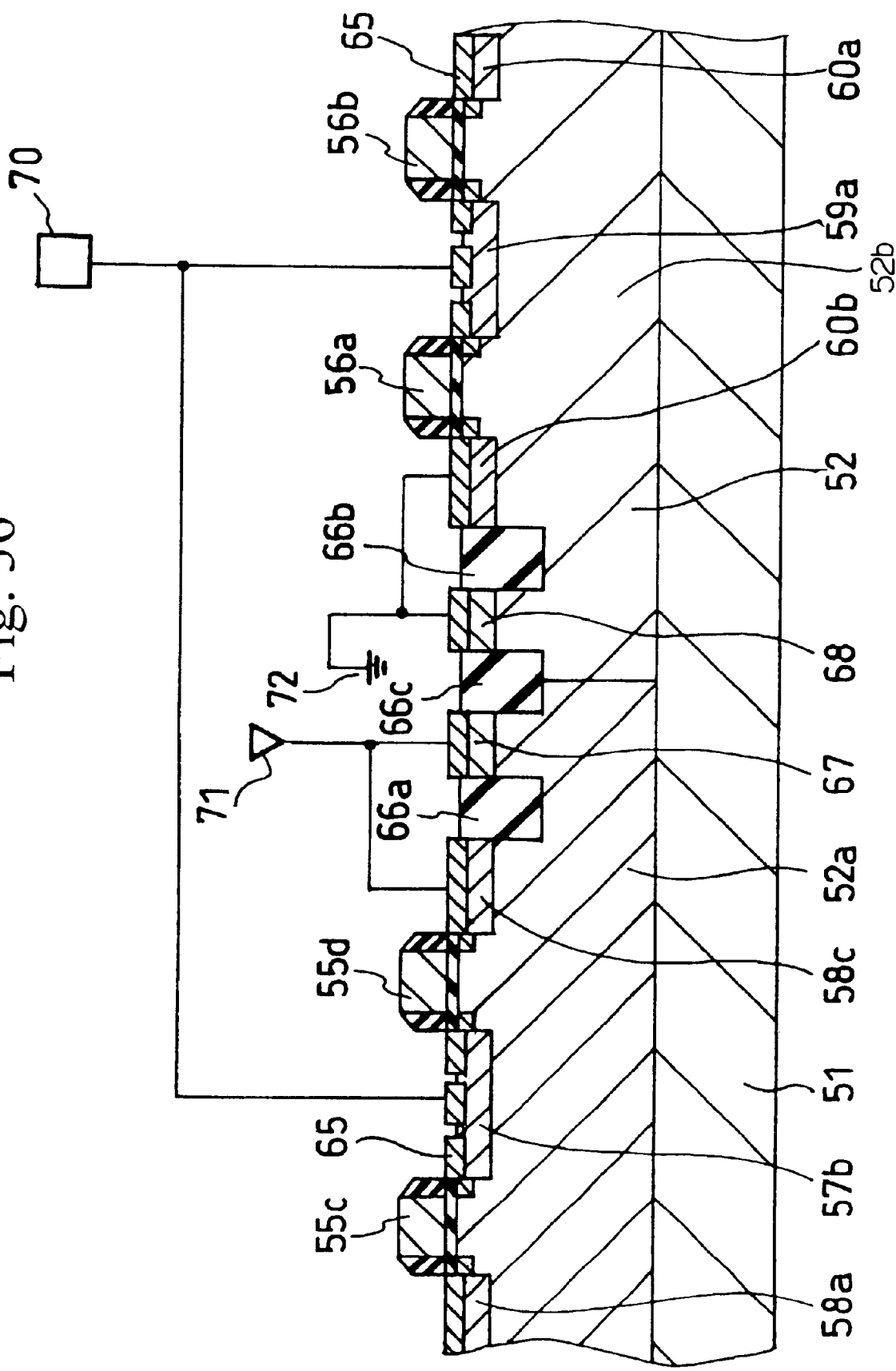
FIG. 36 is a cross-sectional view along the Q—Q line in FIG. 35.

Next, the sixteenth embodiment of the present invention is described. This sixteenth embodiment is an example adopted to a complementary MOS (CMOS) transistor. FIG. 35 is a schematic plan view showing the structure of a semiconductor device according to the sixteenth embodiment, and FIG. 36 is a schematic cross-sectional view along the Q—Q line.

In the sixteenth embodiment, an N well 52a and P well 52b are formed on the P-type semiconductor substrate 51. In the N well 52a, four P-channel MOS transistors 53a to 53d are formed, and in the P well 52b, four N-channel MOS transistors 54a to 54d are formed (In FIG. 36, two of each of the MOS transistors are shown).

The gate electrodes 55a to 55d of the four P-channel MOS transistors 53a to 53d extend in parallel to each other, and the gate electrodes 56a to 56d of the four N-channel MOS transistors extend in parallel to each other A P-type drain diffusion layer 57a is formed in the N well 52a located between the gate electrodes 55a and 55b, and a P-type drain diffusion layer 57b is formed in the N well 52a located between the gate electrodes 55c and 55d. A P-type source diffusion layer 58a is formed in the N well 52a located between the gate electrodes 55b and 55c. In addition, a P-type source diffusion layer 58a is formed in the N well 52a outside of the gate electrode 55a, and a P-type source diffusion layer 58c is formed in an N well 52a outside of the gate electrode 55d.

An N-type drain diffusion layer 59a is formed in the P well 52b located between the gate electrodes 56a and 56b, and an N-type drain diffusion layer 59b is formed in the P well 52b located between the gate electrodes 56c and 56d. An N-type source diffusion layer 60a is formed in the P well 52b located between the gate electrodes 56b and 56c. In addition, a P-type source diffusion layer 60a is formed in the P well 52b outside of the gate electrode 56a, and a P-type source diffusion layer 60c is formed in a P well 52b outside of the gate electrode 56d.

The ring-shaped mask insulating films 61 to 64 are formed on the P-type drain diffusion layers 57a and 57b and on the N-type drain diffusion layers 59a and 59b, respectively. In addition, silicide layers 65 are formed so as to cover the diffusion layers except the regions covered by the mask insulating films 61 to 64.

Furthermore, an element-separating insulating film 66a surrounding each diffusion layer is formed in the N well 52a and an element-separating insulating film 66b surrounding each diffusion layer is formed in the P well 52b. An N-type diffusion layer 67 is formed around the periphery of the element-separating insulating film 66a, and a P-type diffusion layer 68 is formed around the periphery of the element-separating insulating film 66b. Both surfaces of the N-type diffusion layer 67 and the P-type diffusion layer 68 are covered by the silicide film 65. The element-separating insulating film 66c is formed around each periphery of each of the N-type and P-type diffusion layers 67 and 68.

Moreover, the contact plug 69 is connected to each partitioned silicide film 65. The contact plugs 69 connected to the silicide films 65 of each mask insulating film 61 to 64 are connected to the input/output pad 70. The contact plugs 69 connected to each P-type source diffusion layer 58a to 58c and the contact plug 69 connected to the N-type diffusion layer 67 are connected to the power source terminal 71. Similarly, the contact plugs 69 connected to the n-type source diffusion layer 60a to 60c and the contact plug 69 connected to the P-type diffusion layer 68 are connected to the ground terminal 72.

Figure 37A:
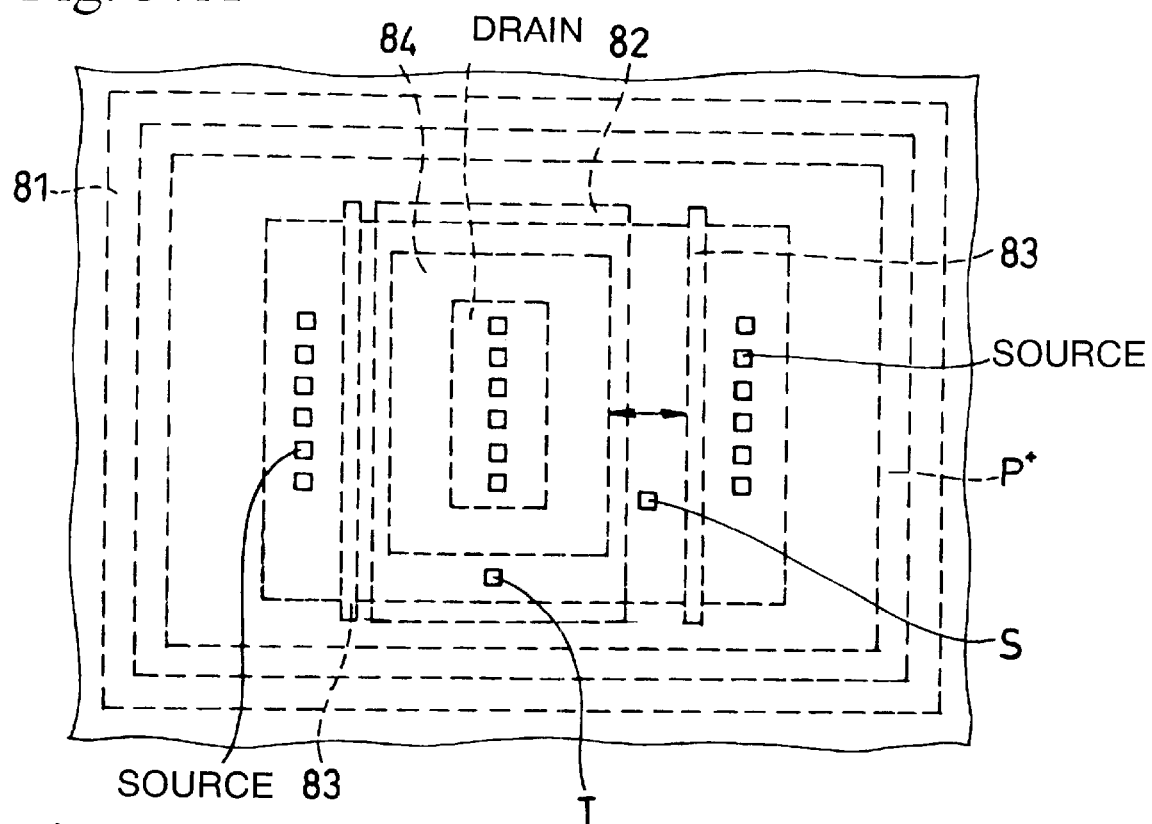
FIG. 37A is a plan view showing the connection point of the input buffer in the embodiments of the present invention.
Figure 37B:
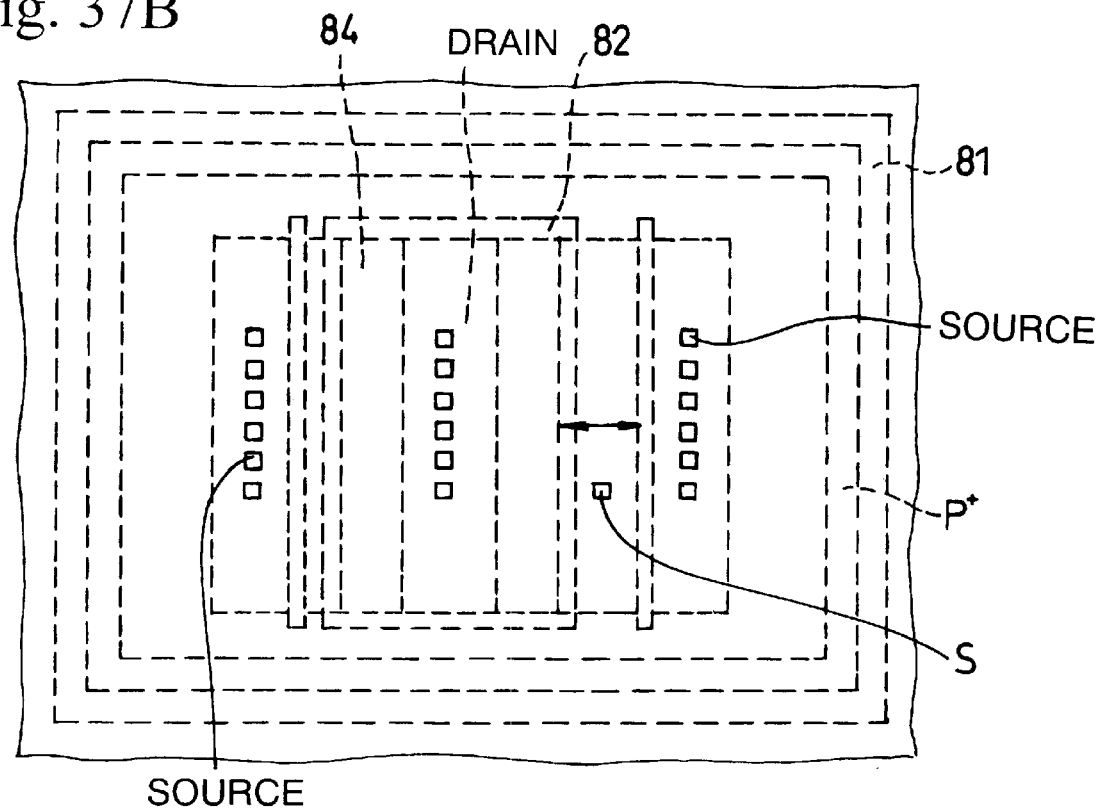
FIG. 37B is a plan view showing the connection point of the input buffer in the conventional examples.

Hereinafter, an explanation is provided concerning the preferable connecting position of an input buffer, when the present invention is applied to the input circuit. FIG. 37A is a plan view showing the connecting position of the input buffer according to an embodiment of the present invention, and 37B is a plan view showing the connecting position of the input buffer in the conventional example.

Figure 38A:
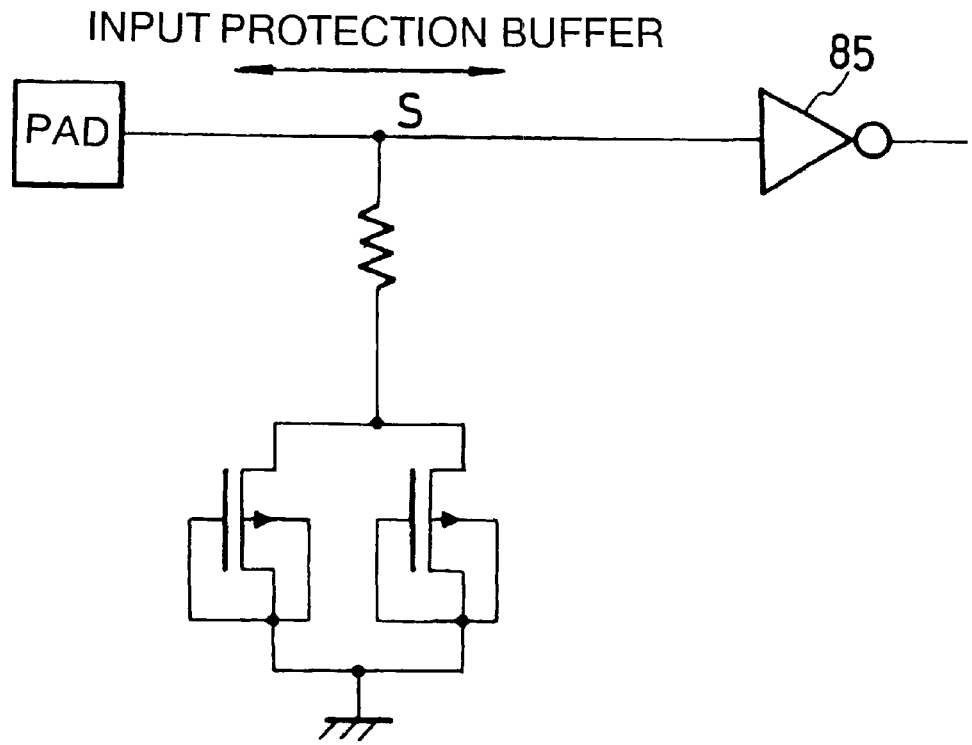
FIG. 38A is a circuit diagram showing an example in which the input buffer is connected at the position S.
Figure 39:
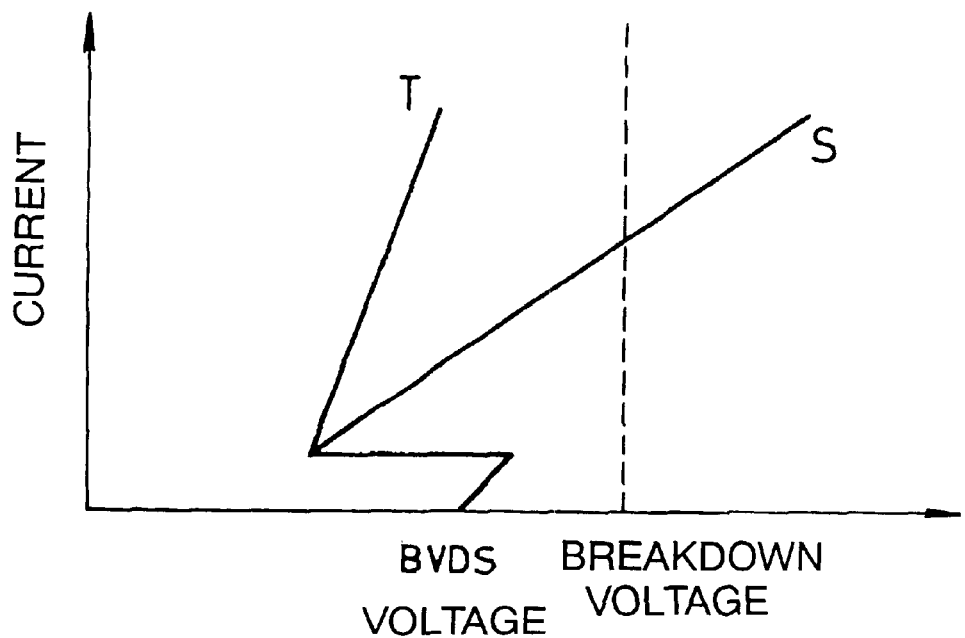
FIG. 39 is a graph showing the relationship between the currents and the voltage when the location of the input buffer is changed.

As shown in FIG. 37A, for the seventh embodiment, where the N well 82 is formed in the P well 81, two candidate connecting positions of the input buffer can be selected, one is the position S located outside of the N well 82, and the other is the position T located inside of the N well 82. FIG. 38A is a circuit diagram showing an example in which the input buffer is connected at the position S, and 38B is a circuit diagram showing an example in which the input buffer is connected at the position T. FIG. 39 is a graph showing the relationship between the current and voltage according to the connecting positions of the input buffer.

Figure 38B:
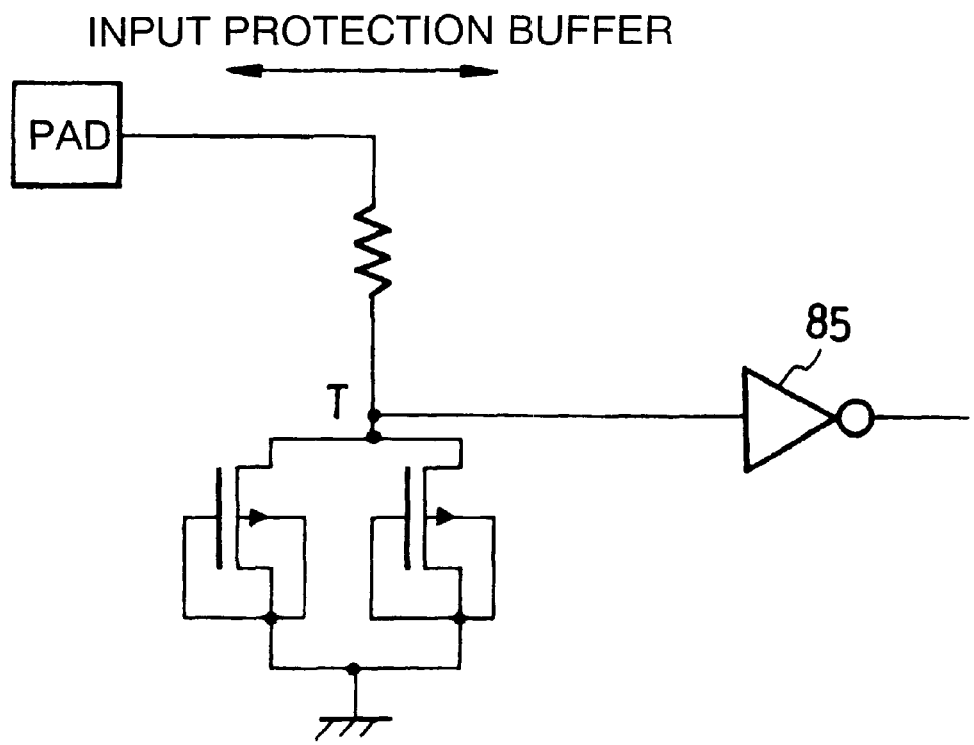
FIG. 38B is a circuit diagram showing an example in which the input buffer is connected at the position T.

When the input buffer is connected at the position T, it is not necessary to provide an exclusive space for the contact between the gate electrode and the mask insulating film 84. However, when the input buffer is connected at the position S, it is necessary to provide a space for the contact. Accordingly, in order to reduce the area for the buffer, it is preferable to connect the buffer at the position T. Furthermore, as shown in FIGS. 38A and 38B, and FIG. 39, when the input buffer is connected at the position S, the gate insulating layer of the input buffer 85 is likely to be broken down by the concentration of the electric field because the voltage rapidly increases after entering snapback. In contrast, when the input buffer is connected at the position T, since the voltage increases gradually, the gate insulating film of the input buffer 85 is prevented from breakdown. Consequently, the position T located inside of the N well 82 is preferable as the connecting position of the input buffer.

Figure 40:
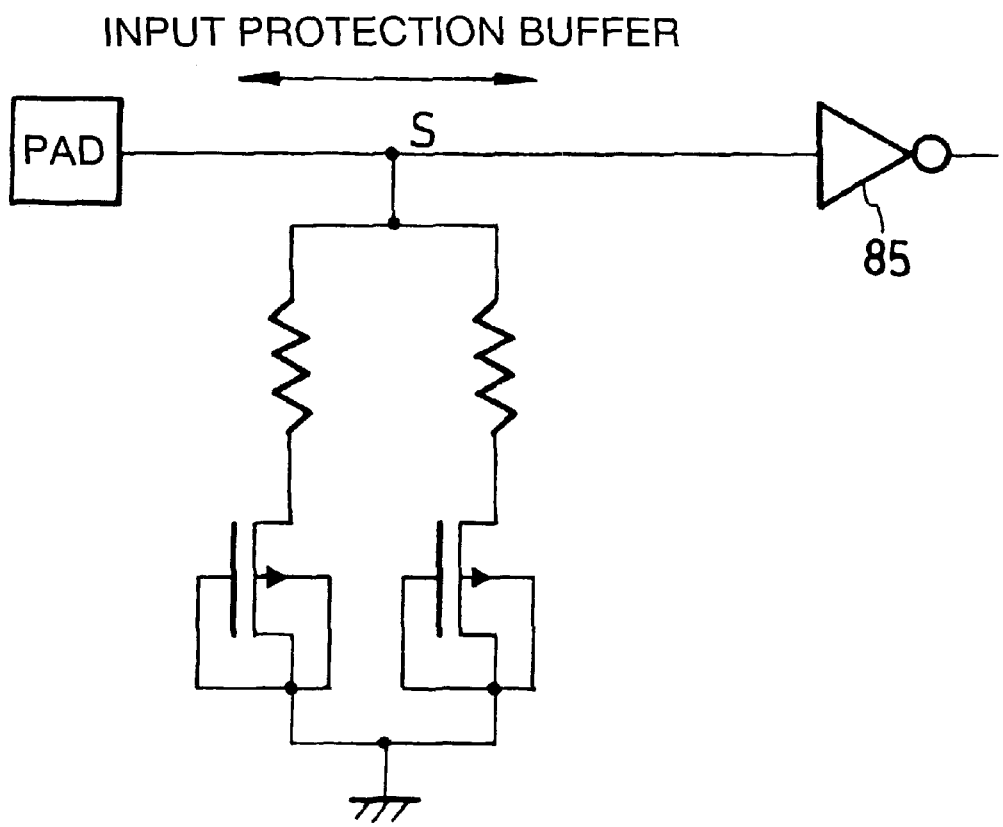
FIG. 40 is a circuit diagram showing the connecting position of the input buffer in the conventional example.

It is noted that the input buffer must be connected between the gate electrode 83 and the mask insulating film 84 in the conventional example because of its constitution. In this case, the circuit is constituted as show in FIG. 40. In this case, the gate insulating film of the input buffer 85 is likely to be destroyed.

Figure 41A:
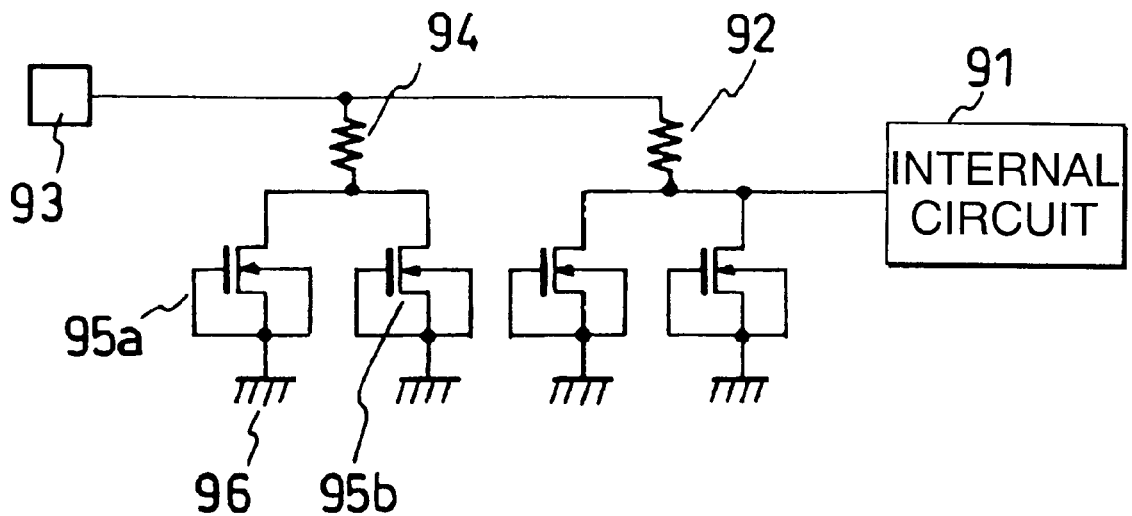
FIG. 41A is a block diagram showing the input circuit to which the present invention is applied.
Figure 41B:
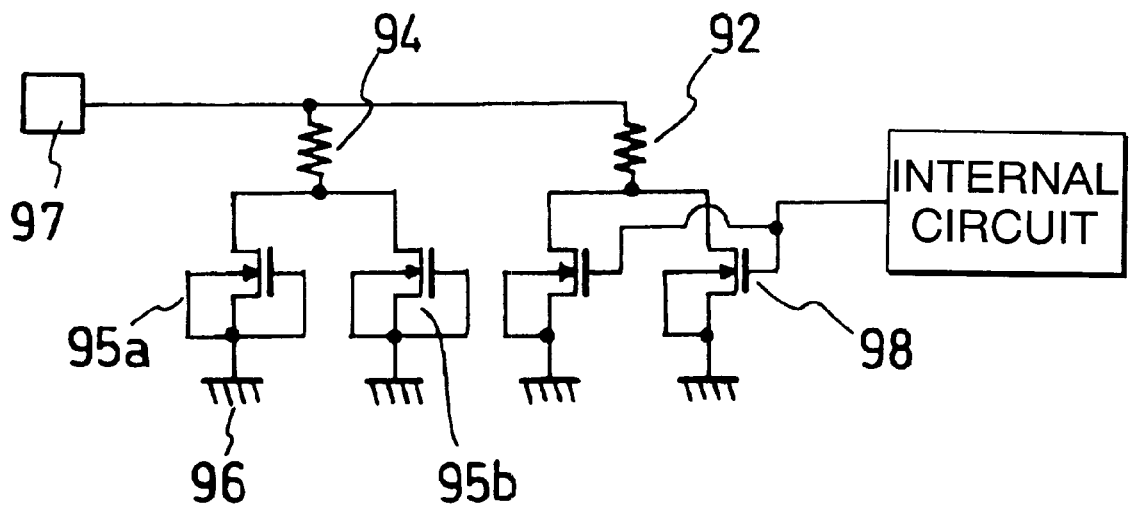
FIG. 41B is a block diagram showing the output circuit to which the present invention is applied.
Figure 42:
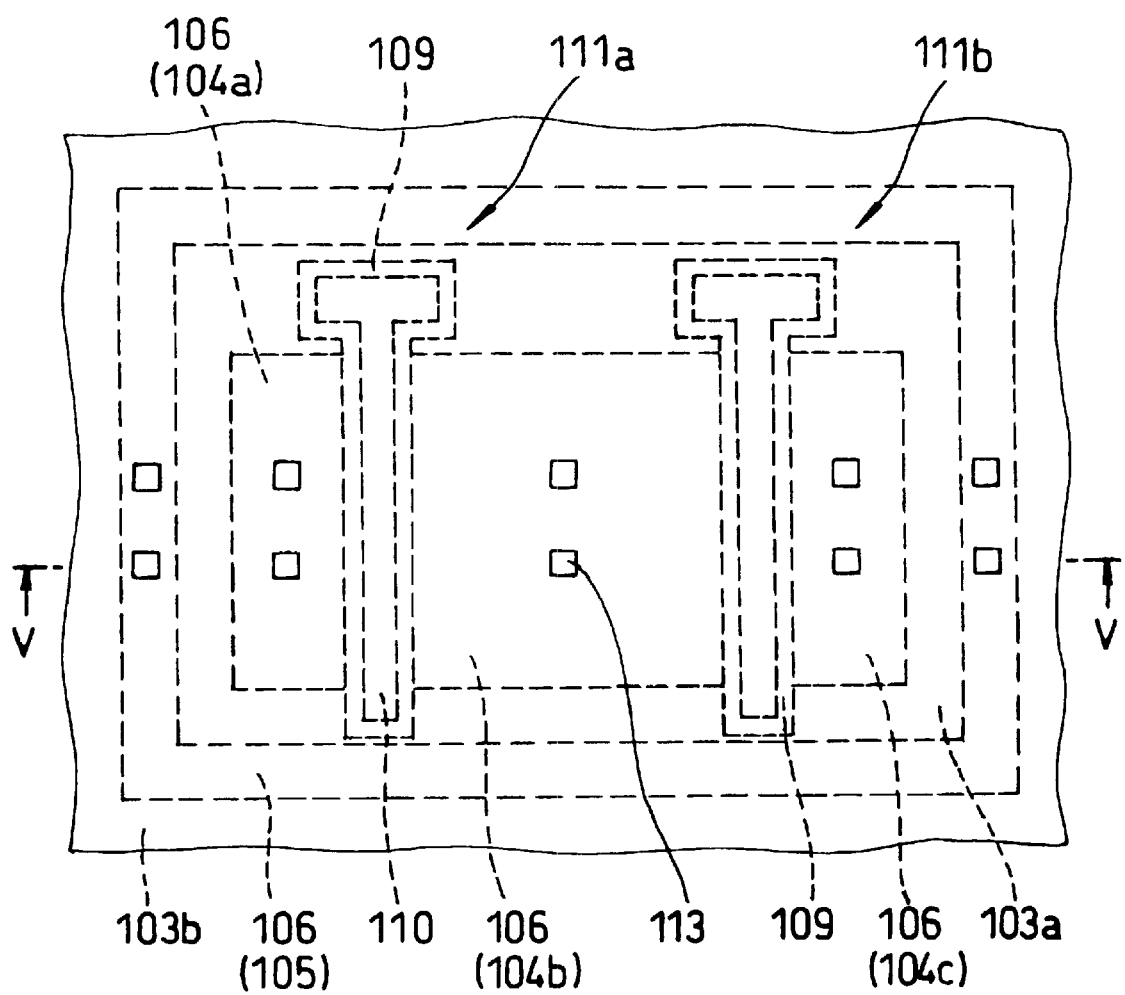
FIG. 42 is a plan view showing a structure of a conventional semiconductor device.
Figure 43:
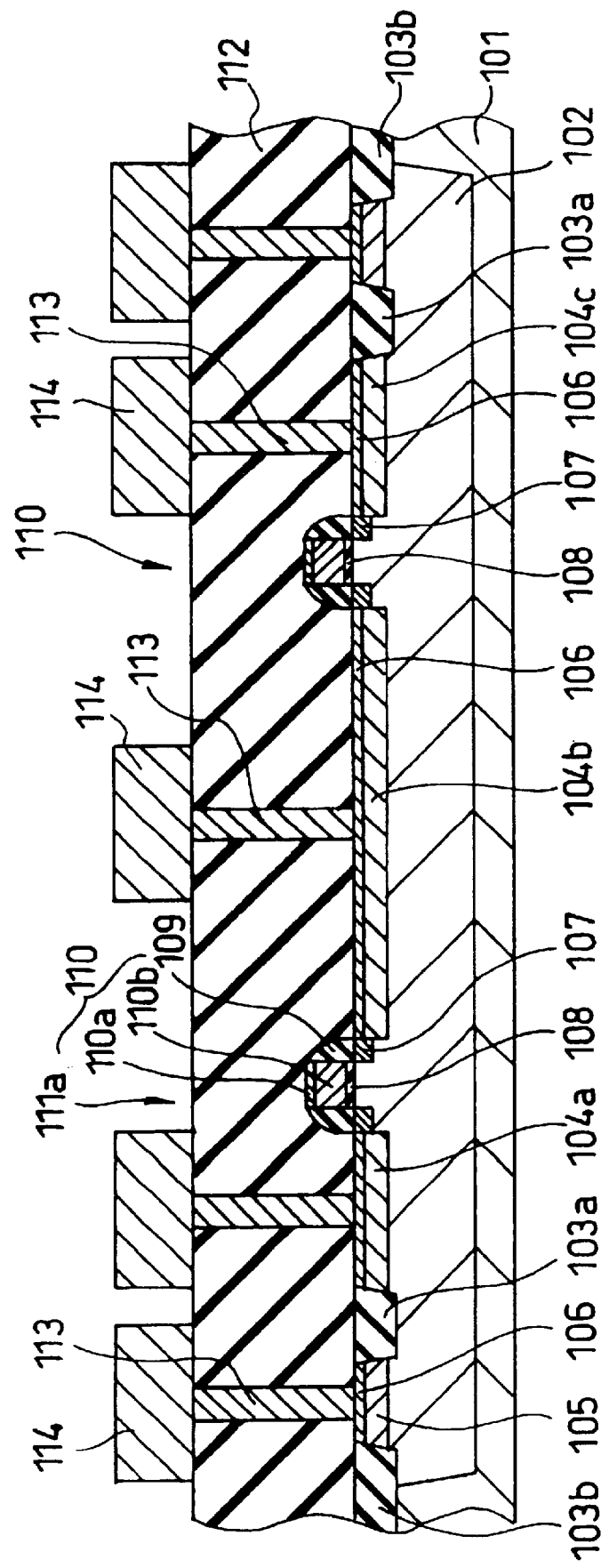
FIG. 43 is a cross-sectional view along the V—V line in FIG. 42.
Figure 44:
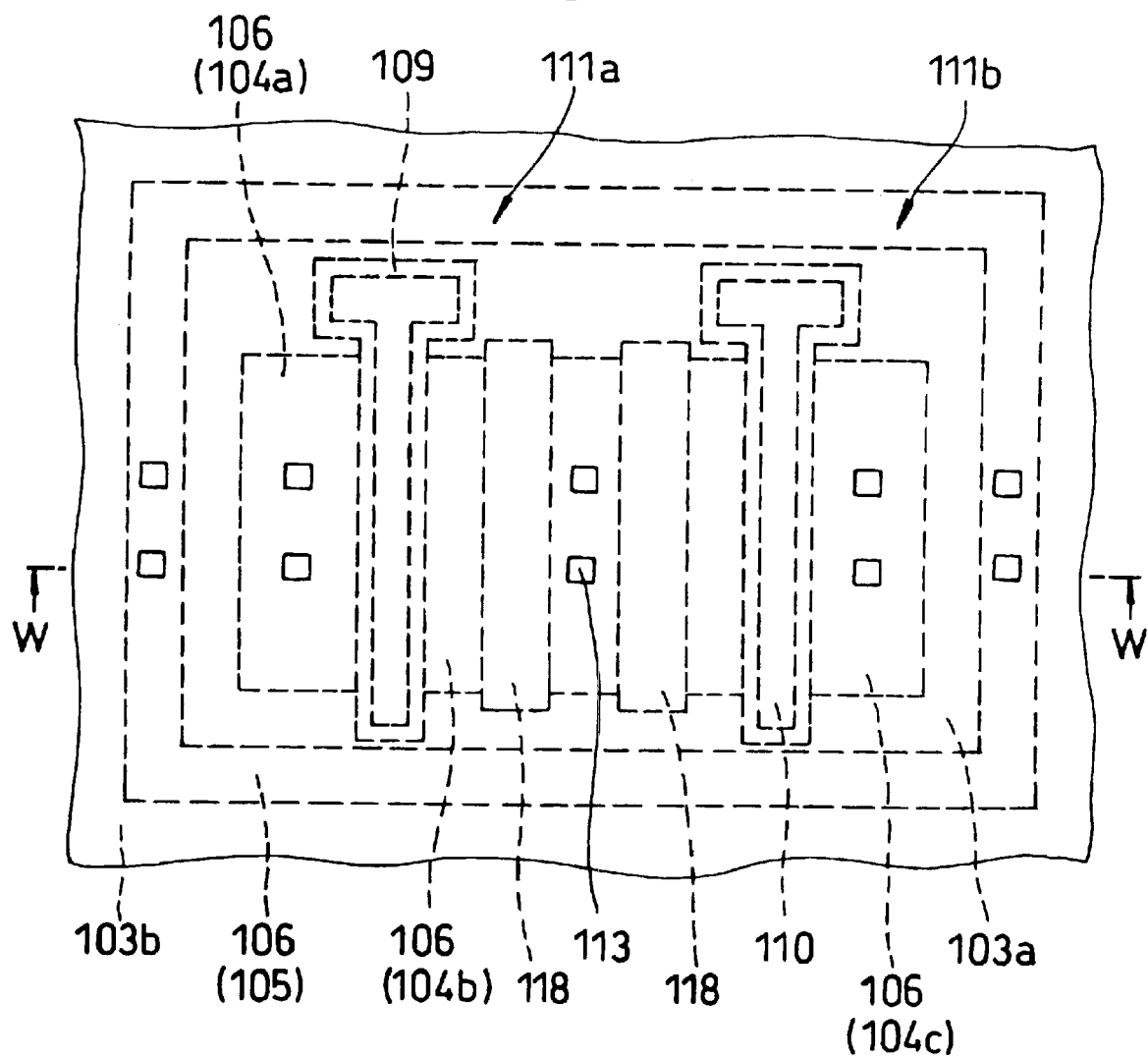
FIG. 44 is a plan view showing the structure of the second conventional example.
Figure 45:
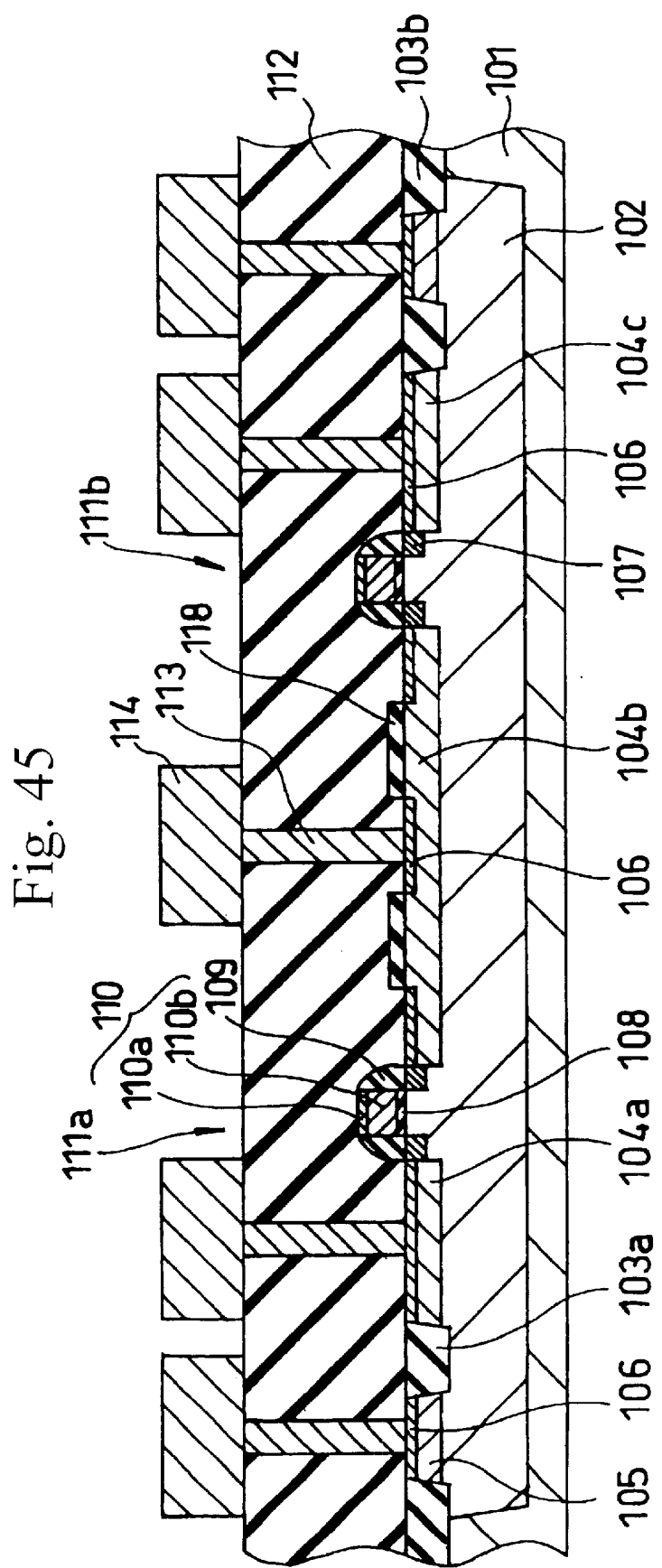
FIG. 45 is a cross-sectional view along the W—W line in FIG. 44.
Figure 46A:
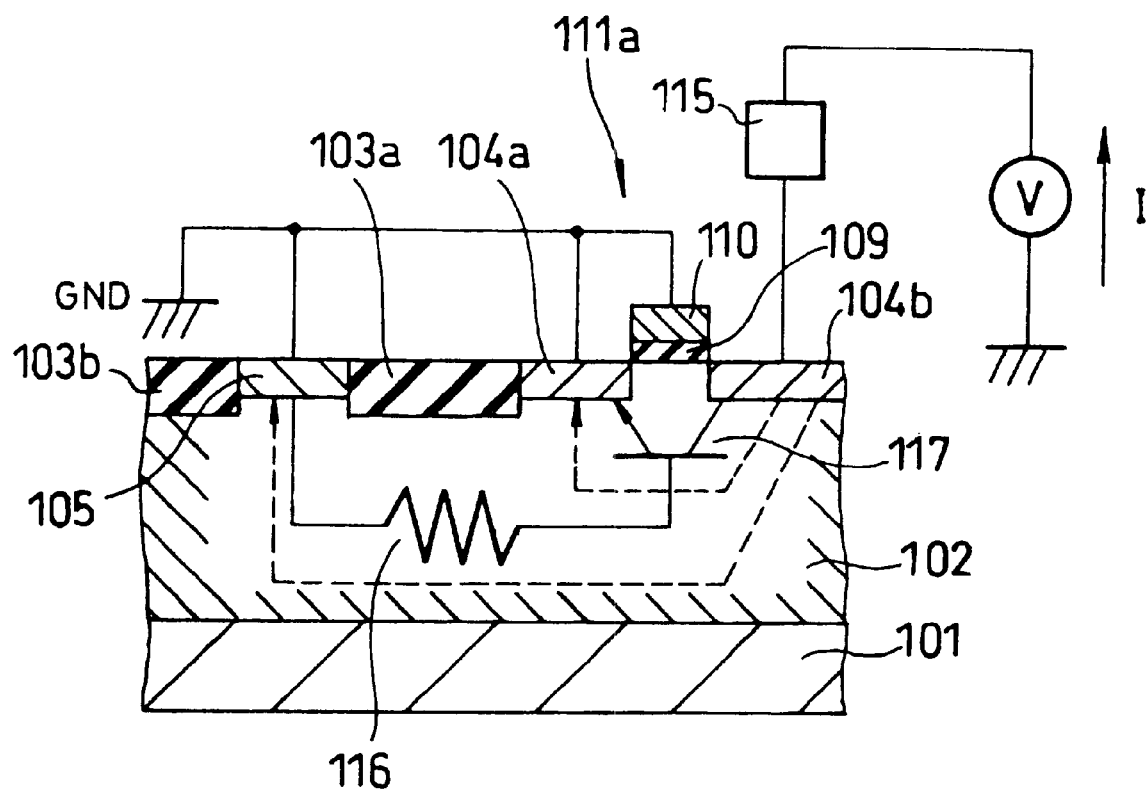
FIG. 46A is a cross-sectional view showing the propagation path of the surge current in the first conventional example.
Figure 46B:
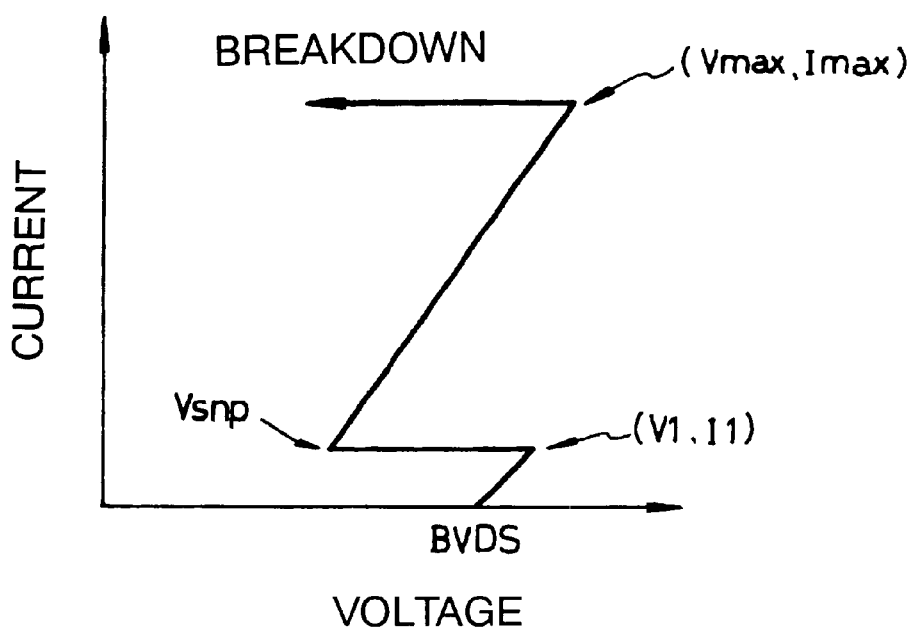
FIG. 46B is its equivalent circuit.

Furthermore, the present invention can be applied not only to the input circuit but also to the output circuit and the input/output circuit. FIG. 41A is a block diagram showing an input circuit to which the present invention is applied, 41B is a block diagram of an output circuit to which the present invention is applied.

When the present invention is applied to an input circuit, the circuit of the present invention is connected between the resistive element 92 connected to the internal circuit 91 and an input pad 93. That is, a resistive element 94 is connected in parallel with the resistive element 92, and to the resistive element 94, and the drains of two N-channel MOS transistor 95a and 95b are directly connected. The gates and sources of these two N-channel MOS transistors are connected to the ground terminal 96.

When the present invention is applied to the output circuit, the circuit of the present invention is connected between the resistive element 92, connected to the internal circuit 91 through the n-channel MOS transistor 98, and the output pad 97.

It is noted, however, that the conductive type of the respective wells and respective diffusion layers and the like are not limited to the embodiments shown above, and transistors and the like with the opposite conductive type may be used.

As described above in detail, the present invention has the effect described below. Since the drain diffusion layers of first and second two field effect transistors are connected through the silicide film, and since the drain voltage of the second transistor changes following the drain voltage of the first transistor even when the first transistor enters snapback before the second transistor, the stress applied to the first transistor can be relieved and thus an improved electrostatic resistance can be obtained. Such an effect can be also obtained if the circuit is provided with one resistive element between the external terminal and the drain diffusion layer for two field effect transistors whose drain diffusion layers are commonly connected to the external terminal, even when no silicide layer is formed for the drain diffusion layer.

What is claimed is:

1. A semiconductor device comprising:
a resistive element, one end of which is connected to an external terminal; and
a first and second field effect transistors, connected to the other end of said resistive element;
wherein, said first and second field effect transistors comprise first and second drain diffusion layers and first and second source diffusion layers, respectively; and
said first and second drain diffusion layers are commonly connected directly to said resistive element, and said first and second drain diffusion layers are maintained at an identical voltage, and one of said first and second field effect transistors shares a source diffusion layer with a third field effect transistor connected to another resistive element.

2. A semiconductor device according to claim 1, wherein said first and second field effect transistors respectively comprise first and second silicide films formed on said respective first and second drain diffusion layers.

3. A semiconductor device according to claim 1, wherein said resistive element is provided between said first and second field effect transistors in the shape of a ring, and said external terminal is connected to a first diffusion layer which is located inside of said resistive layer and which has the same conductive type as that of said first and second drain diffusion layers.

4. A semiconductor device according to claim 1, wherein said resistive element is formed by a diffusion layer, whose conductive type is the same as that of said first and second drain diffusion layer and which comprises a second diffusion layer without having a silicide layer.

5. A semiconductor device according to claim 4, wherein said resistive element comprises side wall insulating films of said first and second field effect transistors as well as an insulating film formed on said second diffusion layer.

6. A semiconductor device according to claim 1, wherein said resistive element comprises a second diffusion layer whose conductive type is the same as that of said first and second drain diffusion layer, a dummy gate insulating film formed on the second diffusion layer between said external terminal and said first and second drain diffusion layers, and a dummy electrode, to which a fixed voltage or a voltage of an external terminal is supplied, and which is formed on said dummy gate insulating film.

7. A semiconductor device according to claim 1, wherein said resistive element comprises a second diffusion layer whose conductive type is the same as that of said first and second drain diffusion layers, a dummy gate insulating film formed on said second diffusion layer between said external terminal and said first and second diffusion layers, and a dummy electrode in a floating state, which is formed on said dummy gate insulating film.

8. A semiconductor device according to claim 1, wherein said resistive element comprises a second diffusion layer whose conductive type is the same as that of said first and second drain diffusion layers, an element-separating insulating film formed on said second diffusion layer between said external terminal and said first and second drain diffusion layers.

9. A semiconductor device according to claim 1, wherein said resistive element comprises a resistive layer formed on an upper layer of said first and second drain diffusion layers.

10. A semiconductor device comprising:
first and second resistive elements, one end of each of which is connected to an external terminal; and
first and second field effect transistors, each connected to the other ends of said first and second resistive elements;
wherein, each of said first and second field effect transistors comprises first and second drain diffusion layers and first and second source diffusion layers, respectively, and said first and second drain diffusion layers are connected directly to said first and second resistive elements, respectively, and said first and second drain diffusion layers are mutually short circuited.

11. A semiconductor device according to claim 10, wherein one, two, or more than two contact holes are formed between said external terminal and the silicide film on said first drain diffusion layer.

12. A semiconductor device according to claim 11, wherein the silicide film on said first diffusion layer is partitioned for each contact hole.

13. A semiconductor device according to claim 11, wherein said resistive element is provided for each contact hole.

14. A semiconductor device according to claim 1, wherein said resistive element and said first and second field effect transistors are provided in one type of circuit portion selected from the group consisting of an input circuit portion, an output circuit portion, and an input/output circuit portion.

15. A semiconductor device according to any one of claims 3 and 10, wherein said first and second field effect transistors are provided in a first conductive type well and the semiconductor device comprises a second conductive type well, whose side surfaces are surrounded by said first conductive type well and which extends below said resistive element.

16. A semiconductor device according to any one of claims 3 and 10, wherein said first and second field effect transistors are provided in a first conductive type well and the semiconductor device comprises a second conductive type well, whose side surfaces are surrounded by the first conductive type well and which extends below the first and second drain diffusion layer.

17. A semiconductor device according to claim 10, wherein said first and second field effect transistors are one type of transistor selected from the group consisting of an N-channel transistor, a P-channel MOS transistor, and a complementary MOS transistor.

18. A semiconductor device according to claim 14, wherein the semiconductor device comprises an extracting portion provided on at least one of a first and a second silicide film formed on said respective first and second drain diffusion layer for extracting the input signal into the internal circuit.

19. A semiconductor device according to claim 18, wherein said extracting portion is provided at a side of said resistive element for a line formed by two transistors.

20. A semiconductor device according to claim 18, wherein, said first and second field effect transistors are provided in a first conductive type well and the semiconductor device comprises a second conductive type well, whose side surfaces are surrounded by the first conductive type well, and when viewed in a plan view, said extracting portion is provided in a region where said second conductive type well is formed.

* * * * *